(12) United States Patent
Chang et al.

(10) Patent No.: US 11,955,535 B2
(45) Date of Patent: Apr. 9, 2024

(54) METHODS FOR FORMING AIR SPACERS IN SEMICONDUCTOR DEVICES

(71) Applicant: Taiwan Semiconductor Manufacturing Co., Ltd., Hsinchu (TW)

(72) Inventors: Chia-Hao Chang, Hsinchu (TW); Lin-Yu Huang, Hsinchu (TW); Sheng-Tsung Wang, Hsinchu (TW); Cheng-Chi Chuang, New Taipei (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 34 days.

(21) Appl. No.: 17/873,771

(22) Filed: Jul. 26, 2022

(65) Prior Publication Data
US 2022/0367669 A1 Nov. 17, 2022

Related U.S. Application Data

(62) Division of application No. 16/935,061, filed on Jul. 21, 2020, now Pat. No. 11,817,491.

(51) Int. Cl.
*H01L 29/66* (2006.01)
*H01L 21/768* (2006.01)
(Continued)

(52) U.S. Cl.
CPC ...... *H01L 29/6656* (2013.01); *H01L 21/7682* (2013.01); *H01L 21/76897* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,520,362 B2 12/2016 Lin et al.
9,613,856 B1 4/2017 Yang et al.
(Continued)

*Primary Examiner* — Younes Boulghassoul
(74) *Attorney, Agent, or Firm* — HAYNES AND BOONE, LLP

(57) ABSTRACT

Semiconductor devices and methods of forming the same are provided. A semiconductor device according to one embodiment includes an active region including a channel region and a source/drain region adjacent the channel region, a gate structure over the channel region of the active region, a source/drain contact over the source/drain region, a dielectric feature over the gate structure and including a lower portion adjacent the gate structure and an upper portion away from the gate structure, and an air gap disposed between the gate structure and the source/drain contact. A first width of the upper portion of the dielectric feature along a first direction is greater than a second width of the lower portion of the dielectric feature along the first direction. The air gap is disposed below the upper portion of the dielectric feature.

20 Claims, 61 Drawing Sheets

(51) Int. Cl.
  *H01L 21/8234* (2006.01)
  *H01L 29/06* (2006.01)
  *H01L 29/417* (2006.01)
  *H01L 29/49* (2006.01)
  *H01L 29/78* (2006.01)

(52) U.S. Cl.
  CPC .. *H01L 21/823468* (2013.01); *H01L 29/0649* (2013.01); *H01L 29/41775* (2013.01); *H01L 29/41791* (2013.01); *H01L 29/4991* (2013.01); *H01L 29/6653* (2013.01); *H01L 29/66545* (2013.01); *H01L 29/66795* (2013.01); *H01L 29/785* (2013.01); *H01L 29/0653* (2013.01)

(58) Field of Classification Search
  CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/4991; H01L 21/764; H01L 21/7682; H01L 2221/1042–1047; H01L 29/0649–0653; H01L 29/515; H01L 21/823468; H01L 21/823864; H01L 29/6656; H01L 29/6653; H01L 21/28247; H01L 21/76829; H01L 21/76832; H01L 21/76834; H01L 21/02362; H01L 29/511–513; H01L 29/518; H01L 29/42356–42364; H01L 29/66545
  See application file for complete search history.

(56) References Cited

U.S. PATENT DOCUMENTS

| | | | |
|---|---|---|---|
| 9,716,032 | B2 | 7/2017 | Tang et al. |
| 9,972,529 | B2 | 5/2018 | Yang et al. |
| 10,163,691 | B2 | 12/2018 | Shih et al. |
| 10,170,322 | B1 | 1/2019 | Cheng et al. |
| 2016/0056262 | A1* | 2/2016 | Ho ................... H01L 21/47635 257/288 |
| 2019/0334008 | A1* | 10/2019 | Chen ................... H01L 29/6653 |
| 2020/0035804 | A1* | 1/2020 | Chen ................... H01L 29/6653 |
| 2020/0044074 | A1* | 2/2020 | Liang ............. H01L 21/823431 |
| 2020/0091345 | A1* | 3/2020 | Chiu ................... H01L 29/7851 |
| 2020/0105577 | A1* | 4/2020 | Liang ................ H01L 21/76843 |
| 2020/0126843 | A1* | 4/2020 | Tsai ................... H01L 29/4991 |
| 2020/0219989 | A1* | 7/2020 | Cheng ................ H01L 29/6656 |
| 2020/0335594 | A1* | 10/2020 | Zang ................... H01L 27/088 |
| 2021/0098591 | A1* | 4/2021 | Frougier ........... H01L 21/30621 |

\* cited by examiner

METHODS FOR FORMING AIR SPACERS IN SEMICONDUCTOR DEVICES

PRIORITY

This is a divisional application of and claims priority to U.S. application Ser. No. 16/935,061, filed Jul. 21, 2020, which is herein incorporated by reference in its entirety.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, these advances have also increased the complexity of processing and manufacturing semiconductor devices.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures.

As the dielectric layers between a gate structure and a source/drain contact of a multi-gate device become thinner, parasitic capacitance between the gate structure and the source/drain contact may impact device performance. Various measures have been proposed to reduce such parasitic capacitance. Some of these measures may compromise dielectric structures around the gate structure, resulting in reduced process windows. Therefore, although conventional multi-gate devices and methods are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
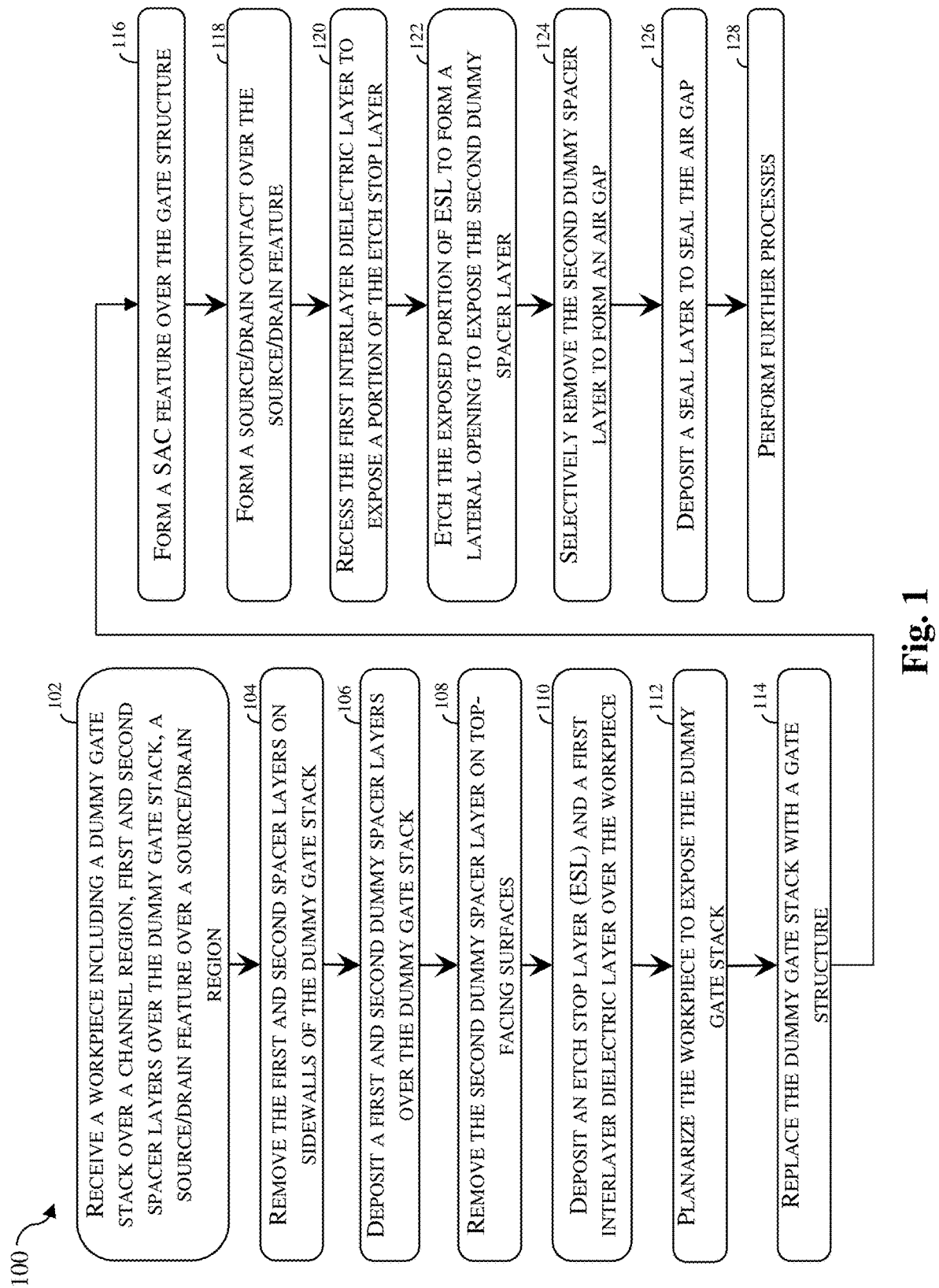
FIG. 1 illustrates a flowchart of an example method for fabricating a semiconductor device, according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods thereof, and more particularly to the formation of air gaps between source/drain (S/D) contacts and neighboring gate structures. As multi-gate technologies progress towards smaller technology nodes, decreasing active region pitch places significant constraints on materials that can be used between gate structures and neighboring S/D contacts. To lower or minimize parasitic capacitance, insulating (or dielectric) materials with relatively low dielectric constants (k), such as low-k dielectrics and/or air (by forming an air gap, for example), may be incorporated between various conductive features in a semiconductor device. In some instances, self-aligned contact (SAC) dielectric features or capping layers overlying gate structures and gate spacer layers may be breached in order to form such low-K dielectric features or air gaps. However, when the self-aligned contact (SAC) dielectric features or capping layers are breached, protection of the gate structure and gate spacer layers may become less protected during etch processes for forming source/drain contact openings.

The present disclosure provides methods for forming air gaps between gate structures and source/drain contacts without forming vertical openings through SAC dielectric features or capping layers disposed over the gate structures and gate spacer layers. In an example process of the present disclosure, a first dummy spacer layer and a second dummy spacer layer are formed over a dummy gate stack and source/drain features. After the top facing portion of the second dummy spacer layer is etched back, an etch stop layer (ESL) and an interlayer dielectric (ILD) layer are deposited over the first and second dummy spacer layers. The dummy gate stack is removed and replaced with a functional gate structure. A SAC dielectric feature or a capping layer is then formed over the gate structure, the first dummy spacer layer and the second dummy spacer layer. Source/drain contacts that extends through ESL and the ILD layer are fabricated over the source/drain features. Using the source/drain contact and the SAC dielectric feature as the etch mask, a portion of the ILD layer adjacent ends of the source/drain contact are recessed to expose sidewalls of the ESL. A lateral opening is then formed through the exposed sidewalls of the ESL to expose the second dummy layer. The second dummy layer under the SAC dielectric feature is then laterally removed to form an air gap. A seal layer is then deposited to seal the air gap. Because the seal layer may be formed of a material different from that of a further ILD layer deposited over the SAC dielectric feature (or the capping layer), the further ILD layer may be selectively removed to form slot-shaped source/drain contact vias. By way of lateral removal of the second dummy spacer layer to form the air gap, the SAC dielectric layer (or the capping layer) remains disposed over the ESL and the first dummy spacer layer to provide protection from misaligned source/drain contact vias.

The various aspects of the present disclosure will now be described in more detail with reference to the figures. FIG. 1 illustrates a flowchart of a method 100 of forming a semiconductor device on a workpiece 200 (not shown in FIG. 1 but shown in FIGS. 2A-17). FIG. 18 illustrates a flowchart of a method 300 of forming a semiconductor device on a workpiece 200 (not shown in FIG. 18 but shown in FIGS. 19A-34). Methods 100 and 300 are each merely an example and not intended to limit the present disclosure beyond what is explicitly recited in the claims. Additional operations can be provided before, during, and after method 100 or method 300, and some operations described can be replaced, eliminated, or moved around for additional embodiments of the method. Method 100 is described below in conjunction with FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, and 14-17, each of which illustrate a fragmentary cross-sectional view or a top view of the workpiece 200 during various operations of method 100. Method 300 is described below in conjunction with FIGS. 19A, 19B, 20A, 20B, 21A, 21B, 22A, 22B, 23A, 23B, 24A, 24B, 25A, 25B, 26A, 26B, 27A, 27B, 28A, 28B, 29A, 29B, 30A, 30B, and 31-34, each of which illustrate a fragmentary cross-sectional view or a top view of the workpiece 200 during various operations of method 300. The workpiece 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations. For example, though the workpiece 200 as illustrated includes three-dimensional FinFET devices, the present disclosure may also provide embodiments for fabricating GAA devices. Additional features can be added in semiconductor devices fabricated on the workpiece 200, and some of the features described below can be replaced, modified, or eliminated in other embodiments of the semiconductor device to be fabricated on the workpiece 200. Because a semiconductor device is to be formed from the workpiece 200 at the conclusion of the processes described in the present disclosure, the workpiece 200 may be referred to as a semiconductor device 200 as the context requires.

For better illustration of various aspects of the present disclosure, FIGS. 2-13 each include a figure ending with A and another figure ending with B. A figure ending with A, such as FIGS. 2A-13A, illustrates a fragmentary cross-sectional view of the workpiece 200 along the cross-section I-I' that extends along the X direction through the active region 204. A figure ending with B, such as FIGS. 2B-13B, illustrates a fragmentary cross-sectional view of the workpiece 200 the cross-section II-II' that extends along the X but does not extend through the active region 204. Figures sharing the same number but ending with different letters may be collectively referred to by the number. For example, FIGS. 9A and 9B may be collectively referred to as FIG. 9.

Figure 2A:
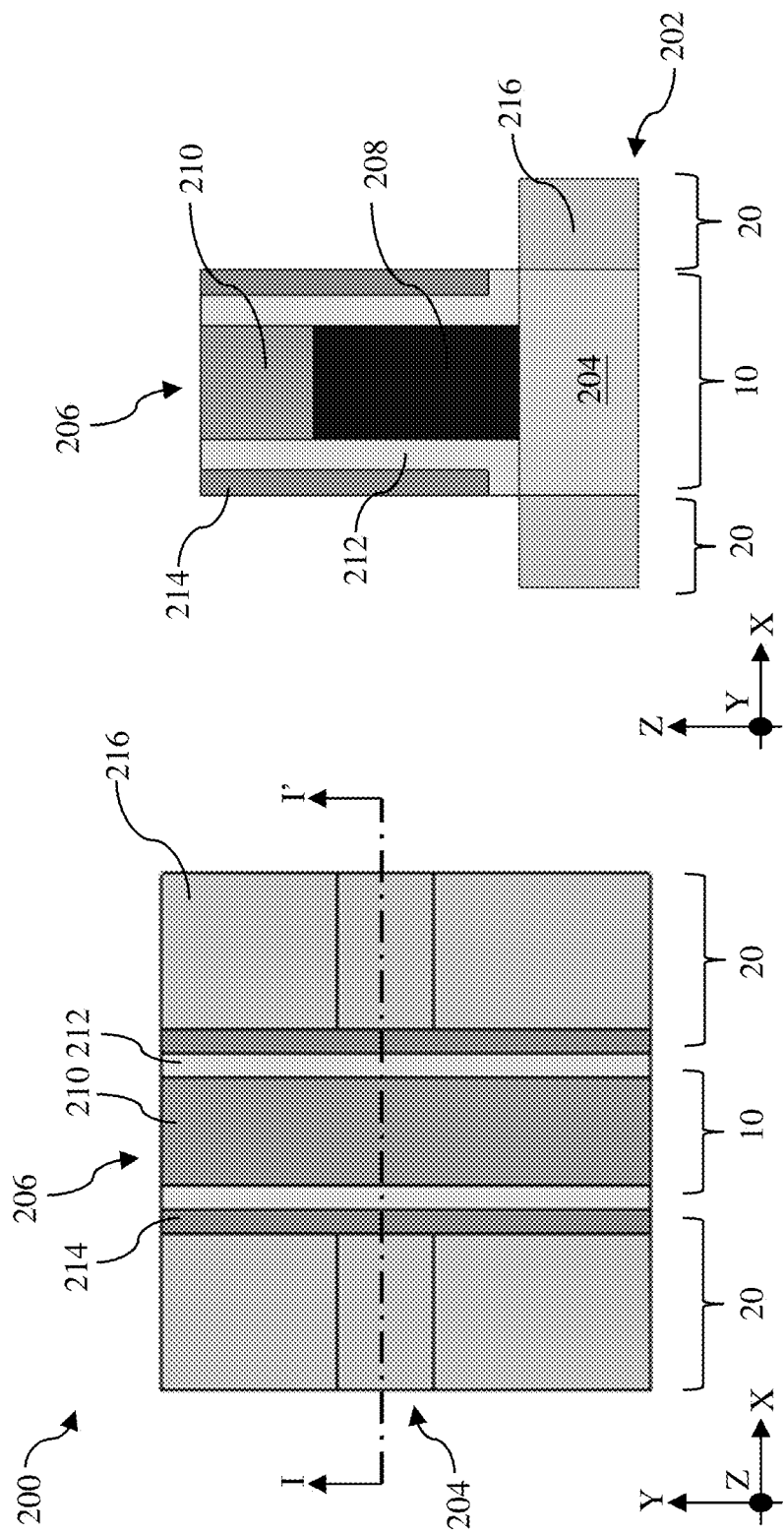
FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, and 14-17 are fragmentary cross-sectional views and top views of the workpiece in FIG. 1, according to various embodiments of the present disclosure.
Figure 2B:
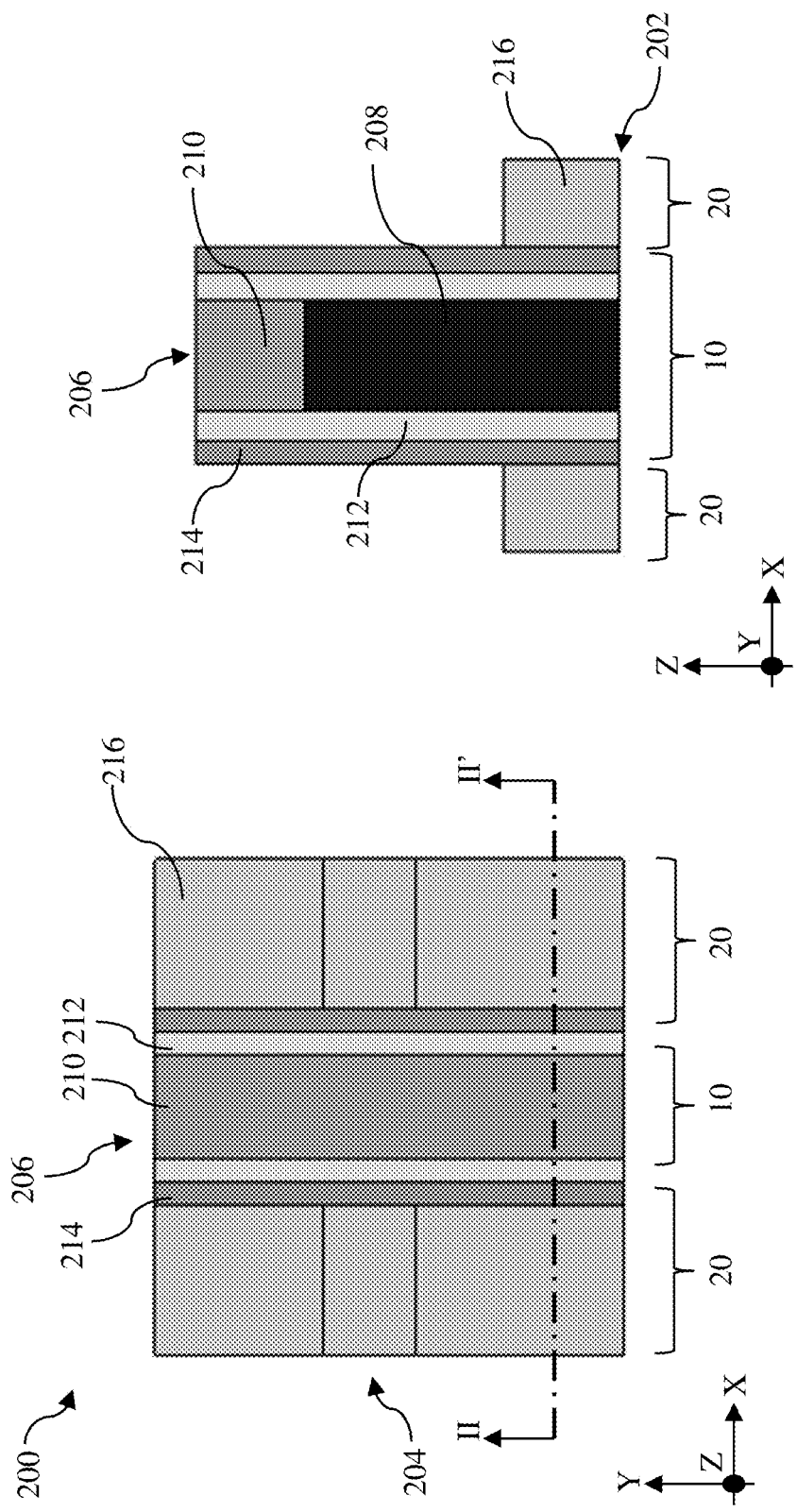

Referring to FIGS. 1, 2A and 2B, method 100 includes a block 102 where a workpiece 200 is received. The workpiece 200 includes a dummy gate stack 206 over a channel region 10 of an active region 204, a first spacer layer 212 over the dummy gate stack 206, a second spacer layer 214 over the first spacer layer 212, a source/drain feature 216 over a source/drain region 20 of the active region 204. The workpiece 200 includes active region 204 (or a fin-shaped region 204) connected to and arising from the substrate 202. The active region 204 may include one or more channel regions of a multi-gate device. For example, the active region 204 may be a fin structure of an FinFET or may a stack of alternating epitaxial layers of a gate-all-around (GAA) transistor. The active region 204 includes a channel region 10 and a source/drain region 20 adjacent the channel region 10. The channel region 10 may be disposed between two source/drain regions 20. The workpiece 200 includes a dummy gate stack 206 that includes a dummy electrode 208 and a hard mask 210. A first gate spacer 212 is disposed over sidewalls of the dummy gate stack 206 and a second gate spacer 214 is disposed on sidewalls of the first gate spacer 212. Although not shown in FIG. 2A, the dummy gate stack 206 may also include a dummy gate dielectric layer disposed between the dummy electrode 208 and the channel region 10 of the active region 204.

The active region 204 is formed over a substrate 202. The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof. In some embodiments where the substrate 202 includes FETs, various doped regions, such as source/drain regions, are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

The active regions 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the active regions 204 on the substrate 202. The etching process may include dry etching, wet etching, reactive ion etching (RIE), and/or other suitable processes. Numerous other embodiments of methods for forming the active regions 204 may be suitable. For example, the active regions 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the active regions 204.

While not explicitly shown in FIG. 2A, the active region 204 may be separated from an adjacent active region 204 by an isolation feature, which may include silicon oxide, silicon nitride, silicon oxynitride, fluoride-doped silicate glass (FSG), a low-k dielectric material, and/or other suitable materials. The isolation feature may include shallow trench isolation (STI) features. In one embodiment, the isolation feature may be formed by etching trenches in the substrate 202 during the formation of the fin structures 204. The trenches may then be filled with an isolating material described above by a deposition process, followed by a chemical mechanical planarization (CMP) process. Other isolation structure such as field oxide, local oxidation of silicon (LOCOS), and/or other suitable structures may also be implemented as the isolation feature. Alternatively, the isolation feature may include a multi-layer structure, for example, having one or more thermal oxide liner layers. The isolation feature may be deposited by any suitable method, such as chemical vapor deposition (CVD), flowable CVD (FCVD), spin-on-glass (SOG), other suitable methods, or combinations thereof.

In some embodiments, the dummy gate electrode 208 may be formed of polysilicon. The hard mask 210 may be a single layer or a multi-layer and may be formed of silicon oxide, silicon nitride, silicon oxynitride, or a combination thereof. The first spacer layer 212 and the second spacer layer 214 may be each formed of a dielectric material selected from silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. In some implementations, the first spacer layer 212 and the second spacer layer 214 may be formed of different dielectric materials. As shown in FIG. 2A, in some embodiments, the dummy gate stack 206 and the first spacer layer 212 are disposed over the channel region 10 of the active region 204. The gate dummy gate stack 206 is not only disposed over a top surface of the channel region 10 of the active region 204 but also extends along sidewalls of the active region 204. As shown in FIG. 2B, outside the active region 204, the first spacer layer 212 and the second spacer layer 214 are disposed along sidewalls of the dummy gate stack 206.

Source/drain features 216 may be formed by any suitable techniques, such as etching processes followed by one or more epitaxy processes, in the source/drain regions 20. In one example, using the dummy gate stack 206, the first spacer layer 212 and the second spacer layer 214 as an etch mask, one or more etching processes are performed to remove portions of the active region 204 in the source/drain regions 20 to form recesses (not explicitly shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the source/drain features may be suitable for a p-type metal-oxide-semiconductor (PMOS) device (e.g., including a p-type epitaxial material) or alternatively, an n-type MOS (NMOS) device (e.g., including an n-type epitaxial material). The p-type epitaxial material may include one or more epitaxial layers of silicon germanium (SiGe), where the silicon germanium is doped with a p-type dopant such as boron, germanium, indium, and/or other p-type dopants. The n-type epitaxial material may include one or more epitaxial layers of silicon (Si) or silicon carbon (SiC), where the silicon or silicon carbon is doped with an n-type dopant such as arsenic, phosphorus, and/or other n-type dopant. In some implementations, each of the epitaxial growth processes may include different in-situ doping levels of suitable dopants. The epitaxial growth processes to form the source/drain features 216 may include vapor-phase epitaxy (VPE), ultra-high vacuum CVD (UHV-CVD), a cyclic deposition and etching (CDE) process, molecular beam epitaxy (MBE), and/or other suitable processes. As shown in FIG. 2A, the source/drain feature 216 is in contact with the channel region 10 of the active region 204. In FIG. 2B, in areas outside the active region 204, the source/drain feature 216 is in contact with the second spacer layer 214.

Figure 3A:
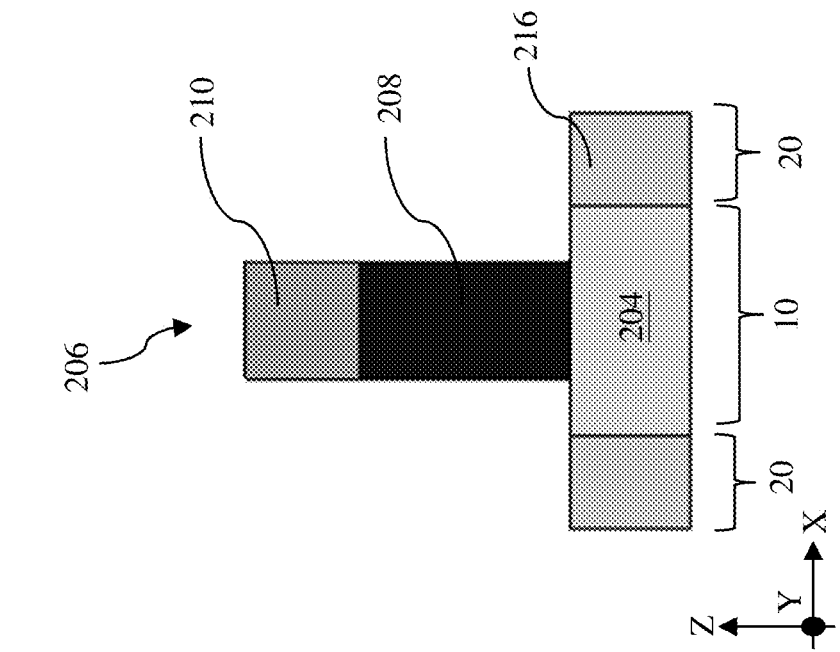
Figure 3A:
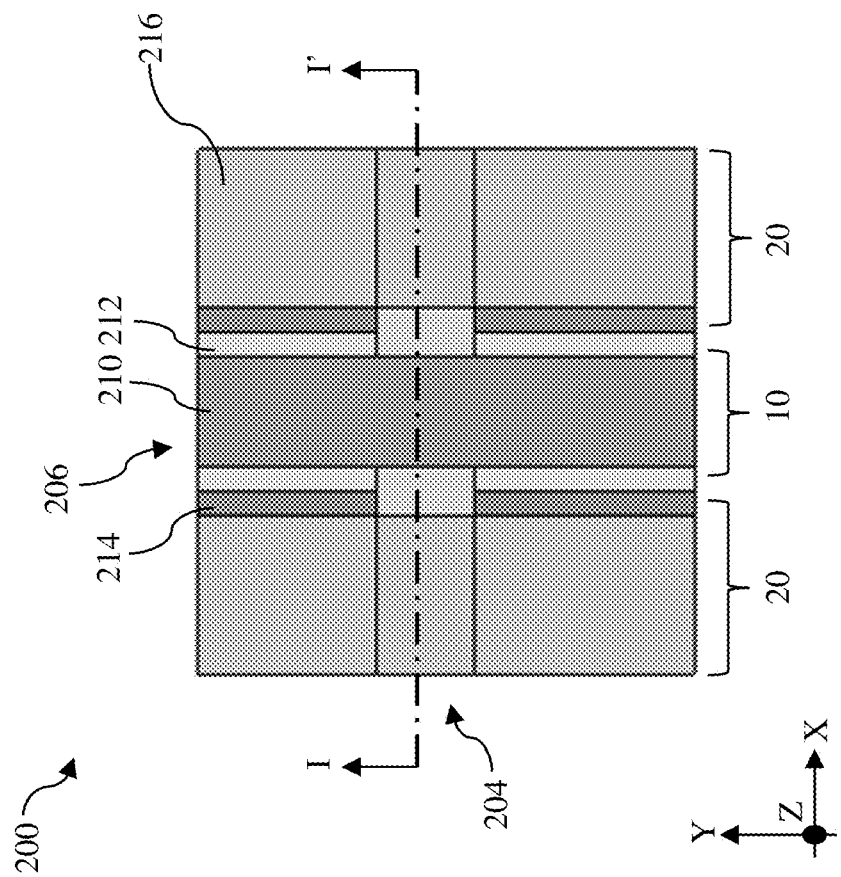
Figure 3B:
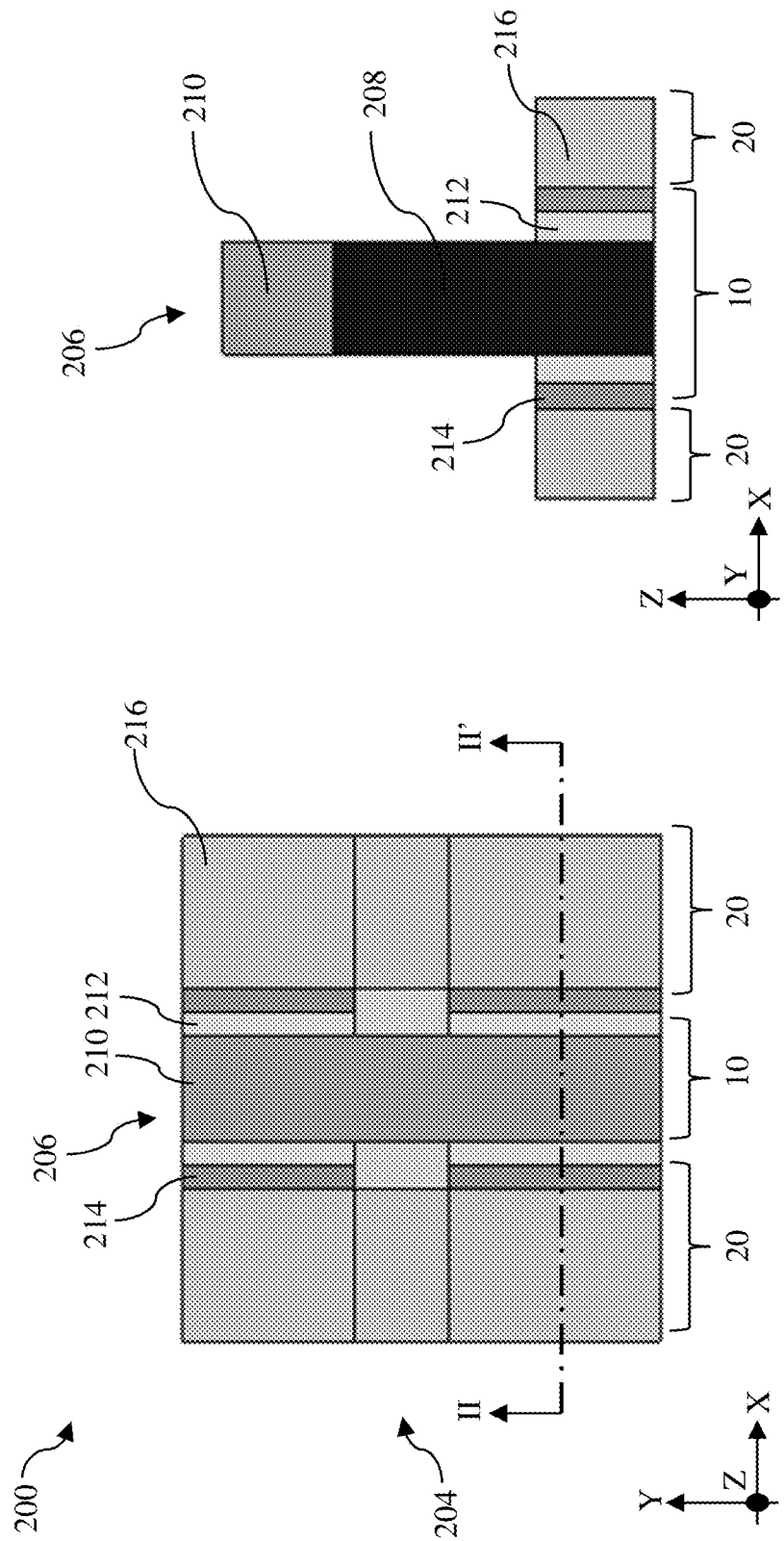

Referring to FIGS. 1, 3A and 3B, method 100 includes a block 104 where the first spacer layer 212 and the second spacer layer 214 on sidewalls of the dummy gate stack 206 are removed. At block 104, in order to make room for a first dummy spacer layer 218 and a second dummy spacer layer 220 (to be formed at block 106 below), the first spacer layer 212 and the second spacer layer 214 above the source/drain feature 216 are substantially removed. A suitable dry etch process or a suitable wet etch process that are selective to the first spacer layer 212 and the second spacer layer 214 may be performed at block 104 to remove the first spacer layer 212 and the second spacer layer 214.

Figure 4A:
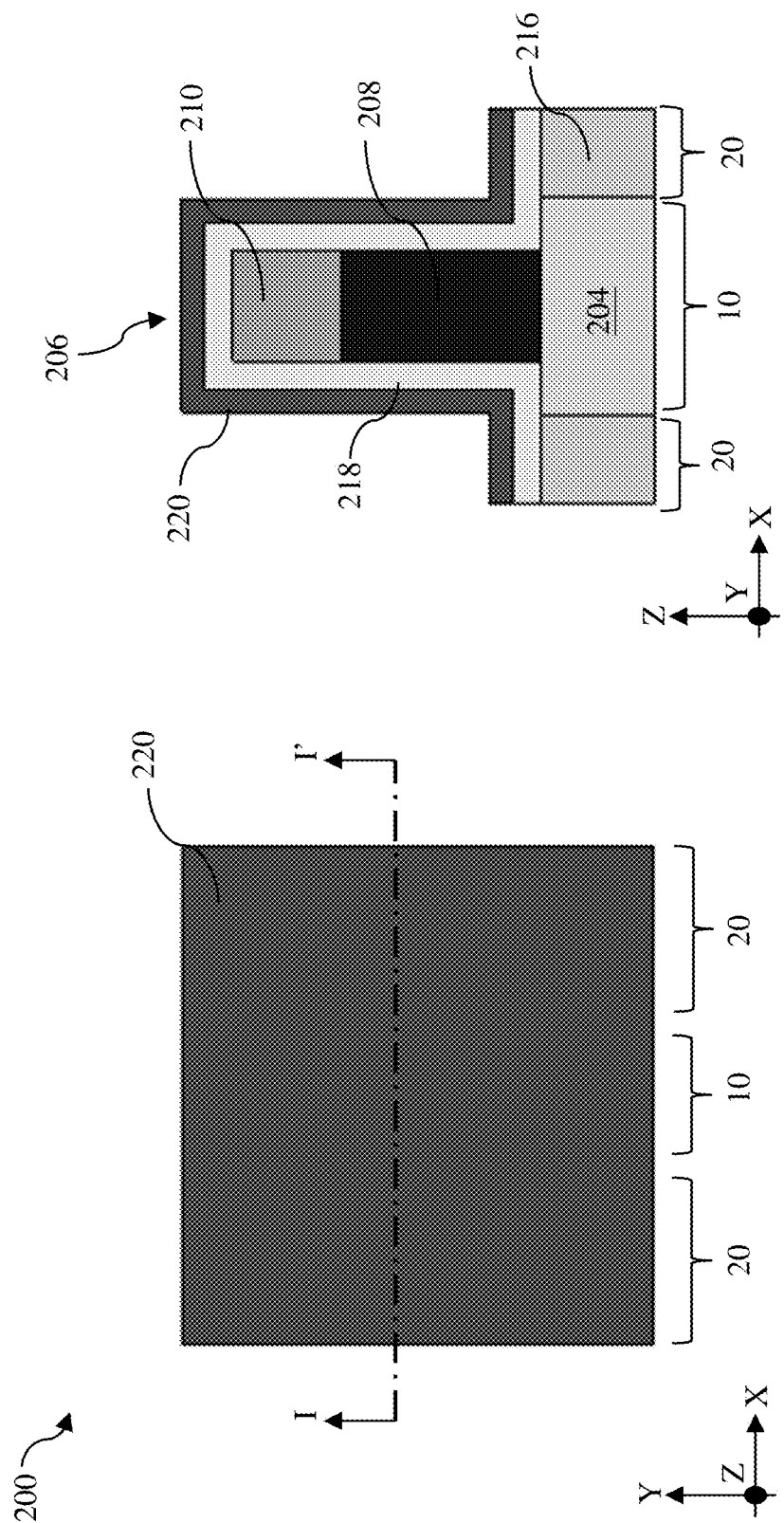
Figure 4B:
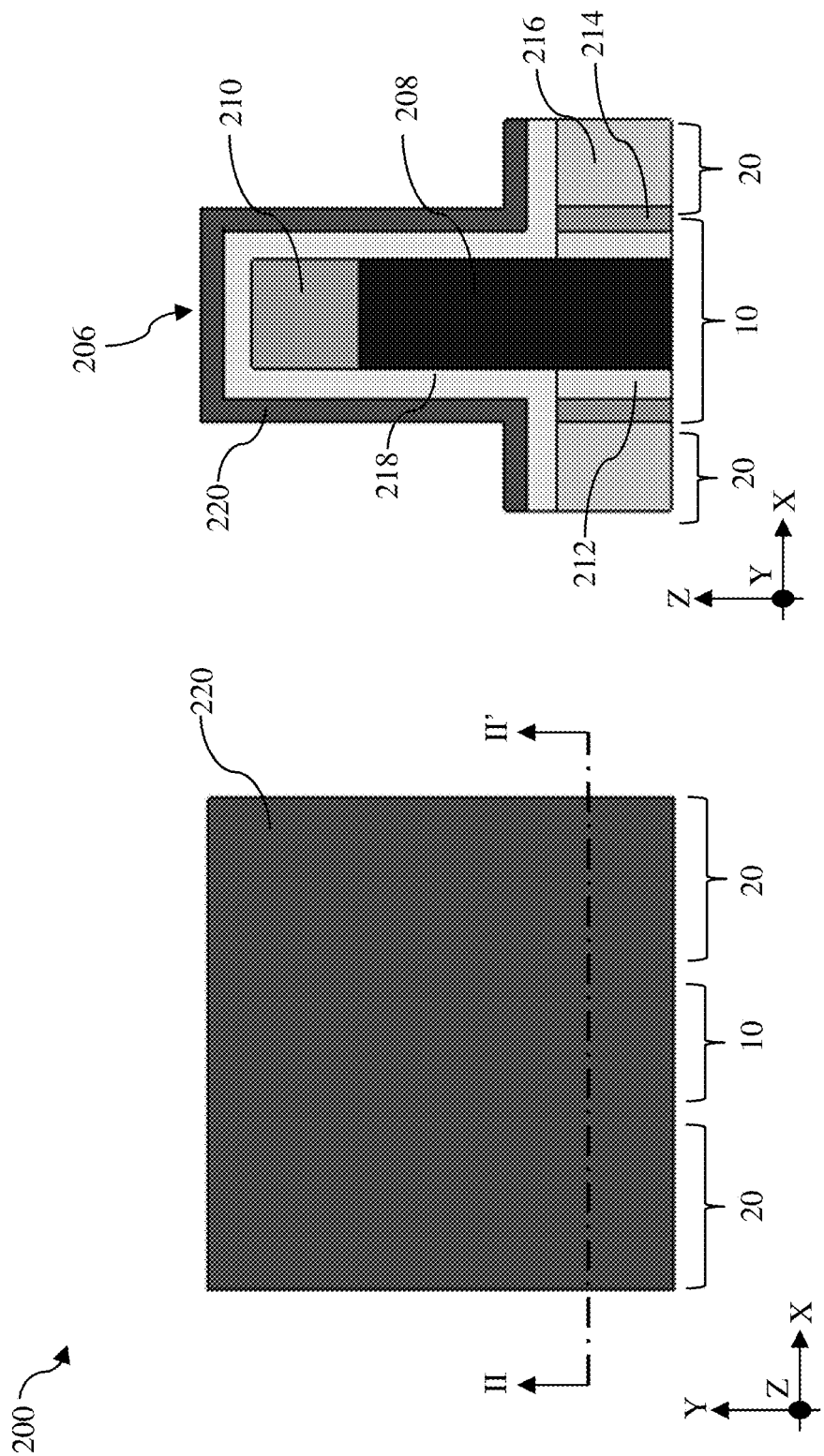

Referring to FIGS. 1, 4A and 4B, method 100 includes a block 106 where a first dummy spacer layer 218 and a second dummy spacer layer 220 are deposited over the dummy gate stack 206. In some embodiments, each of the first dummy spacer layer 218 and the second dummy spacer layer 220 may be formed of silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. As illustrated in FIG. 4A, along the active region 204, the first dummy spacer layer 218 may be disposed on the source/drain feature 216, a portion of the channel region 10 of the active region 204, sidewalls of the dummy gate stack 206, and a top surface of the hard mask 210. As illustrated in FIG. 4B, outside the active region 204, the first dummy spacer layer 218 may be disposed on the source/drain feature 216, top surfaces of the first spacer layer 212 and the second spacer layer 214, sidewalls of the dummy gate stack 206, and a top surface of the hard mask 210. As shown in FIGS. 4A and 4B, the second dummy spacer layer 220 is disposed on the first dummy spacer layer 218. It is noted while the first dummy spacer layer 218 and the second dummy spacer layer 220 are formed of a material selected from a similar collection of dielectric materials set forth above, the first dummy spacer layer 218 and the second dummy spacer layer 220 have different compositions. The different compositions of the first dummy spacer layer 218 and the second dummy spacer layer 220 allow the second dummy spacer layer 220 to be selectively etched without substantially etching the first dummy spacer layer 218. From a top view shown in FIGS. 4A and 4B, the second dummy spacer layer 220 is blanketly deposited over the workpiece 200. In some embodiments, the first dummy spacer layer 218 may be formed to a thickness between about 1 nm and about 10 nm and the second dummy spacer layer 220 may be formed to a thickness between about 1 nm and about 10 nm.

Figure 5A:
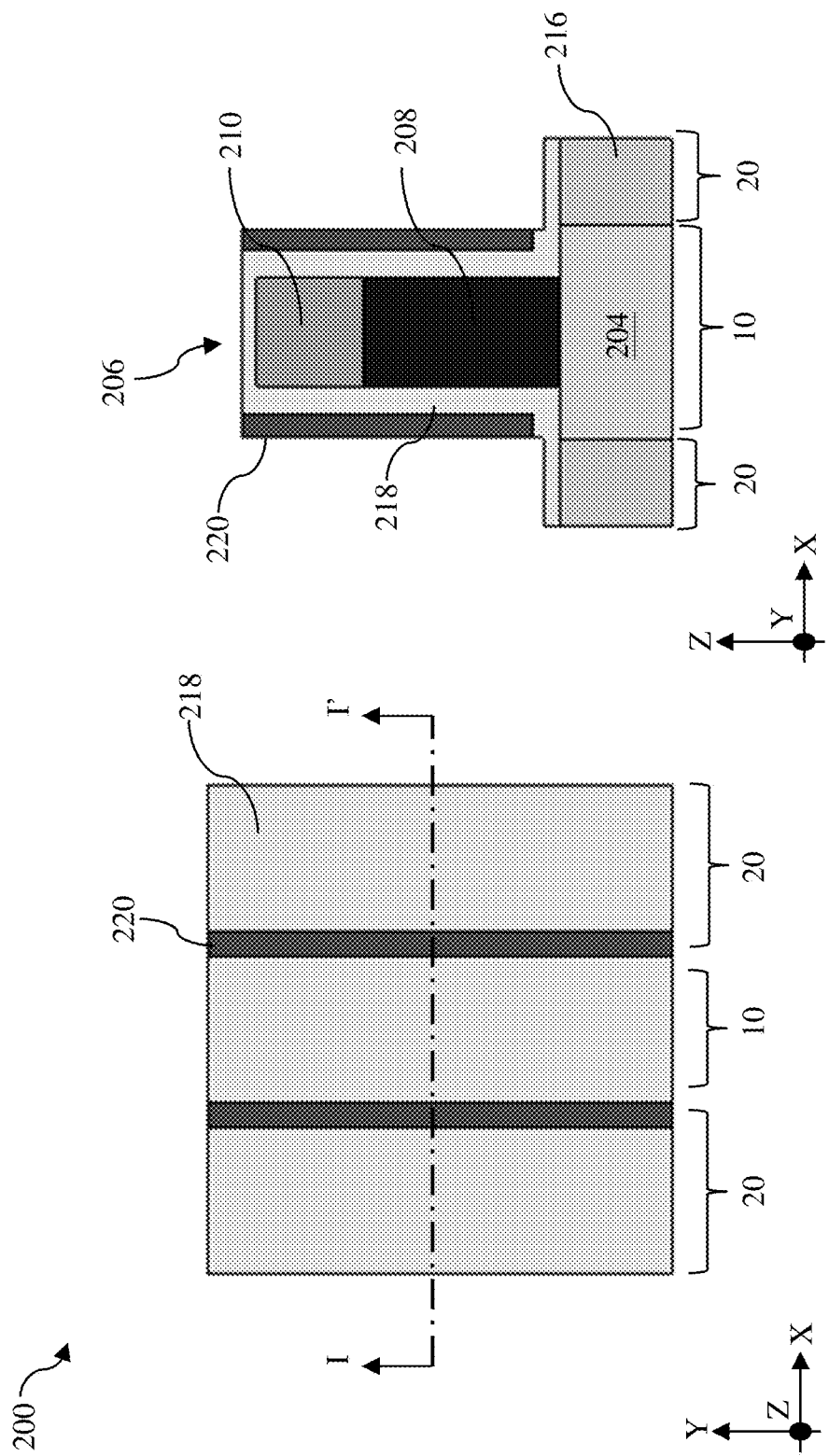
Figure 5B:
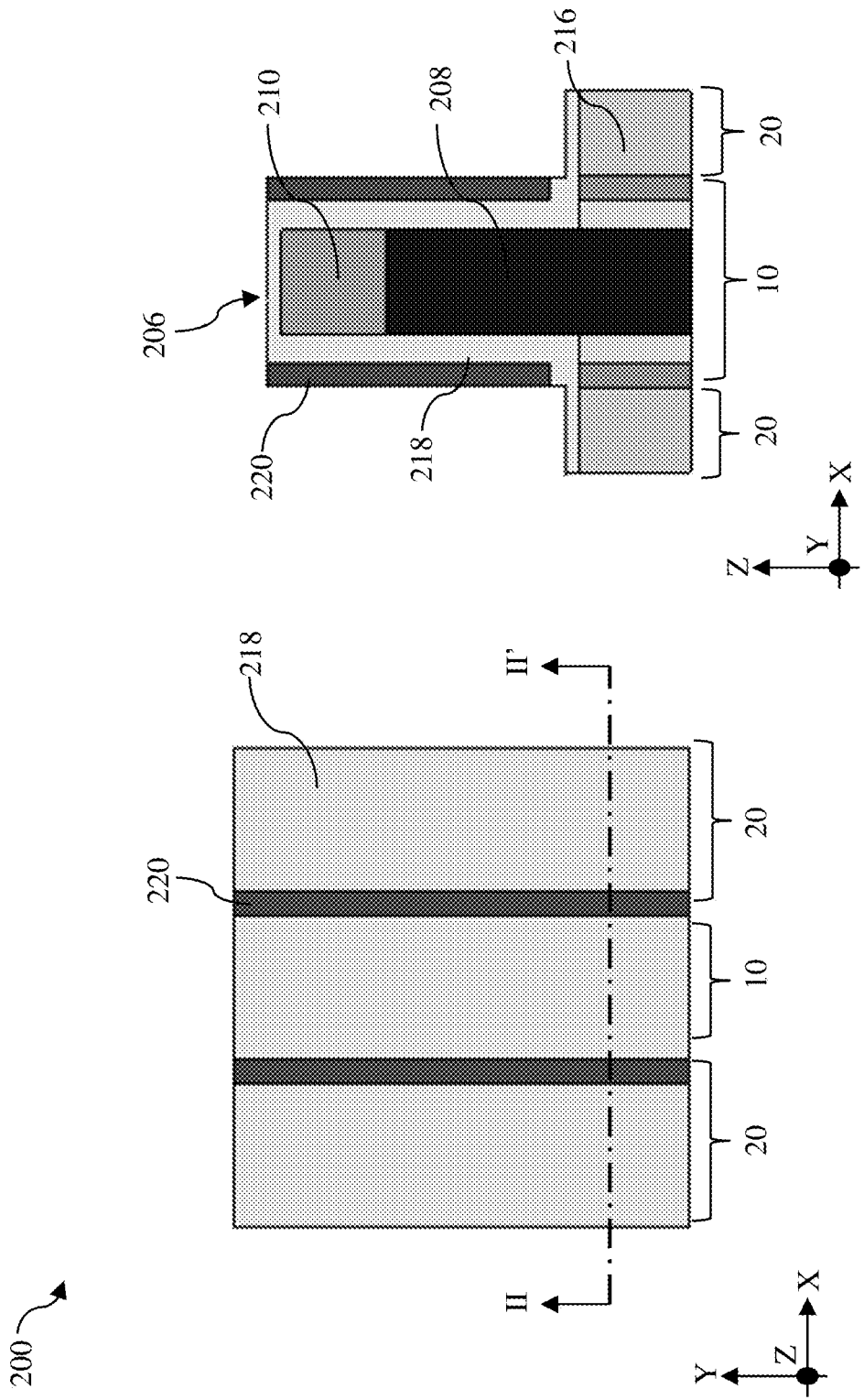

Referring to FIGS. 1, 5A and 5B, method 100 includes a block 108 where a top facing portion of the second dummy spacer layer 220 is removed. At block 108, a selective and anisotropic etch process may be performed to remove the second dummy spacer layer 220 from top-facing surfaces of the workpiece 200. As shown in FIGS. 5A and 5B, the selective etching at block 108 may leave behind a vertical portion of the second dummy spacer layer 220 disposed along sidewalls of first dummy spacer layer 218 disposed along sidewalls of the dummy gate stack 206. The etching process at block 108 may also reduce the thickness of the first dummy spacer layer 218 on top facing surfaces of the workpiece 200.

Figure 6A:
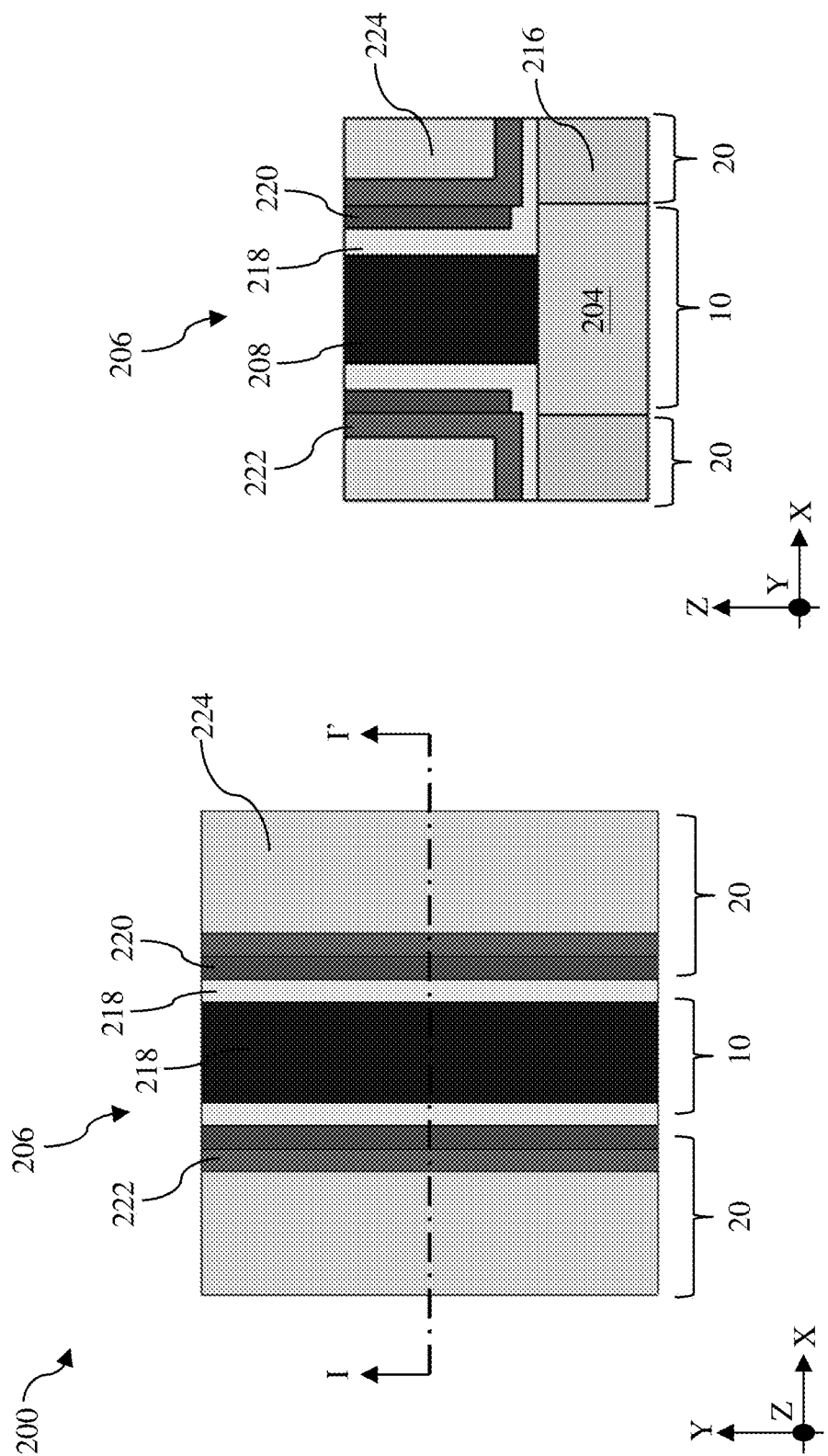
Figure 6B:
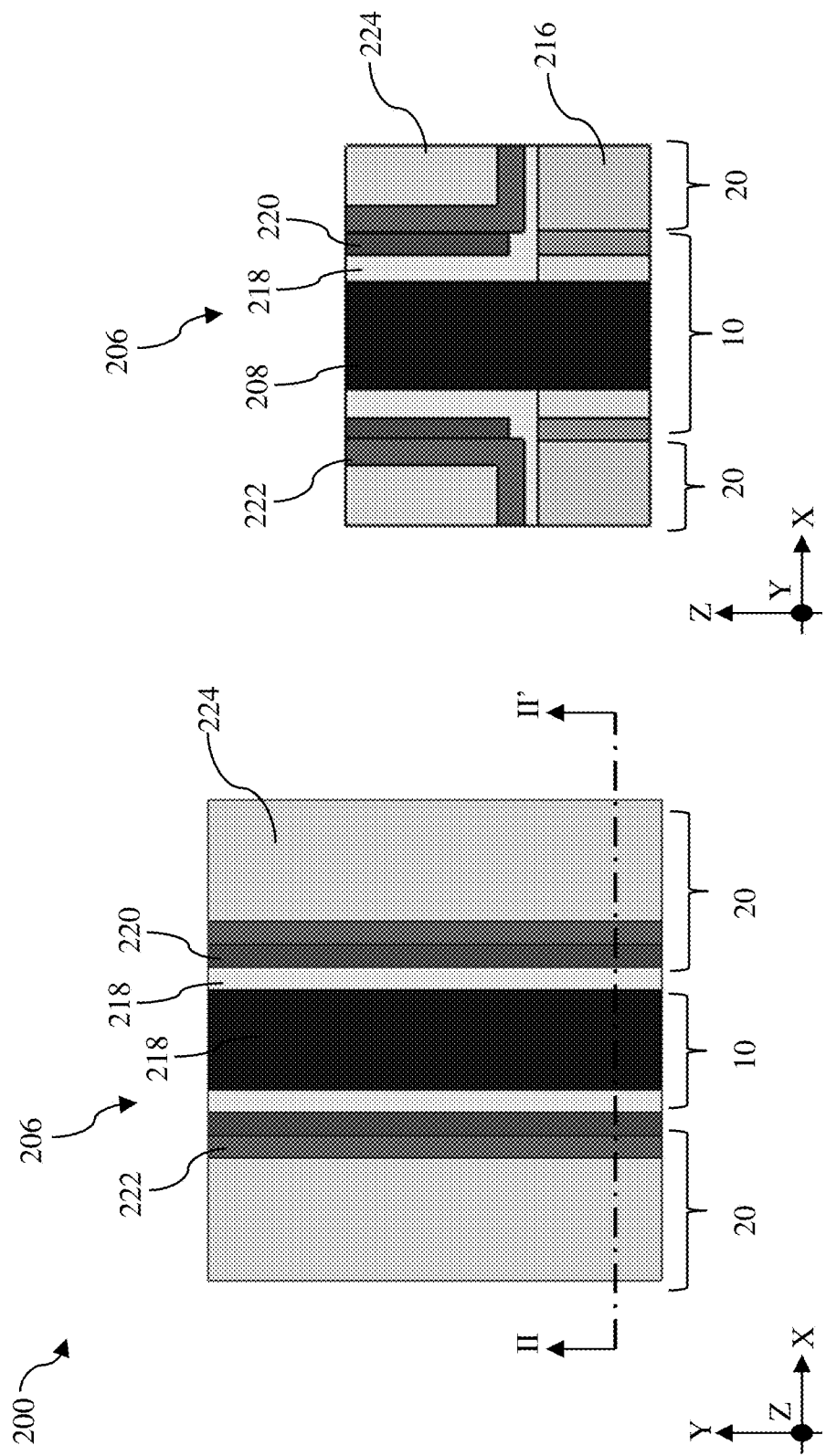

Referring to FIGS. 1, 6A and 6B, method 100 includes a block 110 where a first etch stop layer (ESL) 222 and a first interlayer dielectric (ILD) layer 224 are deposited over the workpiece 200. The first ESL 222 and the first ILD layer 224 are blanketly deposited over the workpiece 200, including over the first dummy spacer layer 218 over the source/drain features 216 and over the sidewalls of the left-over second dummy spacer layer 220. In some embodiments, the first ESL 222 may include semiconductor nitride, such as silicon nitride. In some implementations, the first ILD layer 224 may include a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the first ILD layer 224 includes an oxide-containing dielectric material. The first ILD layer 224 may include a multi-layer structure or a single-layer structure and may be formed by a deposition process such as, for example, CVD, flowable CVD (FCVD), spin-on-glass (SOG), other suitable methods, or combinations thereof.

Referring to FIGS. 1, 6A and 6B, method 100 includes a block 112 where the workpiece 200 is planarized to expose the dummy gate stack 206. At block 112, a planarization process, such as a chemical mechanical polishing (CMP), may be performed to the workpiece 200 to remove excess first ESL 222, excess first ILD layer 224, and the hard mask 210 over the dummy gate electrode 208. As illustrated in FIGS. 6A and 6B, upon conclusion of the operations at block 110, the workpiece 200 includes a planar top surface where top surfaces of the first ILD layer 224, the first ESL 222, the first dummy spacer layer 218, the second dummy spacer layer 220, and the dummy electrode layer 208 are coplanar.

Figure 7A:
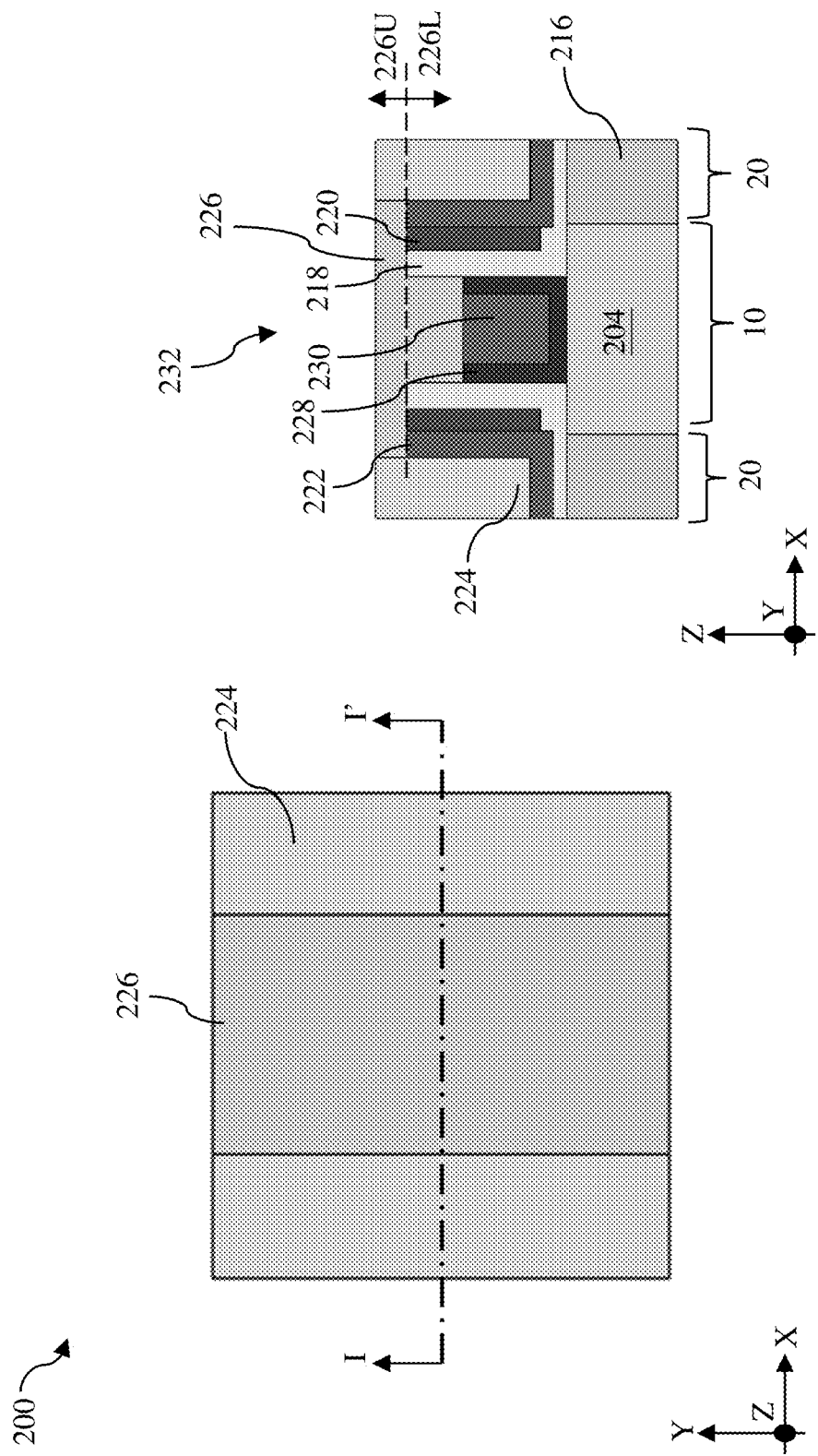
Figure 7B:
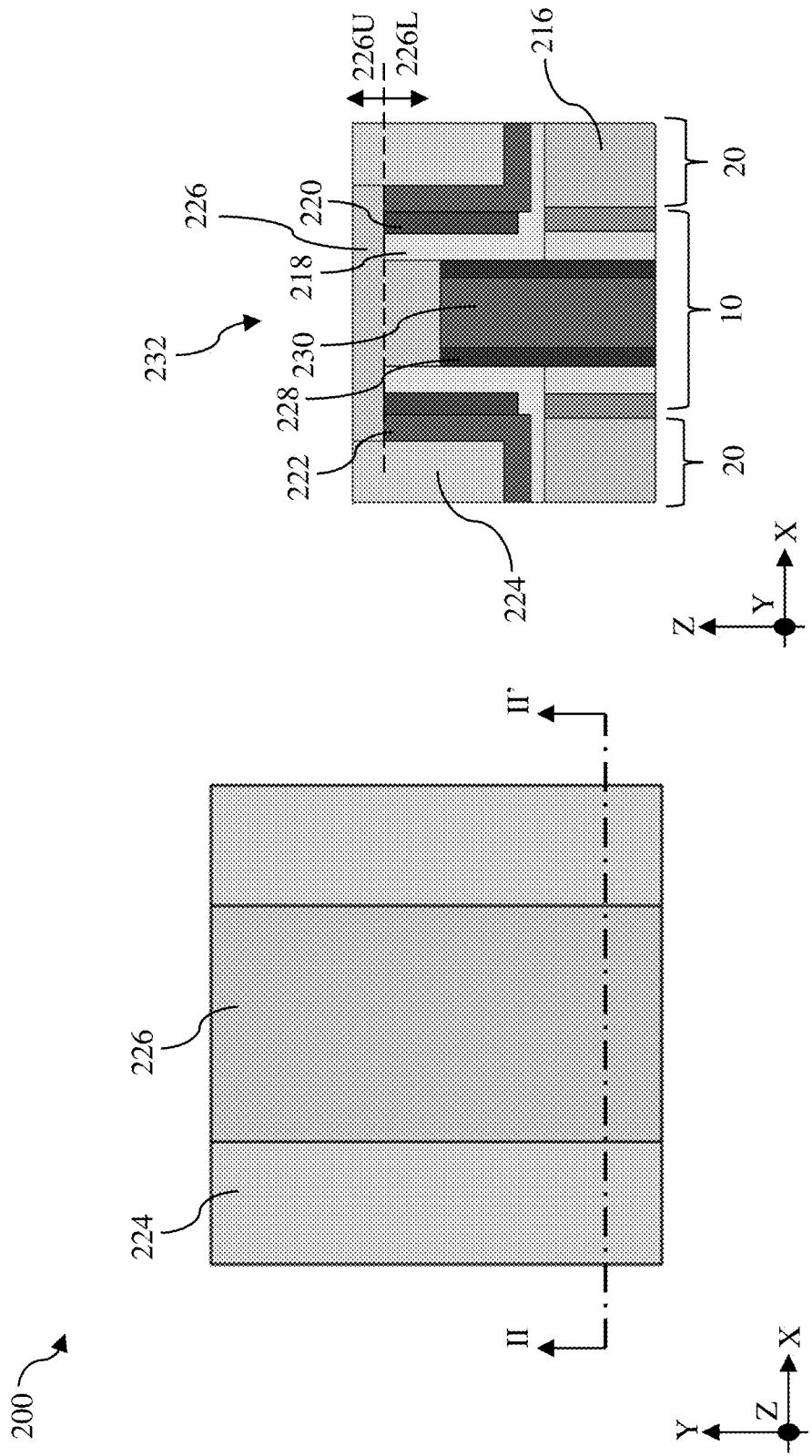

Referring to FIGS. 1, 7A and 7B, method 100 includes a block 114 where the dummy gate stack 206 is replaced with a gate structure 232. In some embodiments, the dummy gate stack 206 serves as a placeholder for the functional gate structure 232 and is selectively etched away at block 114. In instances where the dummy gate electrode 208 is formed of polysilicon, an etch process that is selective to the dummy gate electrode 208 may be used to remove the dummy gate electrode 208 to expose the channel region 10 of the active region 204. In some embodiments, the gate structure 232 includes a gate dielectric layer 228 and a gate electrode 230. The gate dielectric layer 228 may include an interfacial layer on the channel region 10 of the active region 204 and one or more high-k dielectric layers (i.e., having a dielectric constant greater than that of silicon oxide, which is about 3.9) over the interfacial layer. In some implementations, the interfacial layer may include silicon oxide and the high-k dielectric layer may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. The interfacial layer functions to enhance adhesion of the high-k dielectric layers to the channel region 10 of the active region 204. The gate electrode 230 may include at least one work function metal layer and a metal fill layer disposed thereover. Depending on the conductivity type of the semiconductor device 200, the work function metal layer may be a p-type or an n-type work function metal layer. Exemplary work function materials include TiN, TaN, Ru, Mo, Al, WN, ZrSi$_2$, MoSi$_2$, TaSi$_2$, NiSi$_2$, Ti, Ag, TaAl, TaAlC, TiAlN, TaC, TaCN, TaSiN, Mn, Zr, other suitable work function materials, or combinations thereof. The metal fill layer may include copper (Cu), tungsten (W), aluminum (Al), cobalt (Co), other suitable materials, or combinations thereof and may be deposited using physical vapor deposition (PVD), CVD, ALD, or other suitable processes. In some embodiments, the gate structure 232 may further include liners, barrier layers, other suitable layers, or combinations thereof.

Figure 8A:
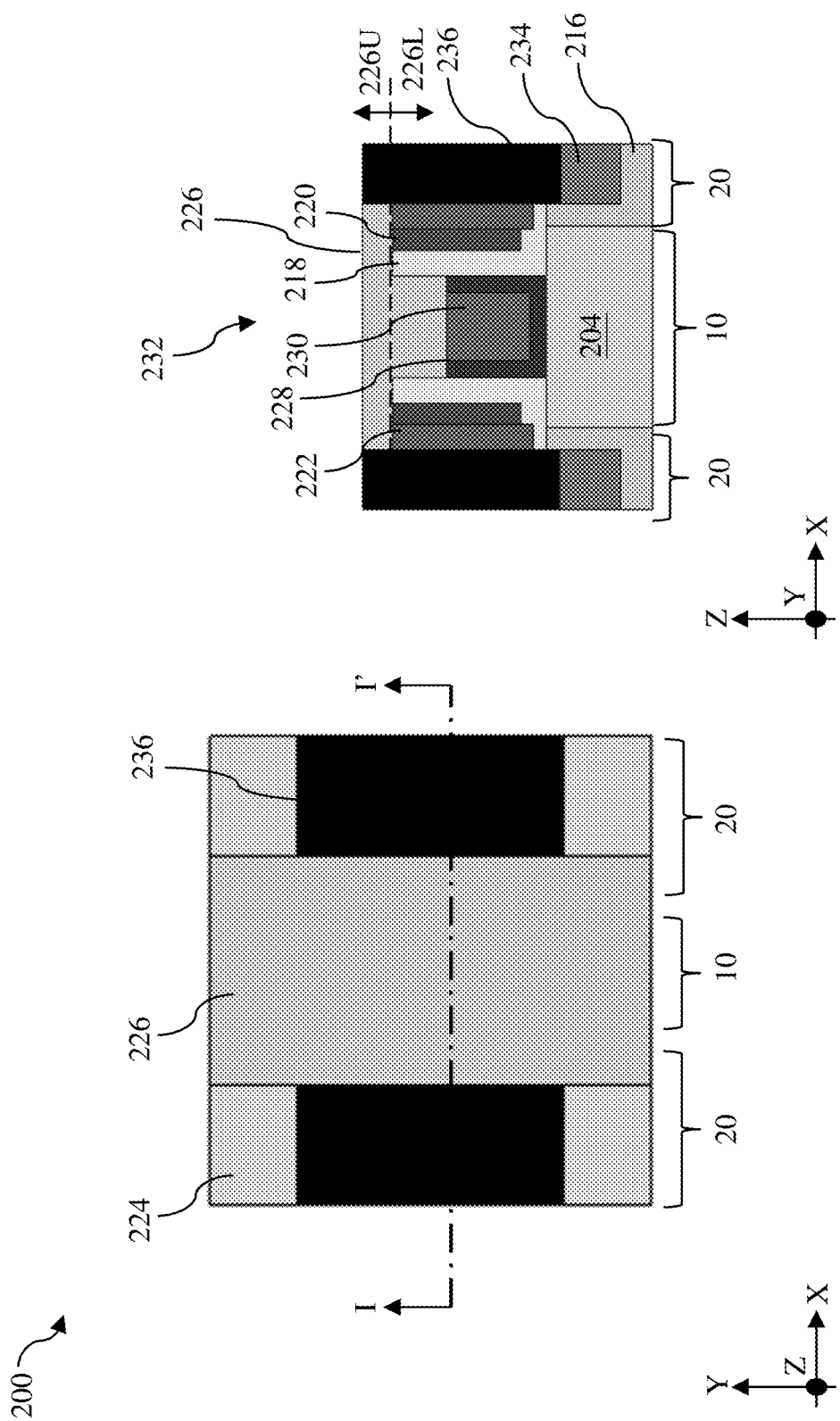
Figure 8B:
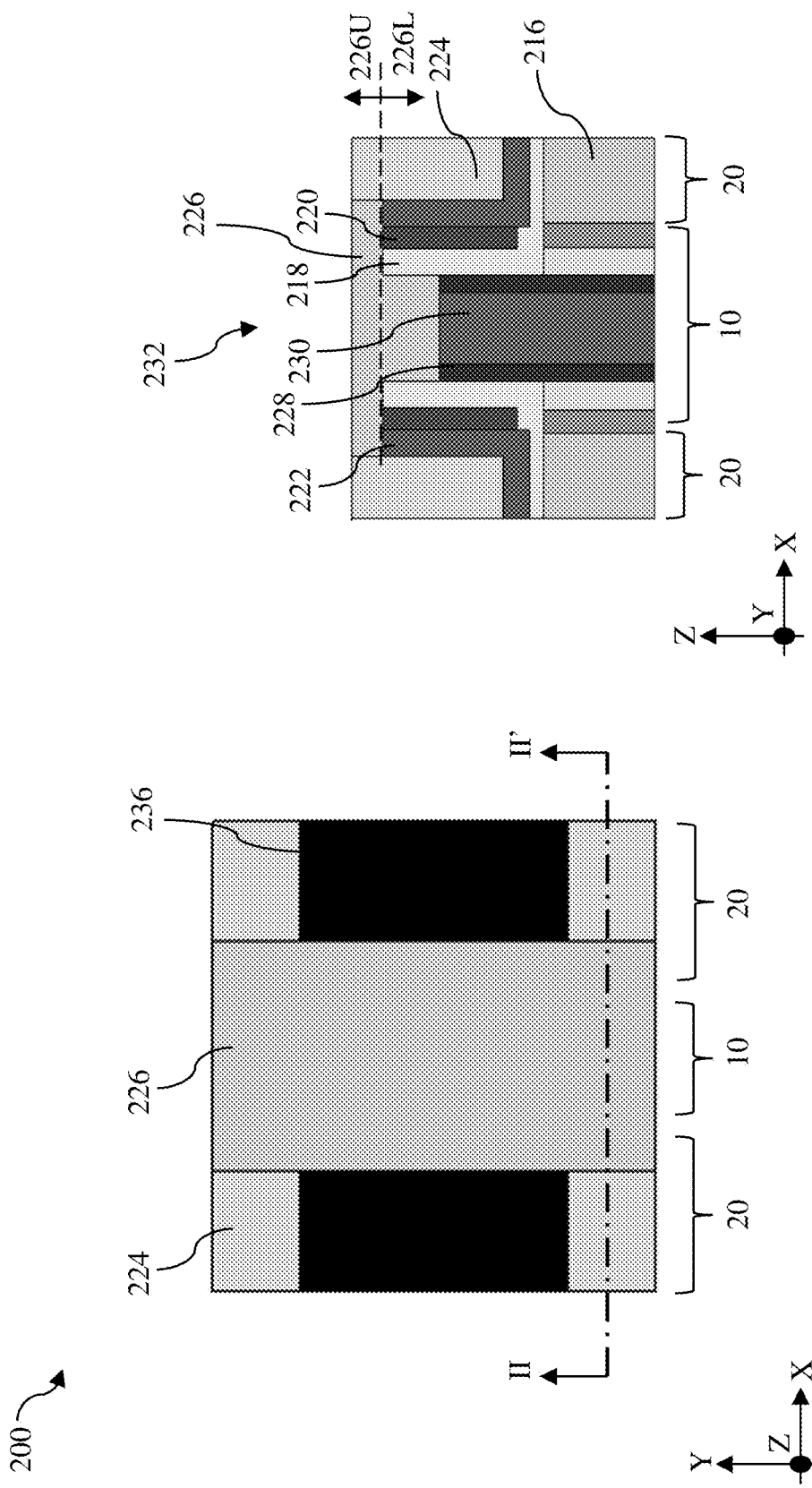

Referring to FIGS. 1, 8A and 8B, method 100 includes a block 116 where a first self-align contact (SAC) feature 226 is formed over the gate structure 232. In some embodiments, the first ESL 222, the second dummy spacer layer 220, the first dummy spacer layer 218, the gate structure 232 are selectively etched to form a SAC contact opening (not explicitly shown in FIGS. 7A and 7B). In some implementations, the selective etching may etch the functional gate structure 232 at a faster rate, resulting in a T-shaped SAC opening when viewed along the Y direction. A dielectric material is then deposited into the T-shaped SAC opening to form the first SAC feature 226, which is also T-shaped when viewed along the Y direction. In some embodiments, the dielectric material may include silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. In some instances, the T-shaped first SAC feature 226 may include a lower portion 226L adjacent the gate structure 232 and an upper portion 226U over the lower portion 226L. In some implementations illustrated in FIGS. 8A and 8B, the upper portion 226U is disposed over the lower portion 226L and top surfaces of the first ESL 222, the second dummy space layer 220, and the first dummy spacer layer 218. The lower portion 226L of the first SAC feature 226 is disposed between the first dummy spacer layers 218. In some instances, the upper portion 226U may have a thickness along the Z direction between about 1 nm and about 30 nm and the lower portion 226L may have a thickness along the Z direction between about 1 nm and about 30 nm. The first SAC feature 226 may also be referred to as a capping layer 226.

Referring still to FIGS. 1, 8A and 8B, method 100 includes a block 118 where a source/drain contact 236 is formed over the source/drain feature 216. While not explicitly shown, a source/drain contact opening is formed over a portion of the source/drain feature 216 to expose such portion of the source/drain feature 216. A silicide feature 234 is then formed over the exposed portion of the source/drain feature 216 by depositing a metal material over the source/drain feature 216 and annealing the workpiece 200 to bring about a silicidation reaction between the metal material and the source/drain feature 216. In some instances, the metal material may include titanium (Ti), nickel (Ni), cobalt (Co), tantalum (Ta), or tungsten (W) and the silicide feature 234 may include titanium silicide, nickel silicide, cobalt silicide, tantalum silicide, tungsten silicide. The silicide feature 234 functions to reduce contact resistance. After the formation of the source/drain contact openings, source/drain contacts 236 are deposited in the source/drain contact openings. Each of the source/drain contacts 236 may be formed of a metal selected from copper (Cu), tungsten (W), aluminum (Al), cobalt (Co), ruthenium (Ru), nickel (Ni), other suitable materials, or combinations thereof and deposited using PVD, CVD, ALD, or other suitable processes. After deposition of the source/drain contacts 236, the workpiece 200 is planarized to remove excess metal of the source/drain contacts 236 over the first ILD layer 224 such that top surfaces of the source/drain contacts 236 and the first ILD layer 224 are coplanar.

Figure 9A:
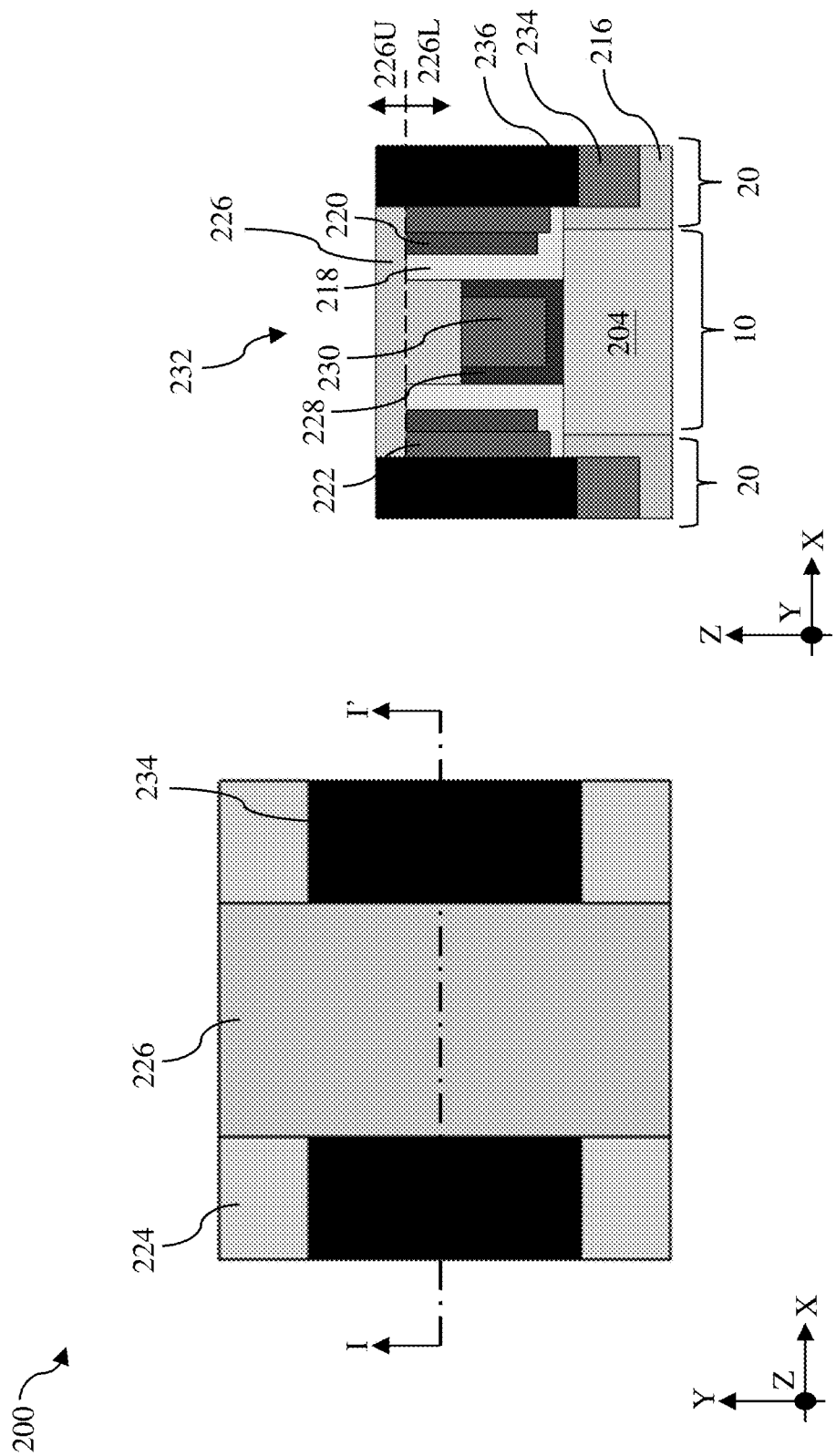
Figure 9B:
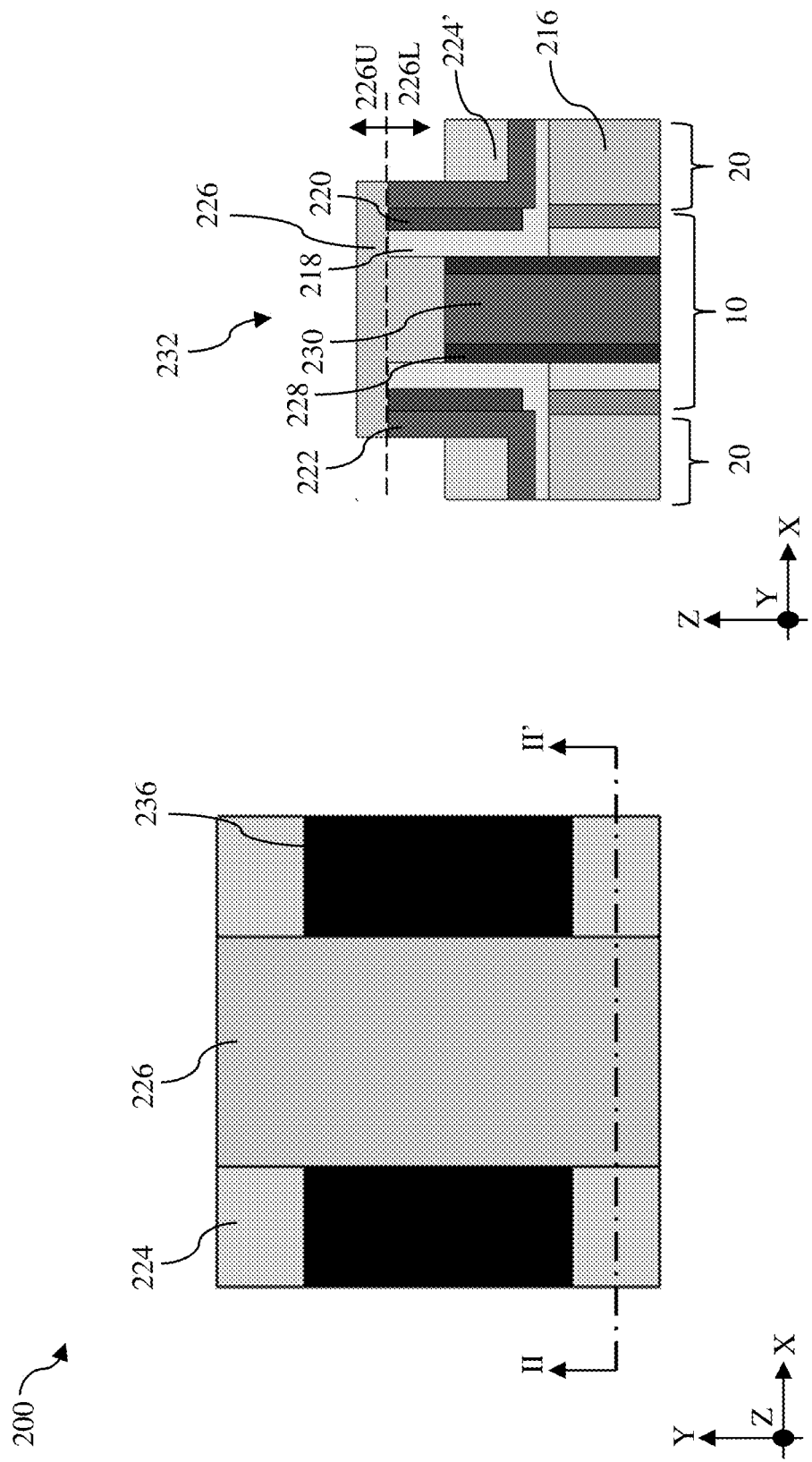

Referring to FIGS. 1, 9A and 9B, method 100 includes a block 120 where the first ILD layer 224 is recessed to expose a portion of the first ESL 222. In some embodiments, a selective etch process is performed at block 120 to partially recess the first ILD layer 224. In these embodiments, the first ILD layer 224 is selectively etched using the first SAC feature 226 and the source/drain contacts 236 as an etch mask to form the recessed first ILD layer 224'. In some implementations illustrated in FIGS. 9A and 9B, the first ILD layer 224 is recessed to expose a portion of the sidewalls of the first ESL 222. In some instances, because the first ESL 222 is formed of a material different from that of the first ILD layer 224, the first ILD layer 224 may be selectively recessed at block 120 without substantially damaging the first ESL 222. In some instances, the first ESL 22 may have a thickness between about 1 nm and about 10 nm.

Figure 10A:
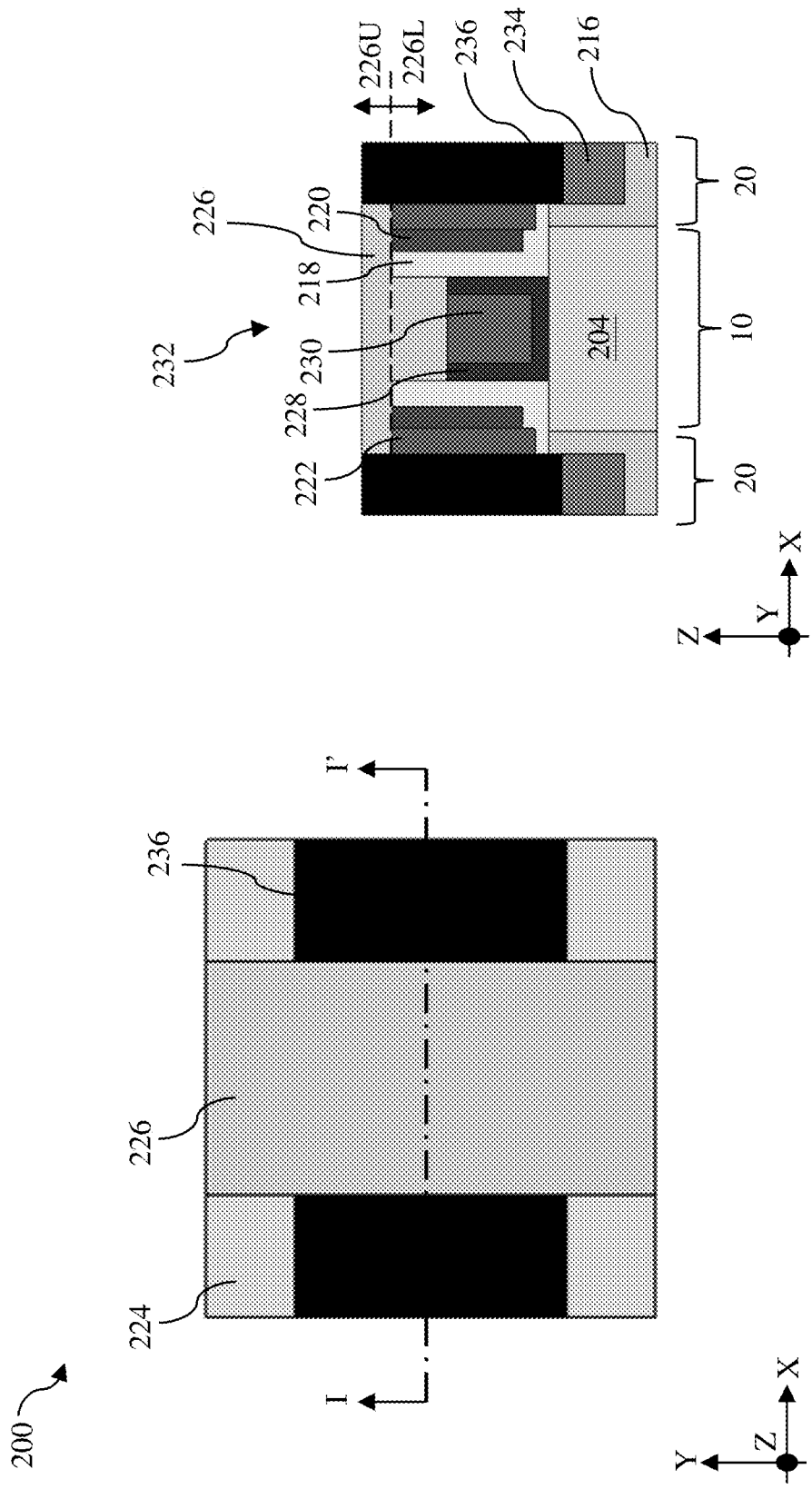
Figure 10B:
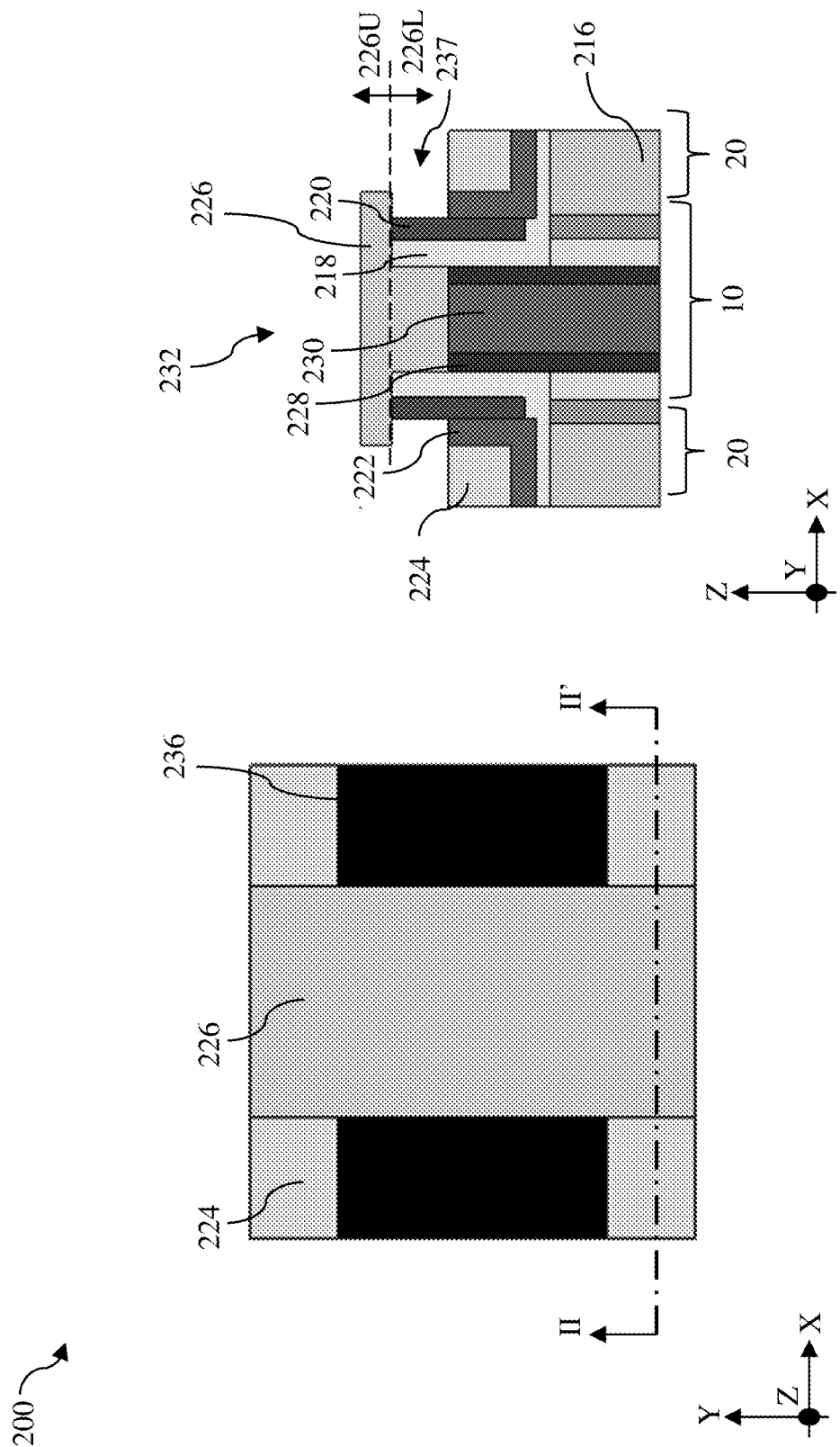

Referring to FIGS. 1, 10A and 10B, method 100 includes a block 122 where the exposed portion of the first ESL 222 is etched to form a lateral opening 237 to expose the second dummy spacer layer 220. In some embodiments, the etching chemistry of the etch process at block 122 is selected such that the exposed sidewalls of the first ESL 222 may be laterally etched without substantially damaging the first SAC feature 226 and the recessed first ILD layer 224. It is noted that the opening 237 does not extend vertically along the Z direction but rather, it extends horizontally along the X direction. As illustrated in FIG. 10B, the opening 237 is disposed under the upper portion 226U of the first SAC feature 226. The lateral opening 237 provides access to the second dummy spacer layer 220, allowing it to be selectively removed at block 124.

Figure 11A:
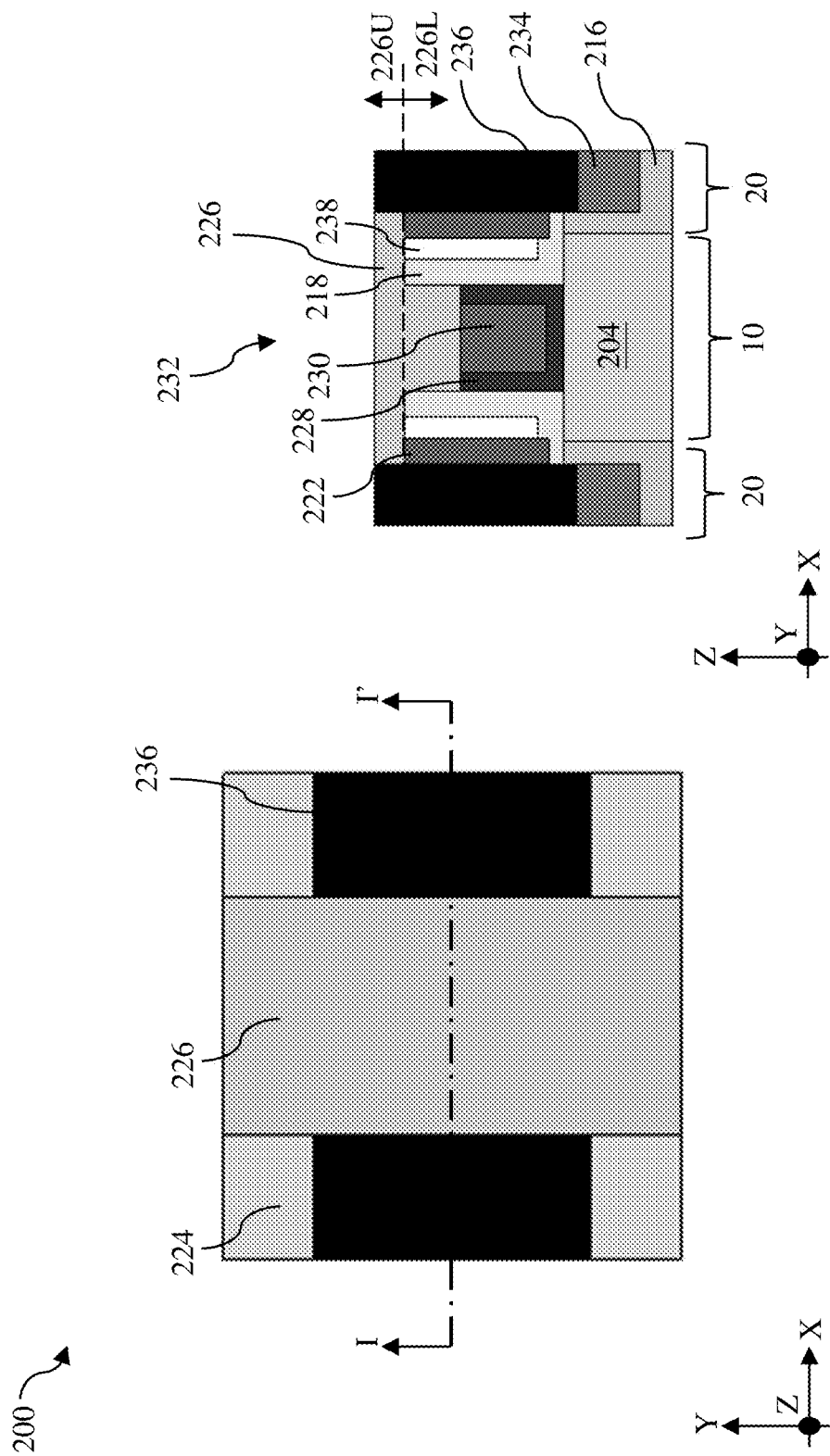
Figure 11B:
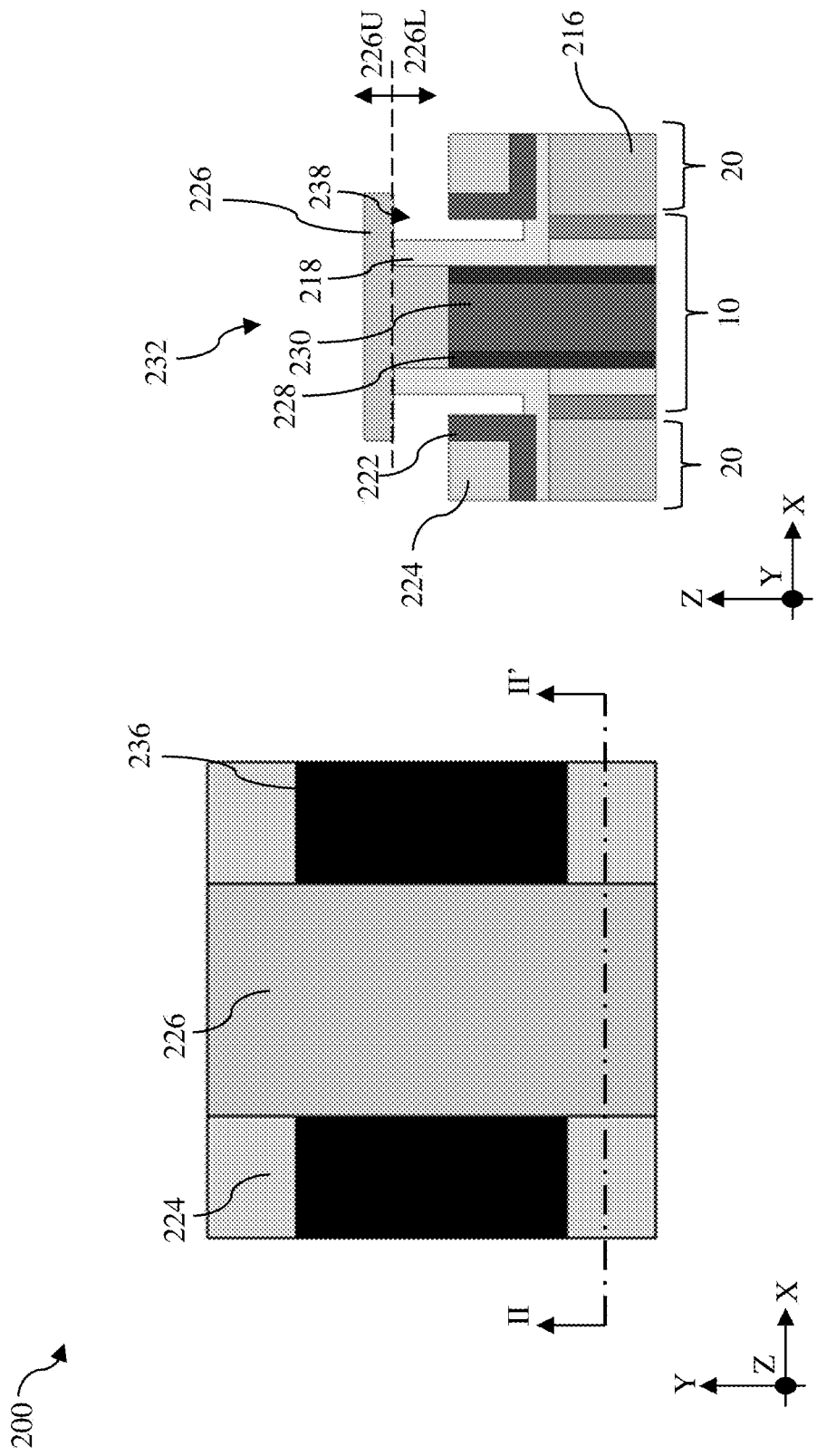

Referring to FIGS. 1, 11A and 11B, method 100 includes a block 124 where the second dummy spacer layer 220 is selectively removed to form an air gap 238. Via the opening 237 formed at block 122, the second dummy spacer layer 220 may be selectively removed to form the air gap 238. As described above, the materials of the first dummy spacer layer 218 and the second dummy spacer layer 220 are selected such that the second dummy spacer layer 220 may be selectively removed without substantially etching the first dummy spacer layer 218. According to the present disclosure, the materials for the first ESL 222 and the first SAC feature 226 are also selected to be different from that of the second dummy spacer layer 220 such that the air gap 238 may be formed by removing of the second dummy spacer layer 220. As shown in FIGS. 11A and 11B, the air gap 238 is defined by the upper portion 226U, the first ESL 222, and the first dummy spacer layer 218 and extends under the upper portion 226U along Y direction. It can be seen that each gate structure 232 is disposed between two air gaps 238 along the X direction and each of the air gap 238 extend along the Y direction between two openings 237. Each of the air gaps 238 is in fluid communication with the two opening 237.

Figure 12A:
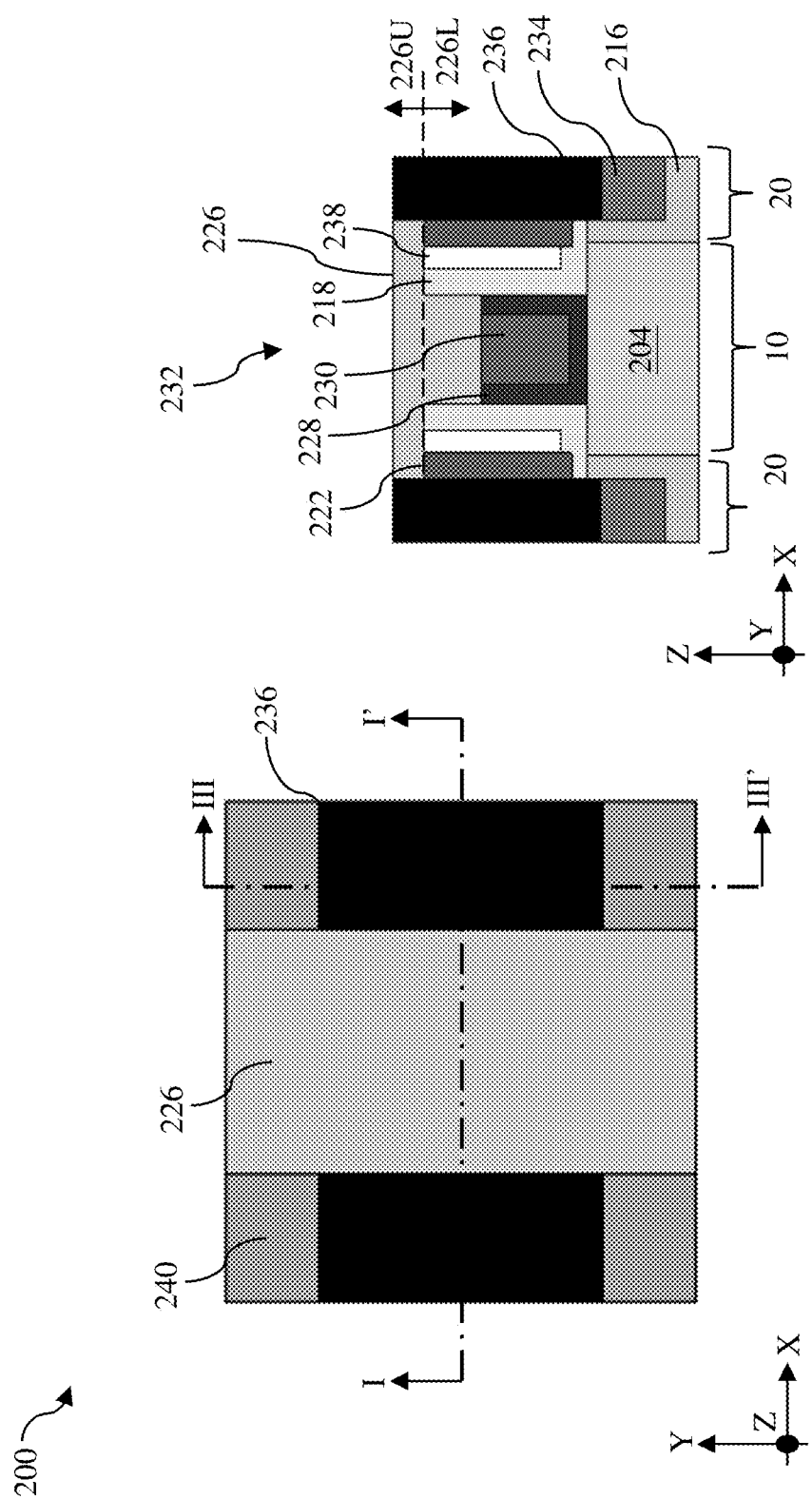
Figure 12B:
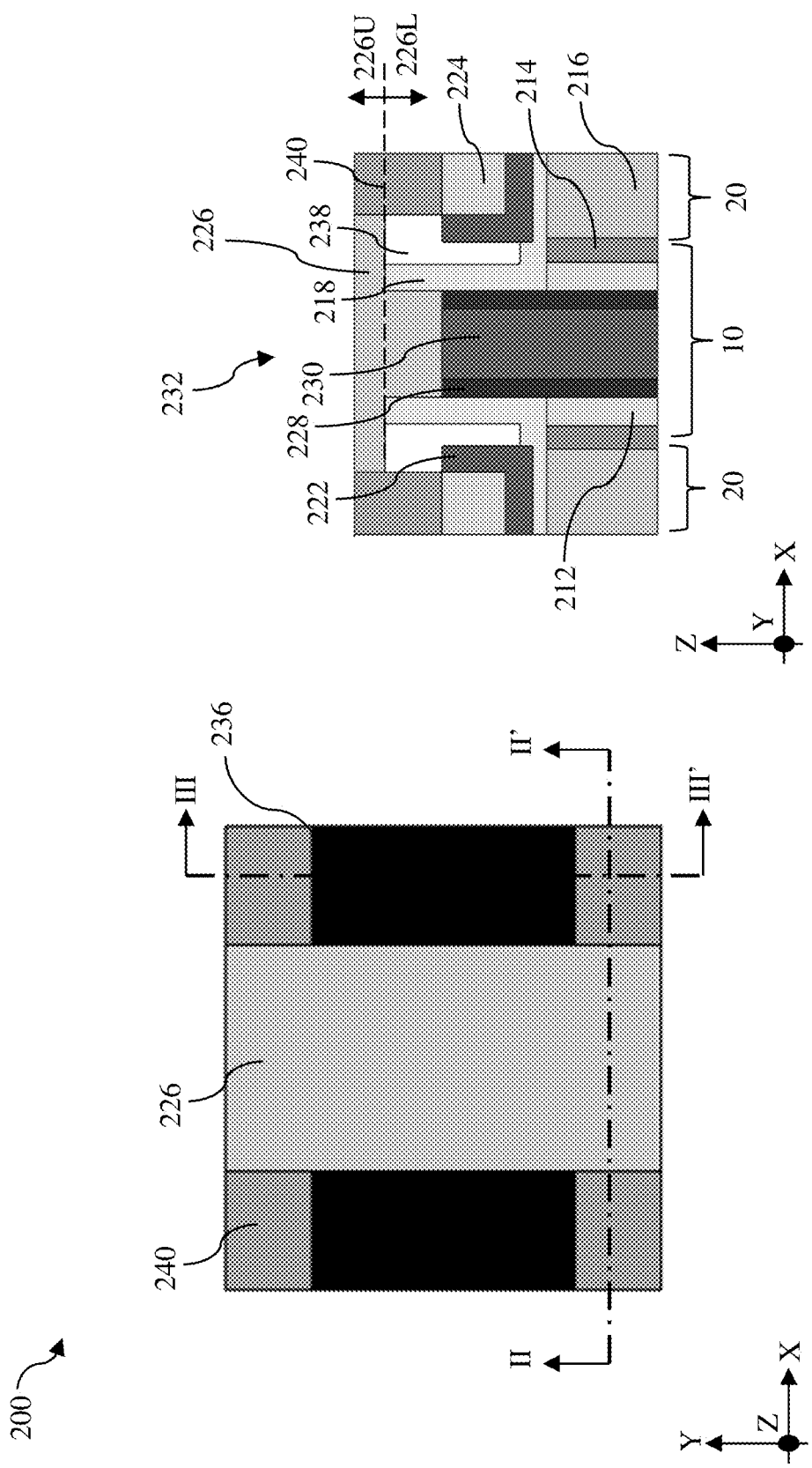

Referring to FIGS. 1, 12A, 12B, 13A, and 13B method 100 includes a block 126 where a seal layer 240 is deposited to seal the air gap 238. In some embodiments, the seal layer 240 may include silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. In some implementations, the seal layer 240 is deposited using CVD or a suitable deposition technique. It is noted that the material for the seal layer 240 is selected such that the first ILD layer 224 and the first SAC feature 226 may be selectively etched without substantially etching the seal layer 240. As will be described below, the seal layer 240 allows formation of slot source/drain contact vias. As illustrated in FIGS. 12A and 12B, the seal layer 240 seals off the air gap 238. Even though some of the seal layer 240 may intrude into the opening 237, at least a portion of the opening 237 may become a part of the air gap 238 after the seal layer 240 is deposited.

Reference is still made to FIG. 12A. The air gap 238 is disposed between the first ESL 222 and a vertical portion of the first dummy spacer layer 218 along the X direction and is disposed between the upper portion 226U of the first SAC feature 226 and a horizontal portion of the first dummy spacer layer 218. The vertical portion of the first dummy spacer layer 218 extends along sidewalls of the gate structure 232 and sidewalls of the lower portion 226L of the first SAC feature 226. The horizontal portion of the first dummy spacer layer 218 is disposed on the channel region 10 of the active region 204 and the source/drain feature 216. As shown in FIG. 12A, the air gap 238 is also disposed between the source/drain contact 236 and the gate structure 232 as well as between the source/drain contact 236 and the lower portion 226L of the first SAC feature 226. The air gap 238 extends past both ends of the source/drain contact 236 along the Y direction. Referring to FIG. 12B, along section the air gap 238 may include a portion of the opening 237 and may have an inverse L-shape when viewed along the Y direction. In addition, along section the air gap 238 is defined by the first dummy spacer layer 218, the first ESL 222, the seal layer 240, and the upper portion 226U.

Figure 13A:
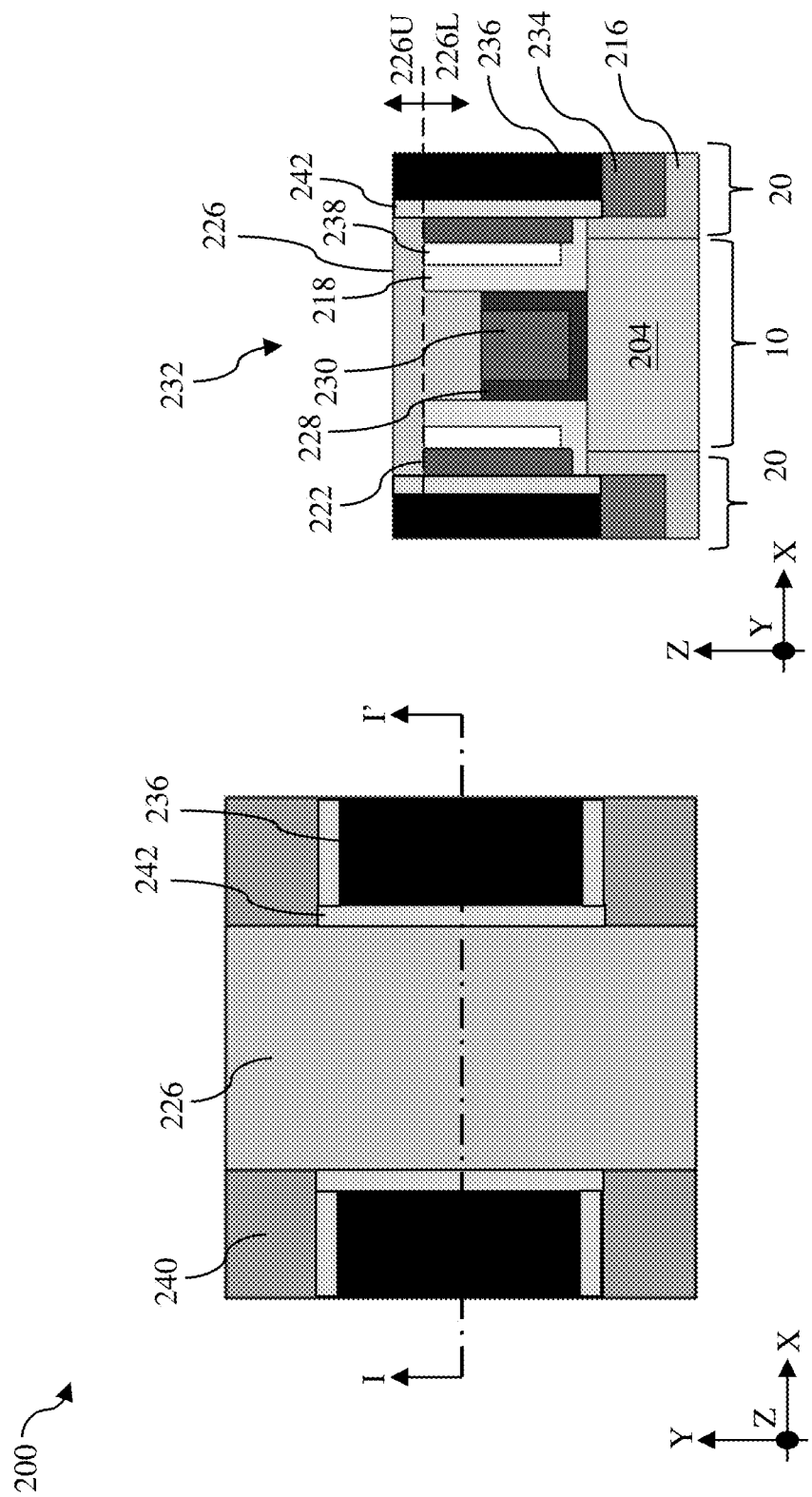
Figure 13B:
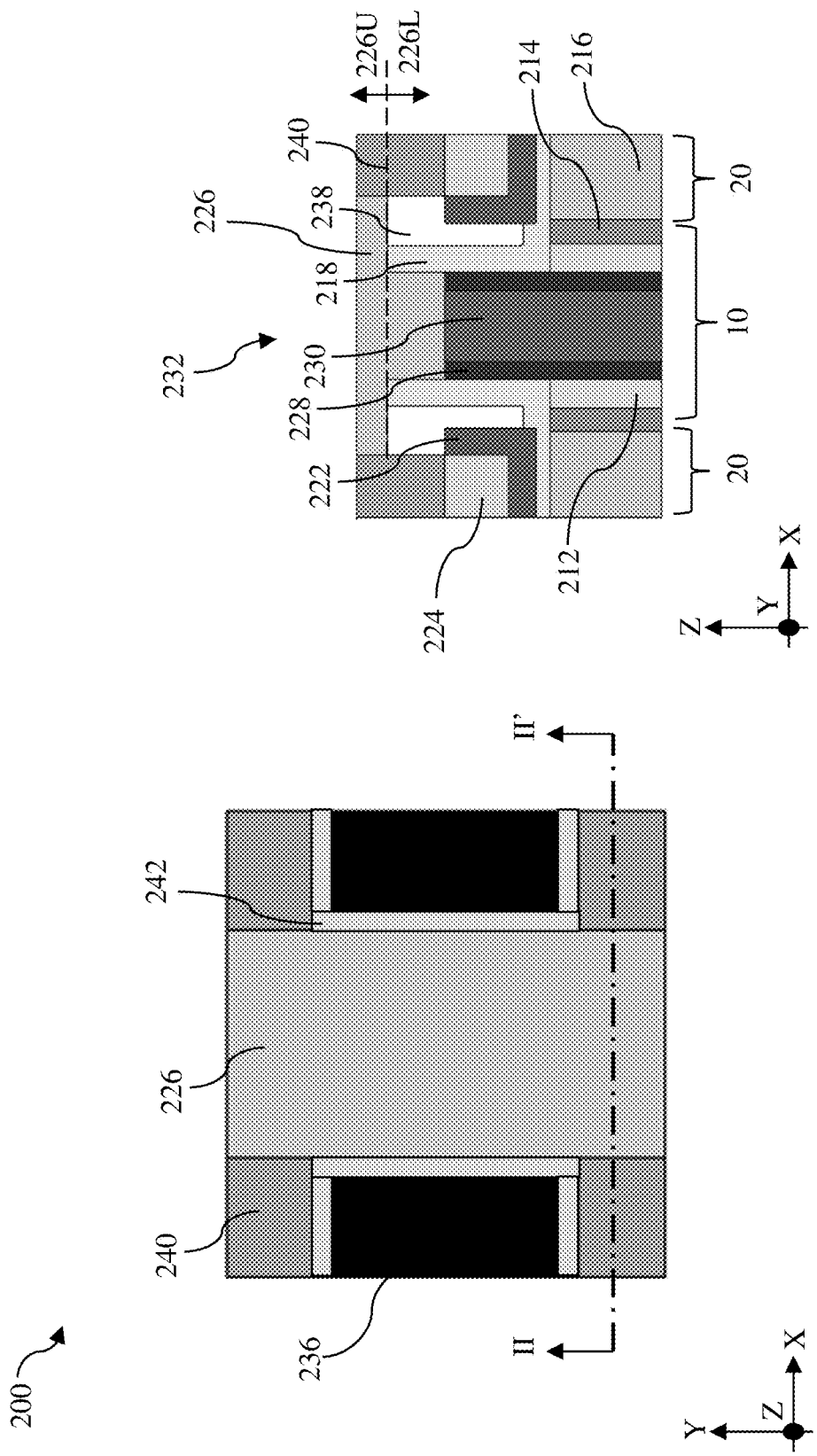

Reference is now made to FIGS. 13A and 13B. In some alternative embodiments, a liner 242 lines the sidewalls of the source/drain contact 236. As illustrated in FIG. 13A, the liner 242 may be disposed between the source/drain contact 236 and the seal layer 240, between the source/drain contact 236 and the upper portion 226U of the first SAC feature 226, between the source/drain contact 236 and the first ESL 222, and between the source/drain contact 236 and the horizontal portion of the first dummy spacer layer 218. Because the liner 242 is not shown along the cross-section liner 242 is not visible when viewed along the Y direction. In some implementations, the liner 242 may include silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. In some instances, the liner 242 may have a thickness between about 1 nm and about 10 nm. In some instances, the liner 242 may be omitted entirely. In instances where the liner 242 is present, the liner 242 may be formed to a thickness between about 1 nm and bout 10 nm.

Figure 14:
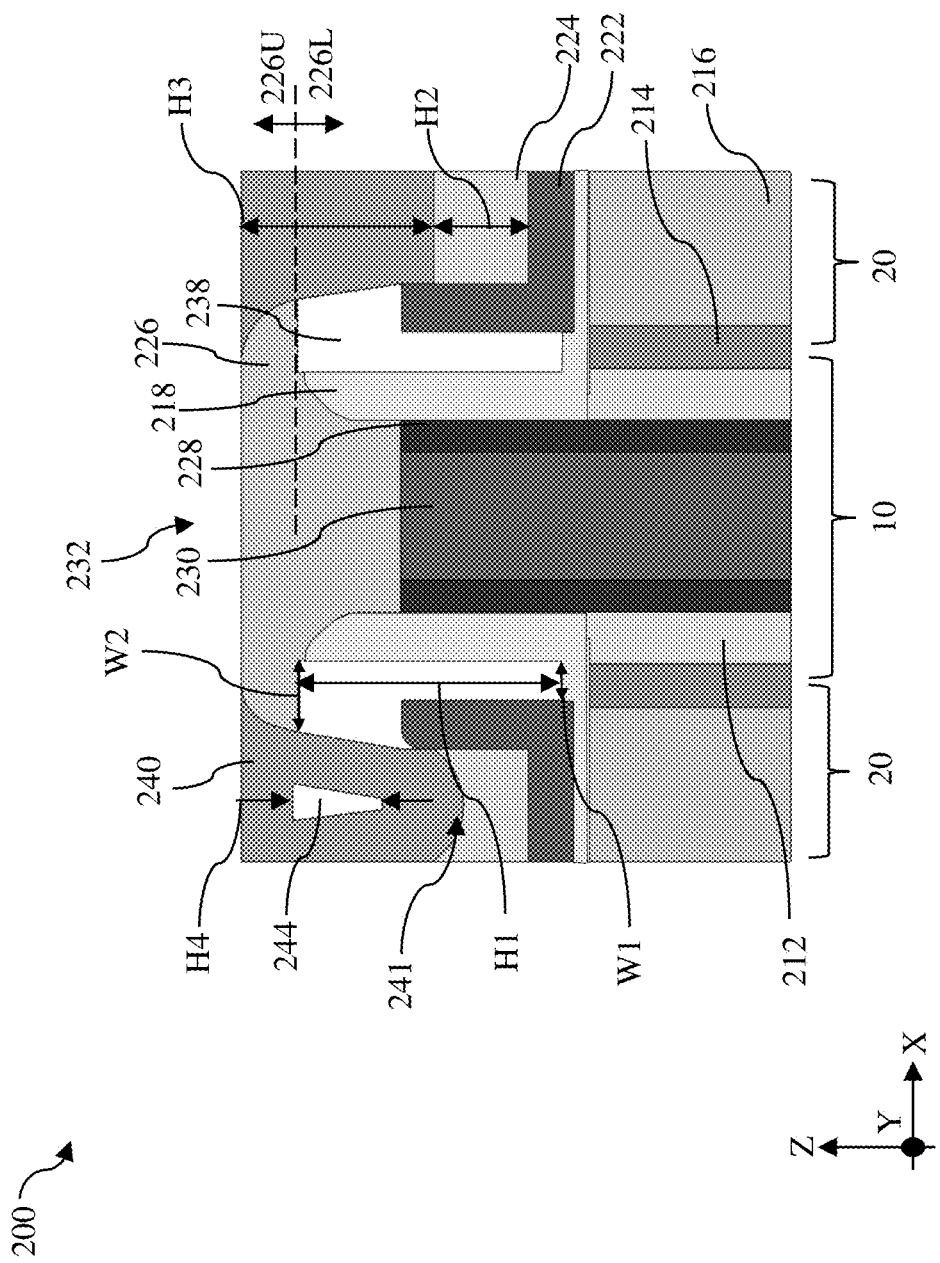

Process variations may bring about various features as a result of the formation of the air gap 238 according to method 100. Some of the examples are shown in FIG. 14. In some implementations, the formation of the SAC contact opening at block 116 may round top edges of the first dummy spacer layer 218. The recess of the first ILD layer 224 at block 120 may form rounded edges of the upper portion 226U of the first SAC feature 226. In addition, the recess of the first ILD layer 224 may form a dip 241 in the first ILD layer 224 such that a portion of the seal layer 240 may be disposed in the dip 241 of the first ILD layer 224. The dip 241 may have a depth between about 0.1 nm and about 20 nm. In embodiments where the deposition of the seal layer 240 is carried out using CVD, a void 244 may be formed in the seal layer 240. As illustrated in FIG. 14, the air gap 238 has a first width W1 between the first ESL 222 and the vertical portion of the first dummy spacer layer 218, a second width W2 between the seal layer 240 and the first dummy spacer layer 218, and a first height H1 between the upper portion 226U and the horizontal portion of the first dummy spacer layer 218. The portion of the air gap 238 that is disposed between the first ESL 222 and the vertical portion of the first dummy spacer layer 218 may be referred to as a bottom portion. The portion of the air gap 238 that is disposed between the seal layer 240 and the first dummy spacer layer 218 may be referred to as a top portion. In some instances, the first width W1 may be between about 1 nm and about 10 nm, the second width W2 may be between about 2 nm and about 15 nm, and the first height H1 may be between about 2 nm and about 80 nm. The first ILD layer 224 over the first ESL 222 has a second height H2. In some implementations, the second height H2 may be such that the first ILD layer 224 may be higher or lower than the adjacent first ESLs 222. In these implementations, the difference between first ILD layer 224 and the first ESL 222 may be about 10 nm. In some instances, the second height H2 may be between about 2 nm and about 40 nm. The seal layer 240 over the first ILD layer 224 has a third height H3. In some instances, the third height H3 may be between about 2 nm and about 30 nm. The void 244 in the seal layer 240 may have a fourth height H4 between about 0.1 nm and about 10 nm.

Figure 15:
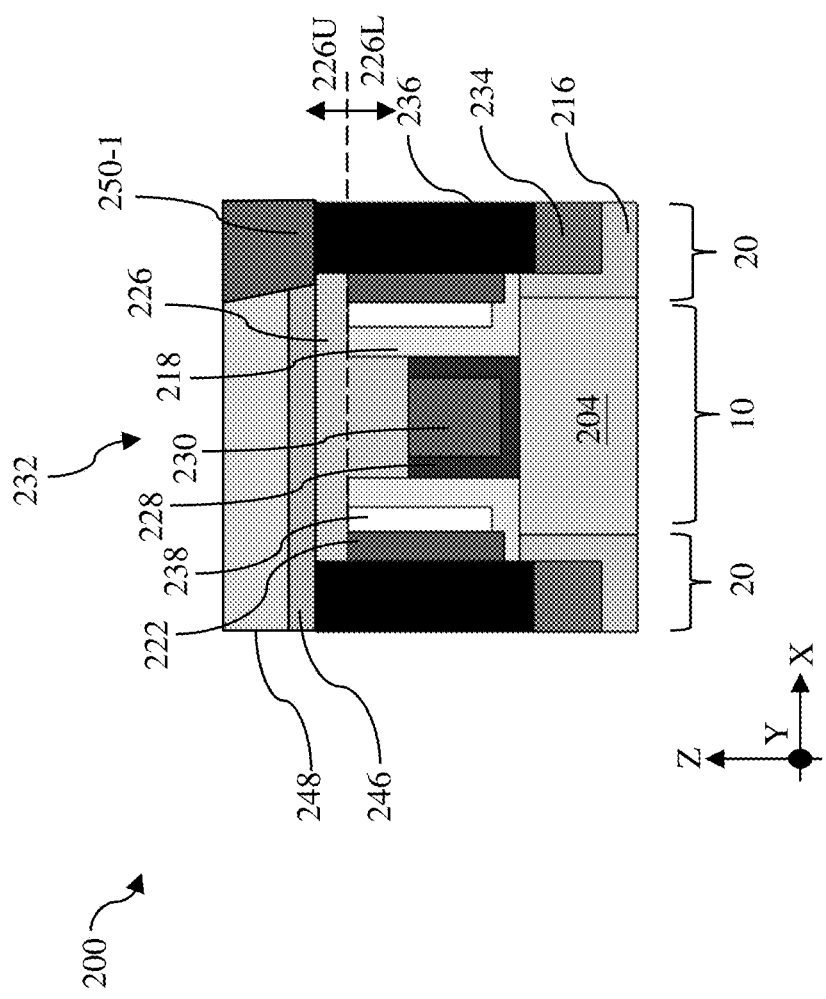
Figure 35:
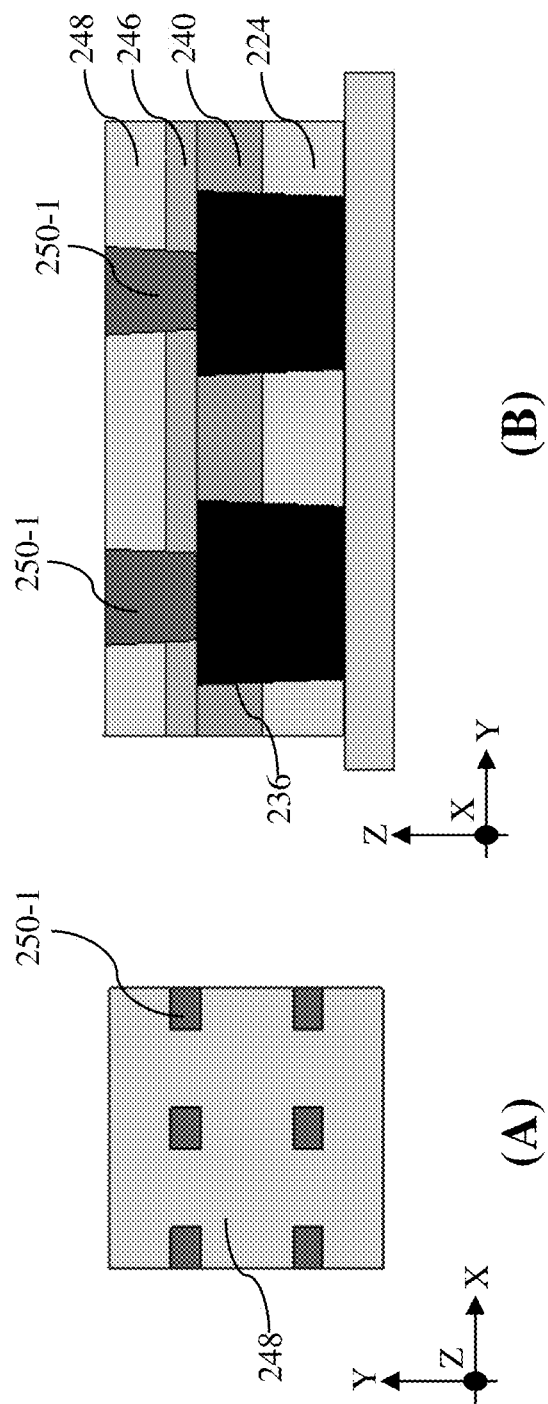
FIGS. 35-37 illustrates fragmentary cross-sectional views and top views of the semiconductor devices after formation of source/drain contact vias, according to aspects of the present disclosure.

Referring to FIGS. 1, 15, 16, and 17, method 100 includes a block 128 where further processes are performed. Such further processes may include deposition of a second ESL 246, deposition of a second ILD layer 248, and formation of a source/drain contact via 250 (including a first source/drain contact via 250-1 in FIG. 15, a second source/drain contact via 250-2 in FIG. 16, and a third source/drain contact via 250-3 in FIG. 17). Reference is first made to FIG. 15, where the first source/drain contact via 250-1 is formed. In some embodiments, after the seal layer 240 is formed to seal the air gap 238, the second ESL 246 is deposited over the workpiece 200 and the second ILD layer 248 is deposited over the second ESL 246. A source/drain contact via opening is then formed through the second ESL 246 and the second ILD layer 248 to expose the source/drain contact 236. Thereafter, a conductive material, such as copper (Cu), tungsten (W), aluminum (Al), cobalt (Co), ruthenium (Ru), nickel (Ni), is then deposited in the source/drain contact via opening to form the first source/drain contact via 250-1, which is in contact with the source/drain contact 236. The second ESL 246 and the second ILD layer 248 may be substantially similar to the first ESL 222 and the first ILD layer 224, respectively, in terms of compositions and formation processes. FIG. 35A and FIG. 35B illustrate, respectively, a top view and a cross-sectional view of a workpiece 200 where the first source/drain contact vias 250-1 are formed. It can be seen that adjacent source/drain contacts 236 are separated along the Y direction by not only the first ILD layer 224 but also the seal layer 240. A plurality of the first source/drain contact vias 250-1 are then formed through the second ILD layer 248 and the second ESL 246 to be in contact with the source/drain contact. As illustrated in FIG. 35B, in some implementations, no further SAC layer is formed over the source/drain contacts 236.

Figure 16:
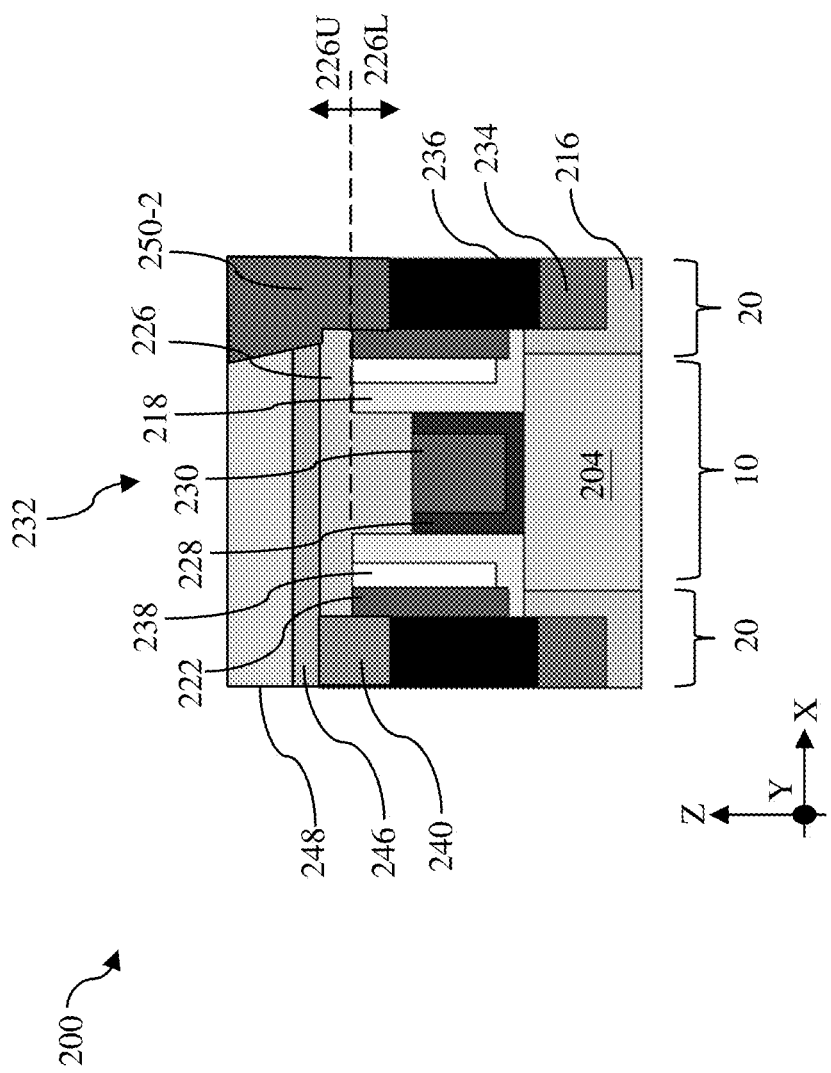
Figure 36:
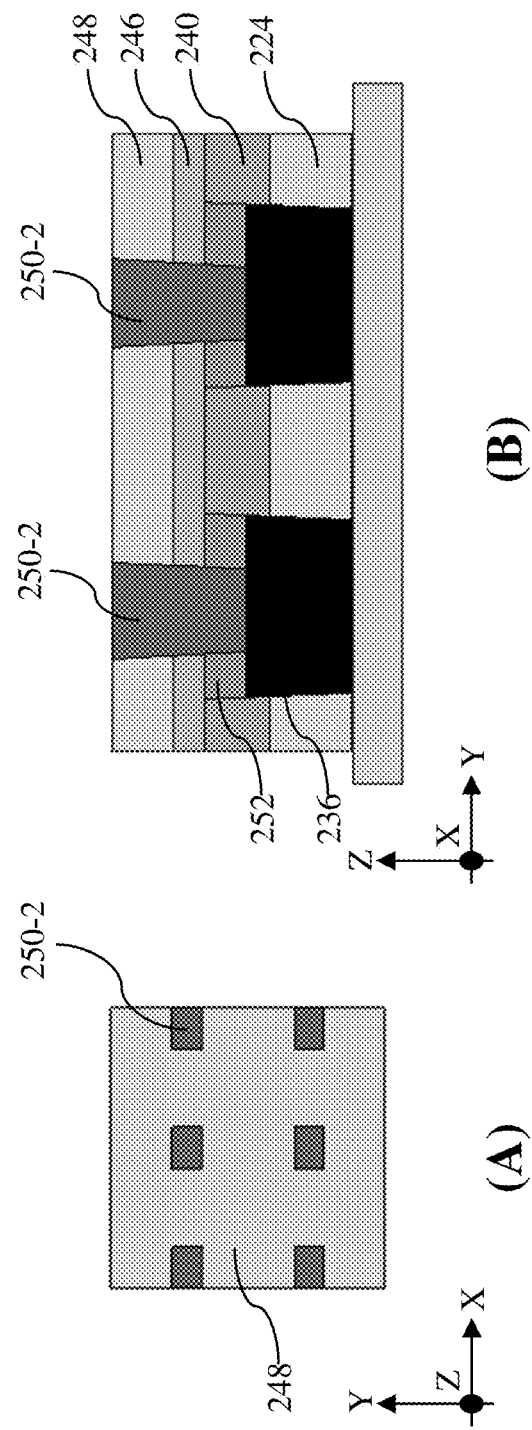

The second source/drain contact via 250-2 is illustrated in FIG. 16. Different from the first source/drain contact via 250-1 shown in FIG. 15, a top portion of the source/drain contact 236 is recessed to form a SAC recess and a second SAC feature (not shown in FIG. 16 but shown in FIG. 36B). FIG. 36A and FIG. 36B illustrate, respectively, a top view and a cross-sectional view of a workpiece 200 where the second source/drain contact vias 250-2 are formed. As shown in FIG. 36B, a second SAC feature 252 is formed in the SAC recess formed into the source/drain contact 236 such that the second SAC feature 252 is disposed between seal layer 240. The second source/drain contact via 250-2 therefore extends through the second ILD layer 248, the second ESL 246, and the second SAC feature 252 to be in contact with the source/drain contact 236.

Figure 17:
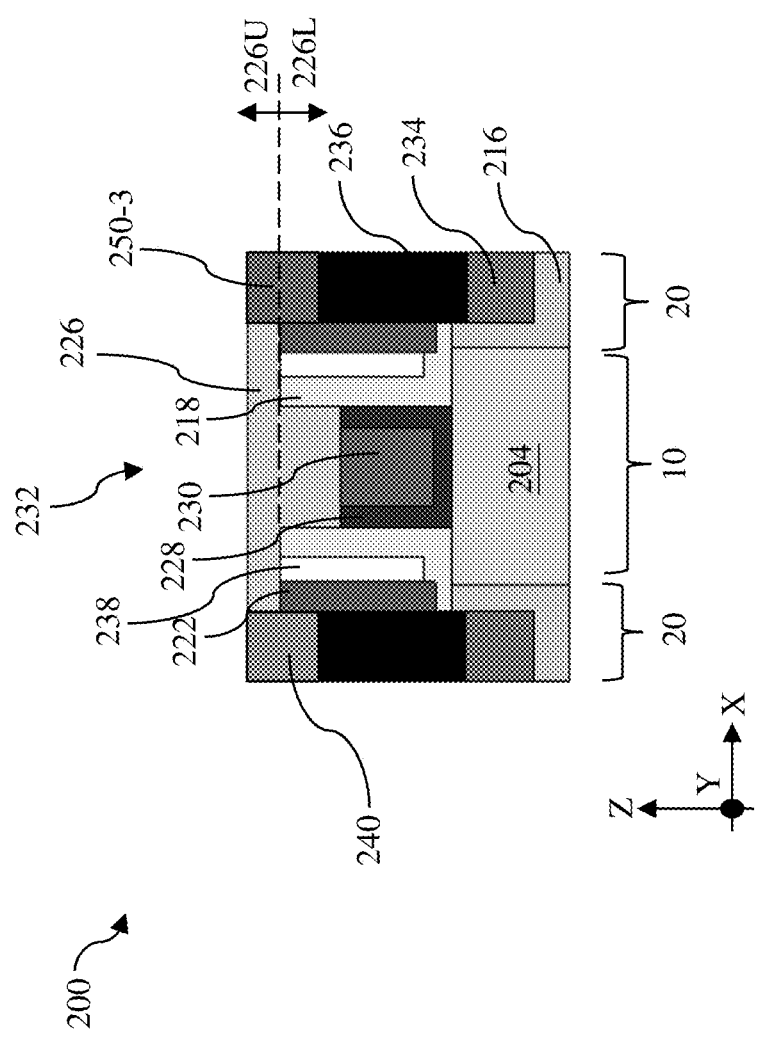
Figure 18:
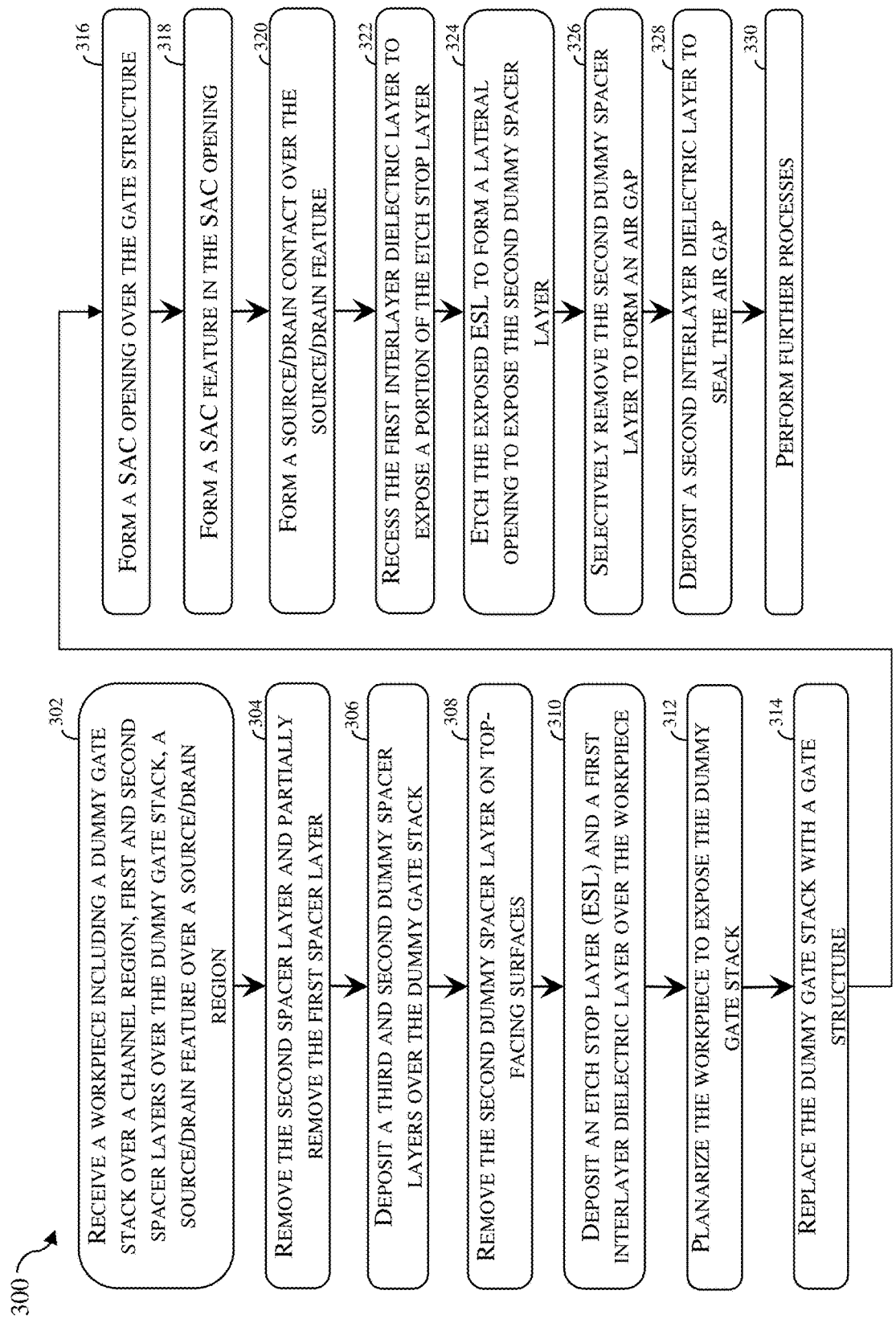
FIG. 18 illustrates a flowchart of another example method for fabricating a semiconductor device, according to various embodiments of the present disclosure.
Figure 37:
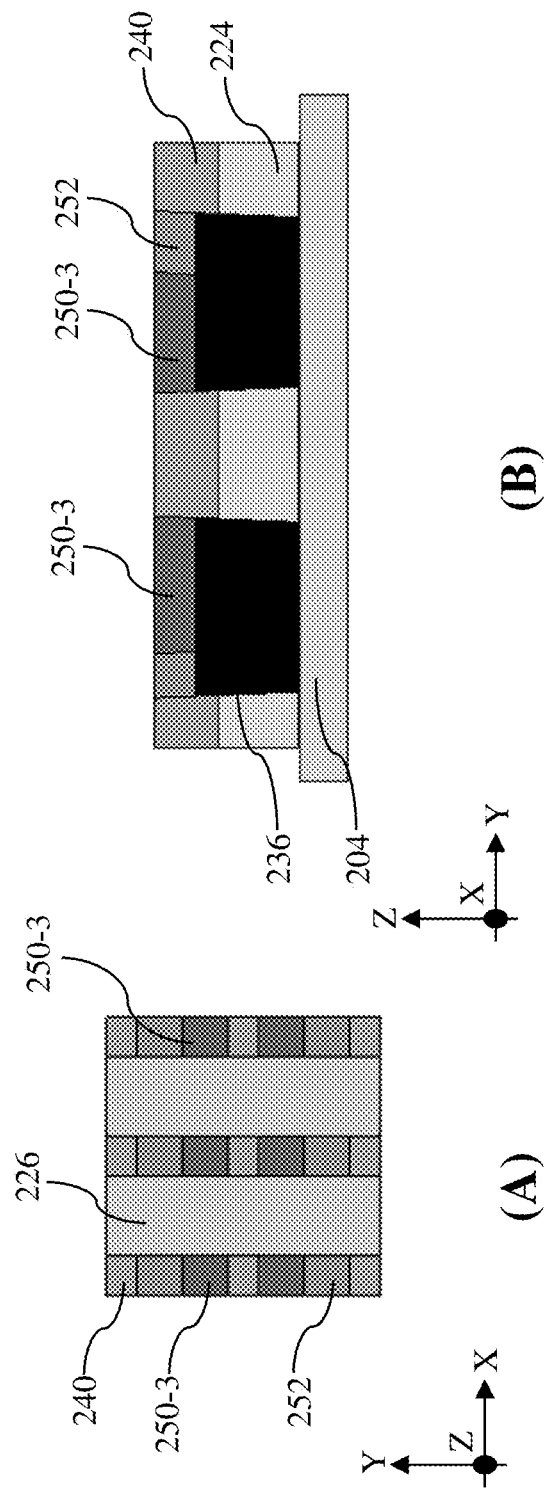

Reference is now made to FIG. 17, wherein the third source/drain contact via 250-3 is formed. In some implementations, the third source/drain contact via 250-3 is a slot via where more than one contact vias to different source/drain contacts 236 are formed simultaneously. Similar to formation of the second source/drain contact via 250-2, the second ESL 246 is deposited over the workpiece 200 and the second ILD layer 248 is deposited over the second ESL 246. A slot opening is then formed by an etch process through the second ESL 246 and the second ILD layer 248 to expose at least two neighboring source/drain contacts 236. A conductive material, such as copper (Cu), tungsten (W), aluminum (Al), cobalt (Co), ruthenium (Ru), nickel (Ni), is then deposited in the slot opening. A planarization process, such as a CMP process, is then used to remove the second ESL 246 and the second ILD layer 248. In some implementations, the material of the seal layer 240 may be selected such that the etch process for forming the slot opening is selective to the second ESL 246 and the second ILD layer 248. Without the seal layer 240, the etch process may indifferently etch the first ILD layer 224 and the second ILD layer 248 and a slot via like the third source/drain contact via 250-3 would not be possible. With the seal layer 240 of the present disclosure, the etch process does not substantially etch the seal layer 240, allowing it to separate adjacent third source/drain contact vias 250-3, as illustrated in FIG. 37B. Due to formation of the slot opening that spans over two adjacent source/drain contacts 236, adjacent third source/drain contact vias 250-3 are only divided by the seal layer 240, as the second SAC feature 252 between adjacent third source/drain contact vias 250-3 is substantially removed during the slot opening formation process. Formation of slot vias is one of the measures to form device features or openings beyond the lithography resolution limit. The etching selectivity provided by the seal layer 240 of the present disclosure help to align the source/drain contact via openings to respective source/drain contacts 236. In this sense, a process to form slot vias may be regarded as a self-aligned via formation process.

FIGS. 15, 16 and 17 illustrate some benefits of the present disclosure. Formation of the first source/drain contact via 250-1, the second source/drain contact via 250-2, and the third source/drain contact via 250-3 require formation of source/drain contact via openings over the source/drain contact 236. As it is difficult to completely avoid misalignment of masks, the source/drain contact via openings may not always be squarely on the source/drain contact 236. By lateral removal of the second dummy spacer layer 220, the upper portion 226U of the first SAC feature 226 may be preserved to offer etch selectivity needed to prevent the source/drain contact via opening from breaching into the air gap 238 or expanding too far toward the gate structure 230. As a result, methods of the present disclosure may improve process windows, reduce parasitic capacitance, and increase yield.

Reference is now turned to method 300 in FIG. 18. Method 300 is described below in conjunction with FIGS. 19A, 19B, 20A, 20B, 21A, 22B, 23A, 23B, 24A, 24B, 25A, 26A, 26B, 27A, 27B, 28A, 28B, 29A, 29B, 30A, 30B, and 31-34, each of which illustrate a fragmentary cross-sectional view or a top view of the workpiece 200 during various operations of method 300.

Figure 19A:
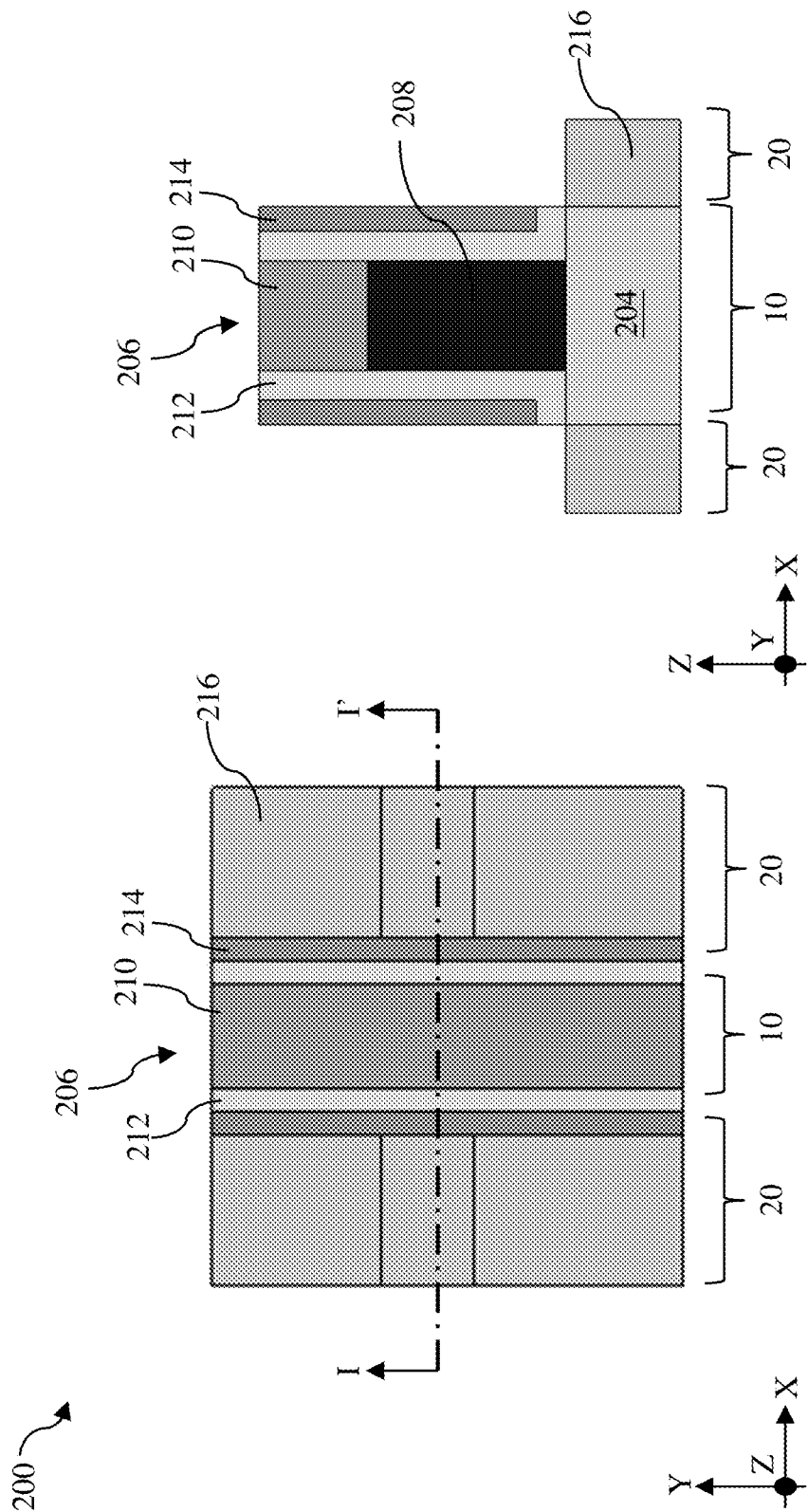
FIGS. 19A, 19B, 20A, 20B, 21A, 21B, 22A, 22B, 23A, 23B, 24A, 24B, 25A, 25B, 26A, 26B, 27A, 27B, 28A, 28B, 29A, 29B, 30A, 30B, and 31-34 are fragmentary cross-sectional views and top views of the workpiece in FIG. 18, according to various embodiments of the present disclosure.
Figure 19B:
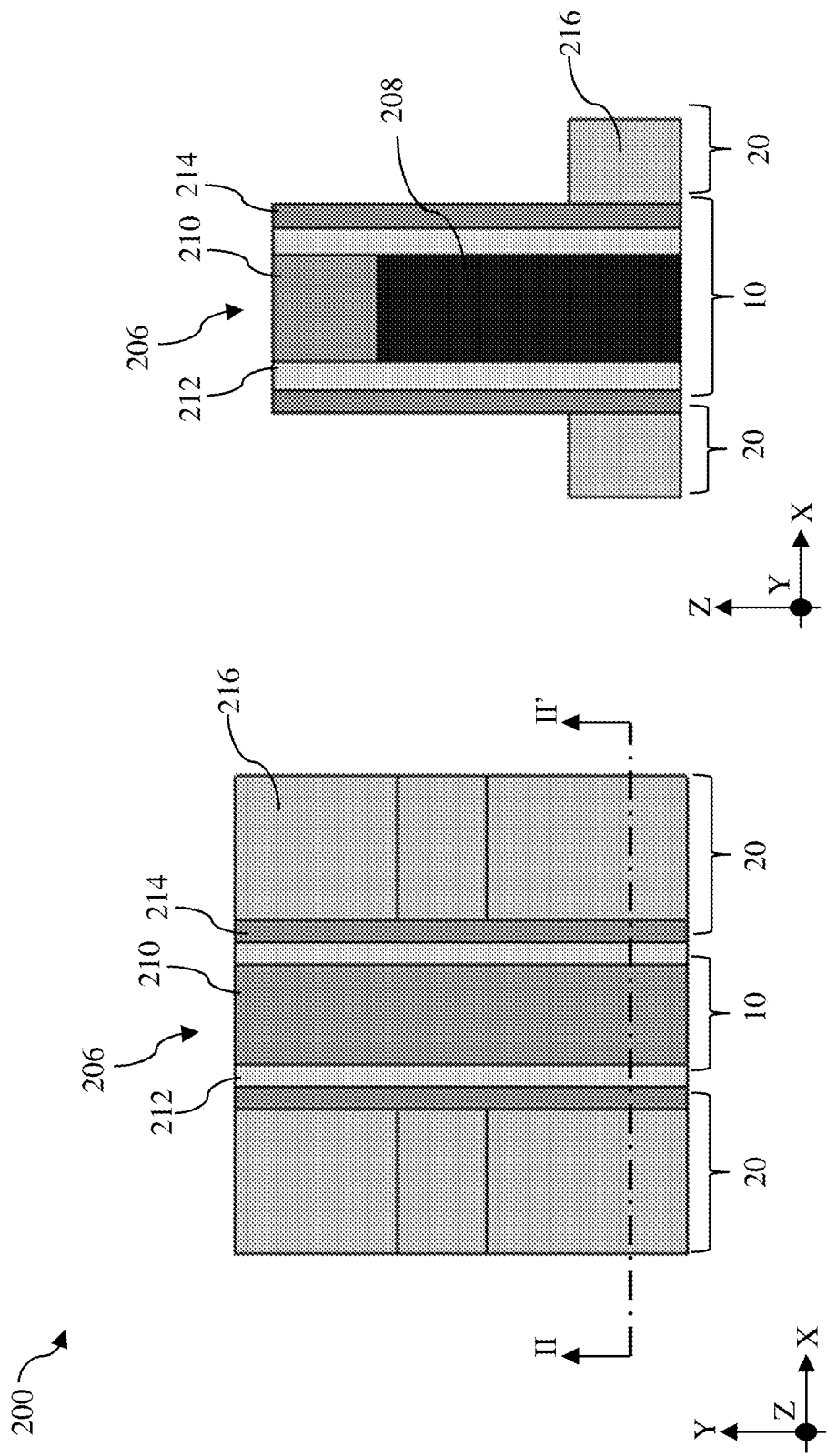

Referring to FIGS. 18, 19A and 19B, method 300 includes a block 302 where a workpiece 200 is received. The workpiece 200 includes a dummy gate stack 206 over a channel region 10 of an active region 204, a first spacer layer 212 over the dummy gate stack 206, a second spacer layer 214 over the first spacer layer 212, a source/drain feature 216 over a source/drain region 20 of the active region 204. The workpiece 200 includes active region 204 (or a fin-shaped region 204) connected to and arising from the substrate 202. The active region 204 may include one or more channel regions of a multi-gate device. For example, the active region 204 may be a fin structure of an FinFET or may a stack of alternating epitaxial layers of a gate-all-around (GAA) transistor. The active region 204 includes a channel region 10 and a source/drain region 20 adjacent the channel region 10. The channel region 10 may be disposed between two source/drain regions 20. The workpiece 200 includes a dummy gate stack 206 that includes a dummy electrode 208 and a hard mask 210. A first gate spacer 212 is disposed over sidewalls of the dummy gate stack 206 and a second gate spacer 214 is disposed on sidewalls of the first gate spacer 212. Although not shown in FIG. 19A, the dummy gate stack 206 may also include a dummy gate dielectric layer disposed between the dummy electrode 208 and the channel region 10 of the active region 204.

Throughout the present disclosure, similar reference numerals are used to denote similar features. As most features on the workpiece 200 are substantially described above in conjunction with method 100, detailed descriptions thereof may be omitted for brevity.

Figure 20A:
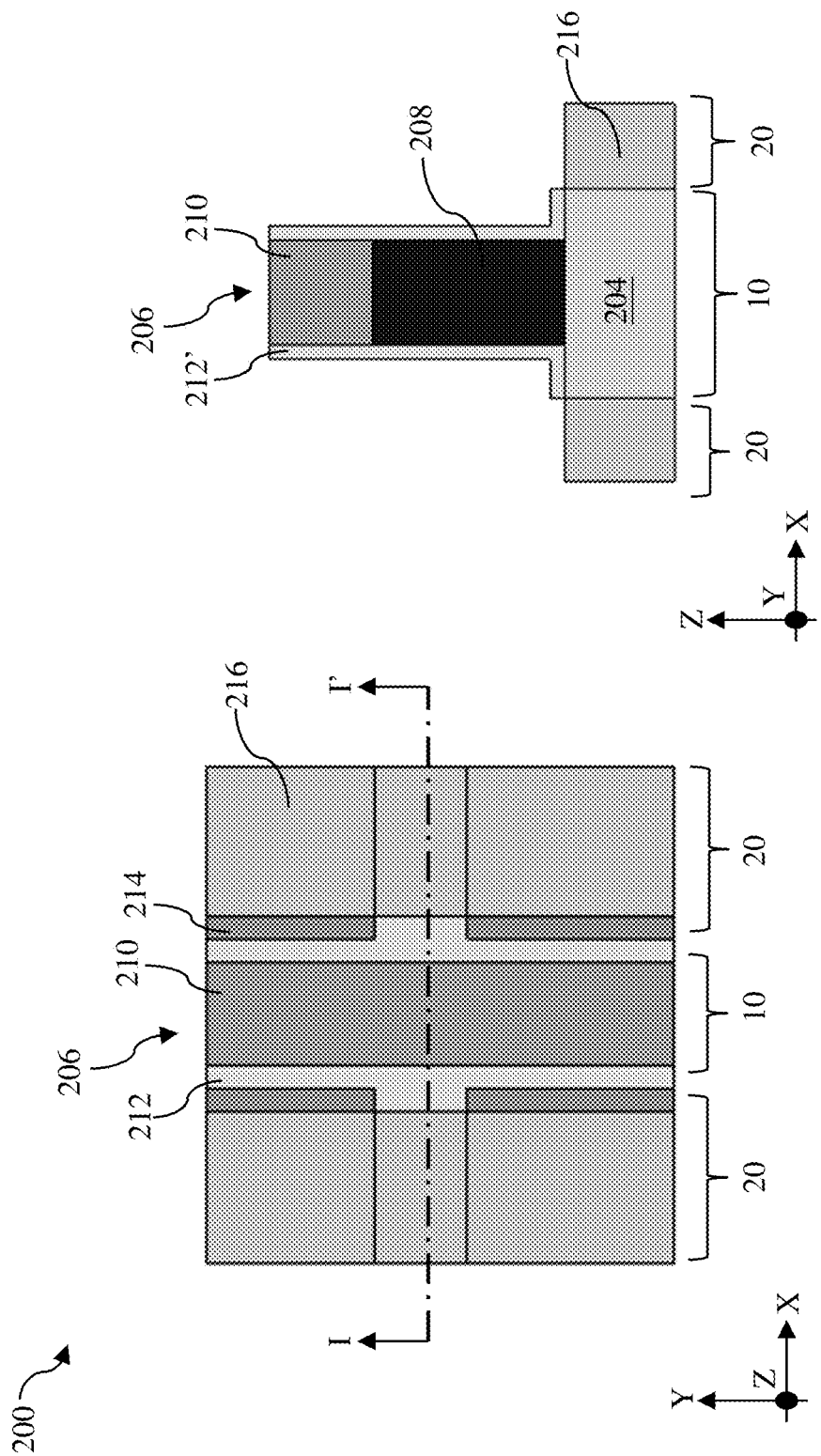
Figure 20B:
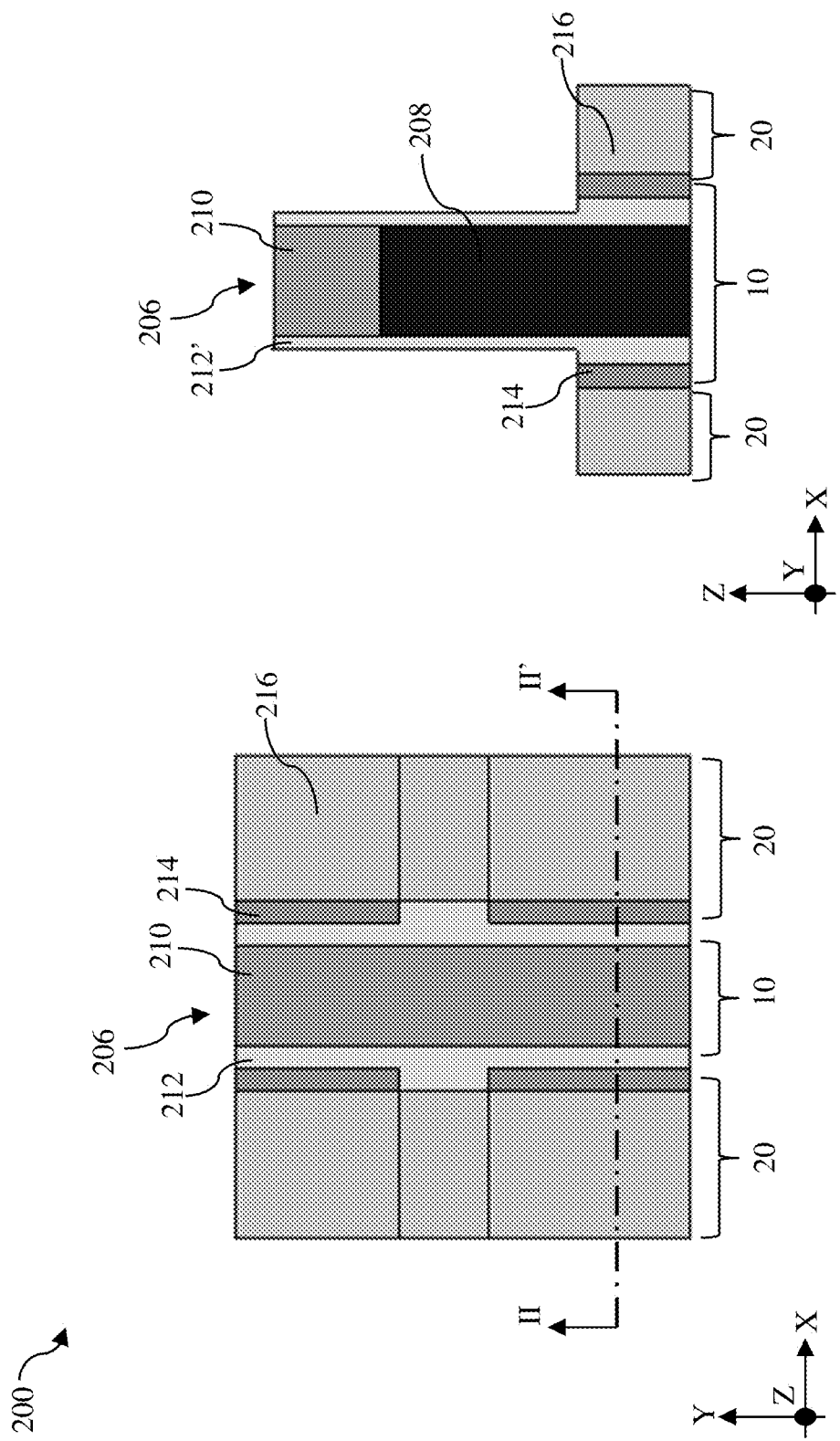

Referring to FIGS. 18, 20A and 20B, method 300 includes a block 304 where a portion of the first spacer layer 212 and the second spacer layer 214 on sidewalls of the dummy gate stack 206 are removed. At block 304, in order to make room for a third dummy spacer layer 219 and a second dummy spacer layer 220 (to be formed at block 306 below), a portion of the first spacer layer 212 and the second spacer layer 214 above the source/drain feature 216 are substantially removed, leaving behind a thinned first spacer layer 212'. A suitable dry etch process or a suitable wet etch process that etches the second spacer layer 214 faster than the first spacer layer 212 may be performed at block 304 to completely remove the second spacer layer 214 and partially remove the first spacer layer 212. The thinned first spacer layer 212' may have a thickness between about 1 nm and about 10 nm.

Figure 21A:
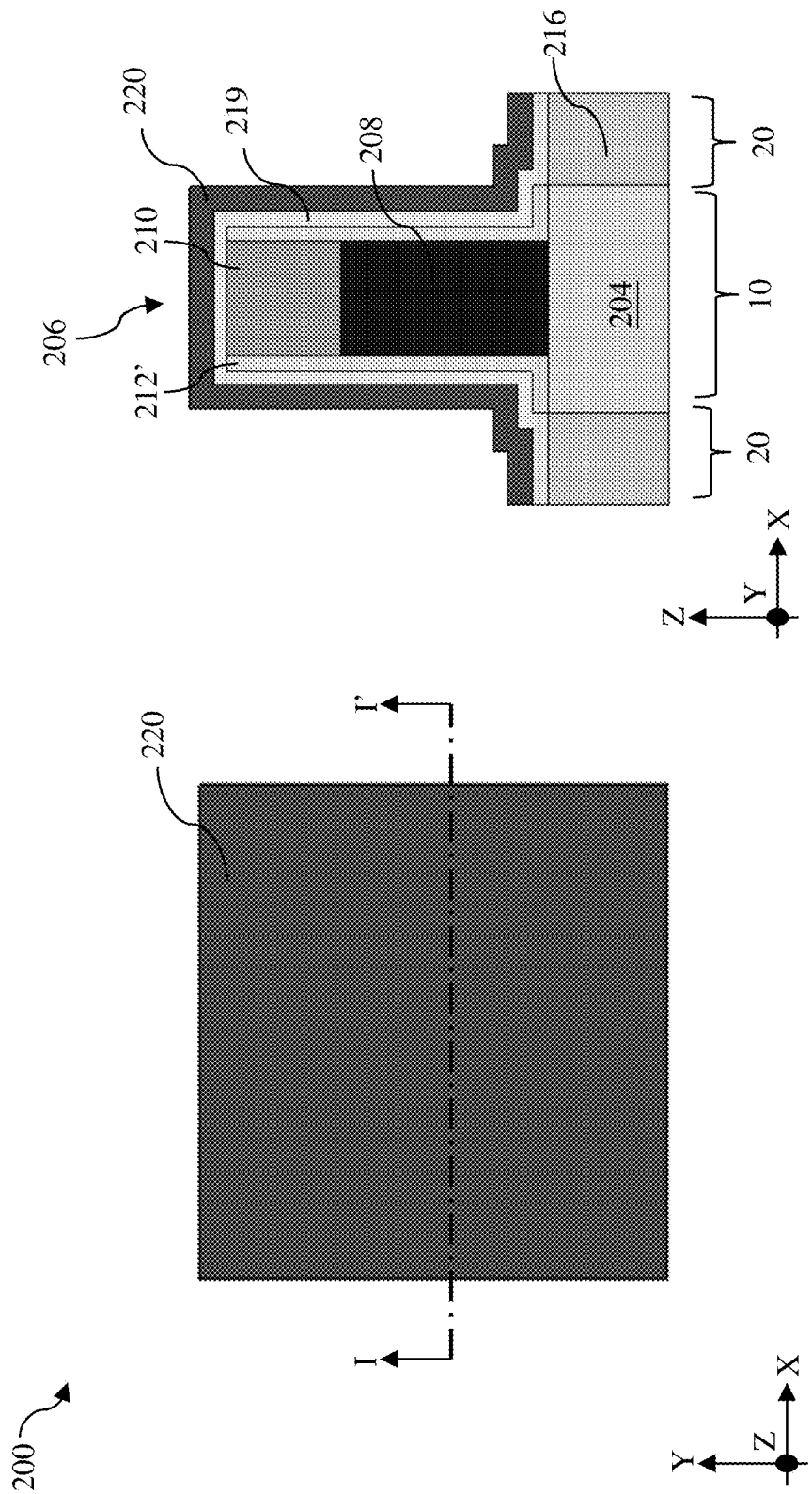
Figure 21B:
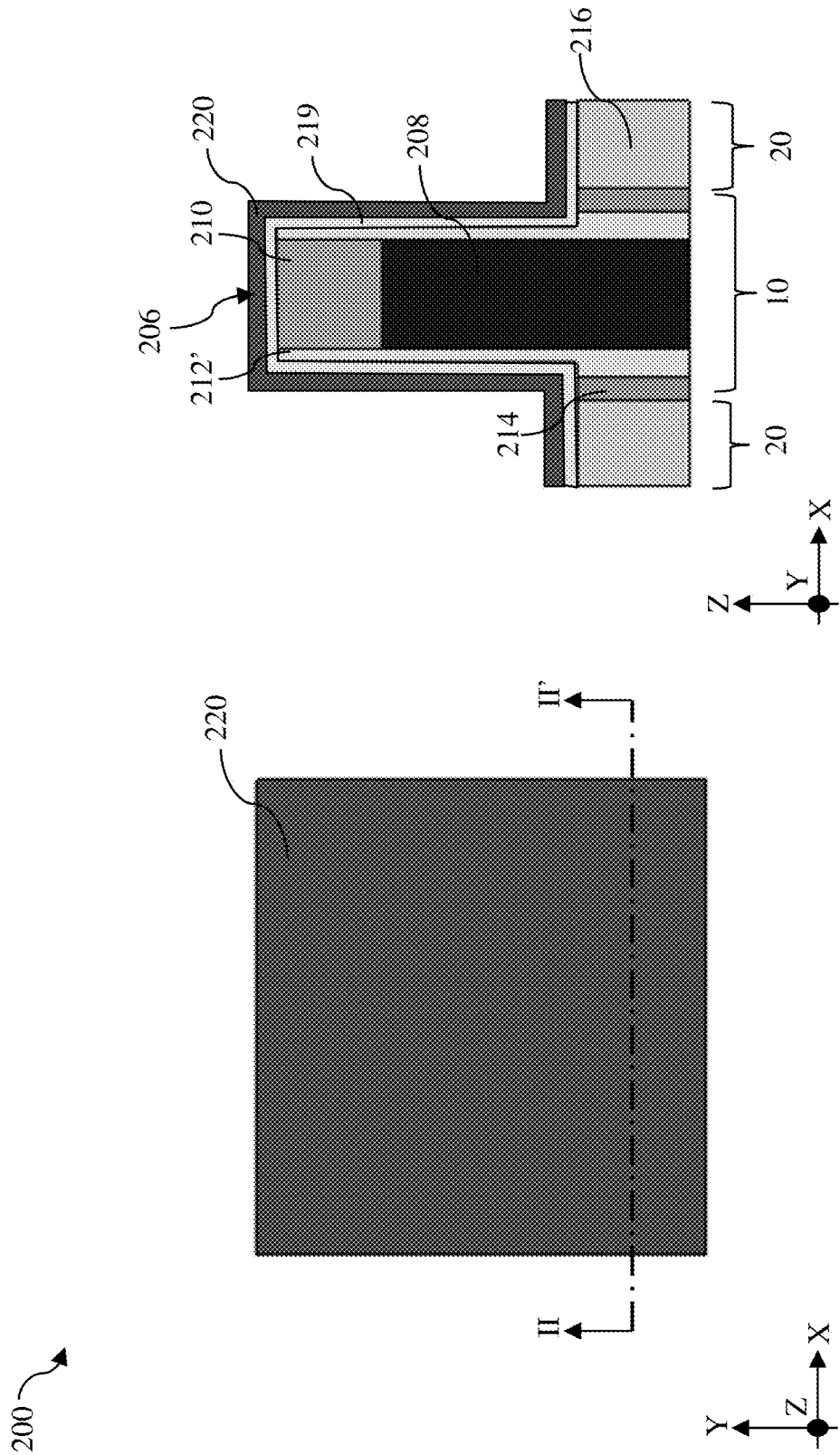

Referring to FIGS. 18, 21A and 21B, method 300 includes a block 306 where a third dummy spacer layer 219 and a second dummy spacer layer 220 are deposited over the dummy gate stack 206. In some embodiments, each of the third dummy spacer layer 219 and the second dummy spacer layer 220 may be formed of silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. As illustrated in FIG. 21A, along the active region 204, the third dummy spacer layer 219 may be disposed on the source/drain feature 216, the thinned first spacer layer 212', and a top surface of the hard mask 210. As illustrated in FIG. 21B, outside the active region 204, the third dummy spacer layer 219 may be disposed on the source/drain feature 216, top surfaces of the second spacer layer 214, the thinned first spacer layer 212', and a top surface of the hard mask 210. As shown in FIGS. 21A and 21B, the second dummy spacer layer 220 is disposed on the third dummy spacer layer 219. It is noted while the third dummy spacer layer 219 and the second dummy spacer layer 220 are formed of a material selected from a similar collection of dielectric materials set forth above, the third dummy spacer layer 219 and the second dummy spacer layer 220 have different compositions. The different compositions of the third dummy spacer layer 219 and the second dummy spacer layer 220 allow the second dummy spacer layer 220 to be selectively etched without substantially etching the third dummy spacer layer 219. From a top view shown in FIGS. 21A and 21B, the second dummy spacer layer 220 is blanketly deposited over the workpiece 200. In some embodiments, the third dummy spacer layer 219 may be formed to a thickness between about 0.5 nm and about 5 nm and the second dummy spacer layer 220 may be formed to a thickness between about 1 nm and about 10 nm. Because both the thinned first spacer layer 212' and the third dummy spacer layer 219 function to protect the dummy gate stack 206, the presence of the thinned first spacer layer 212' allows the third dummy spacer layer 219 to have a reduced thickness. On the contrary, the first dummy spacer layer 218, which is formed according to method 100, is required to single-handedly protect the dummy gate stack 206. Therefore, the thickness of the third dummy spacer layer 219 is smaller than that of the first dummy spacer layer 218.

Figure 22A:
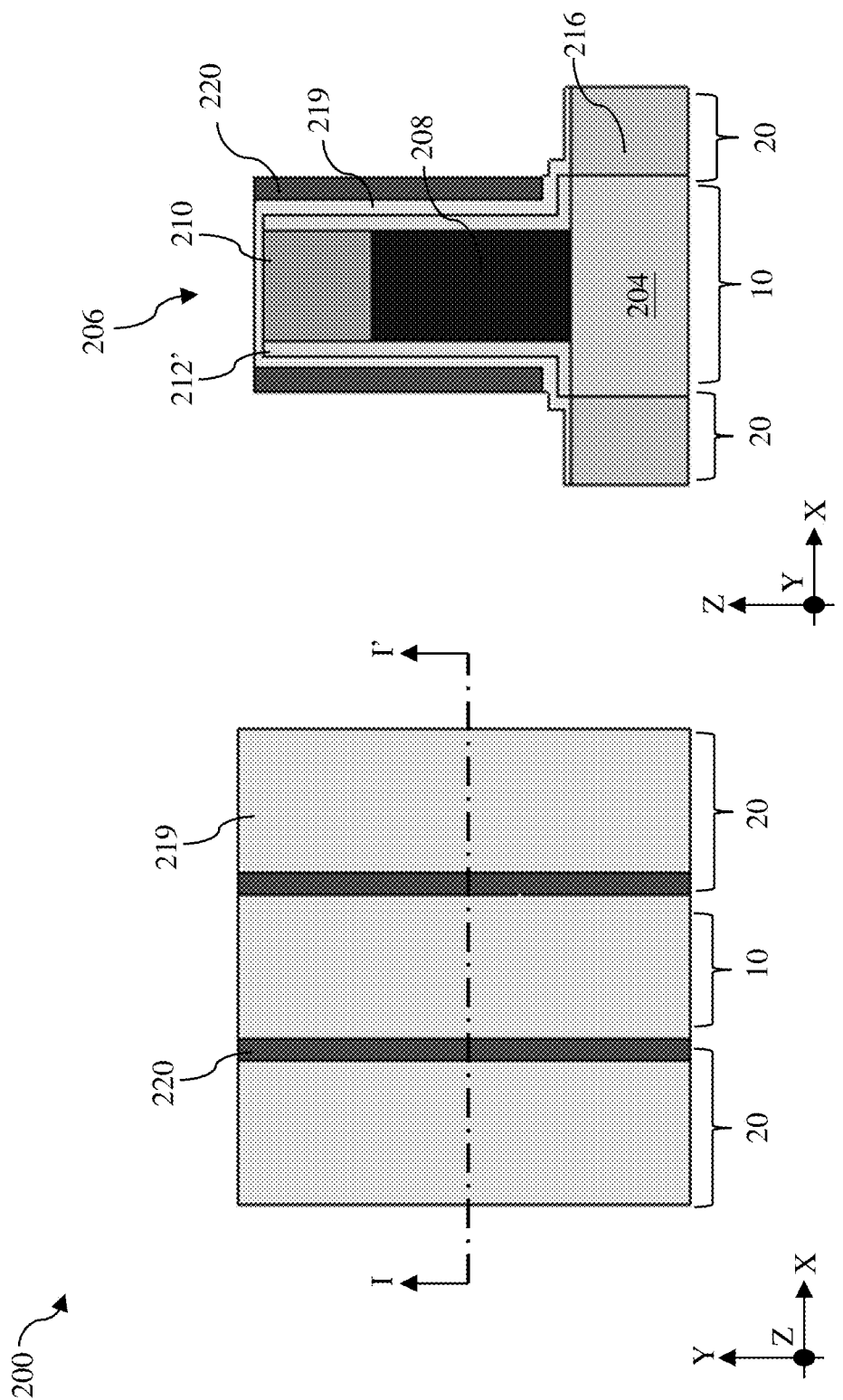
Figure 22B:
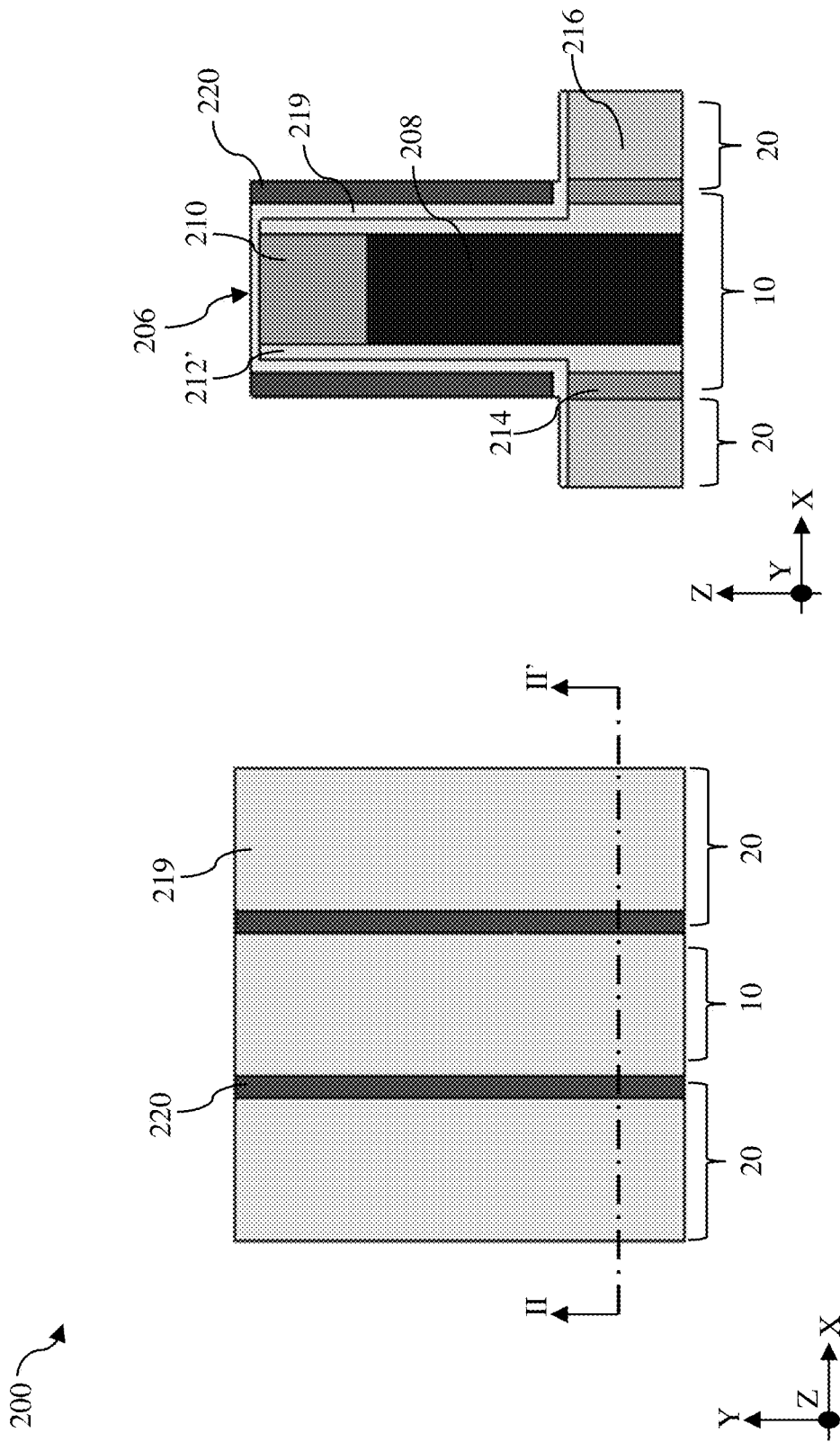

Referring to FIGS. 18, 22A and 22B, method 300 includes a block 308 where a top facing portion of the second dummy spacer layer 220 is removed. At block 308, a selective and anisotropic etch process may be performed to remove the second dummy spacer layer 220 from top-facing surfaces of the workpiece 200. As shown in FIGS. 22A and 22B, the selective etching at block 308 may leave behind a vertical portion of the second dummy spacer layer 220 disposed along sidewalls of third dummy spacer layer 219 disposed along sidewalls of the thinned first spacer layer 212'. The etching process at block 308 may also reduce the thickness of the third dummy spacer layer 219 on top facing surfaces of the workpiece 200.

Figure 23A:
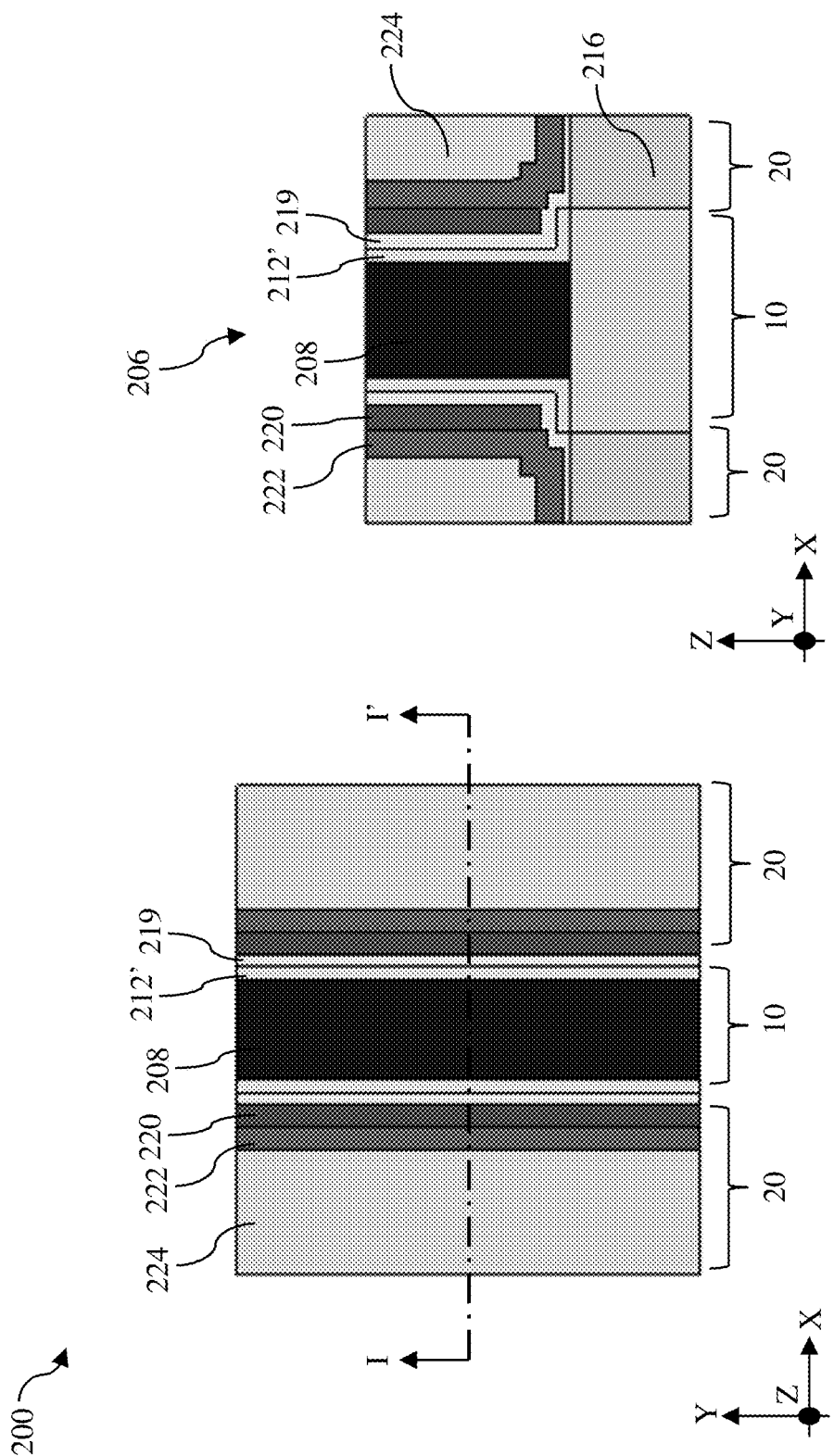
Figure 23B:
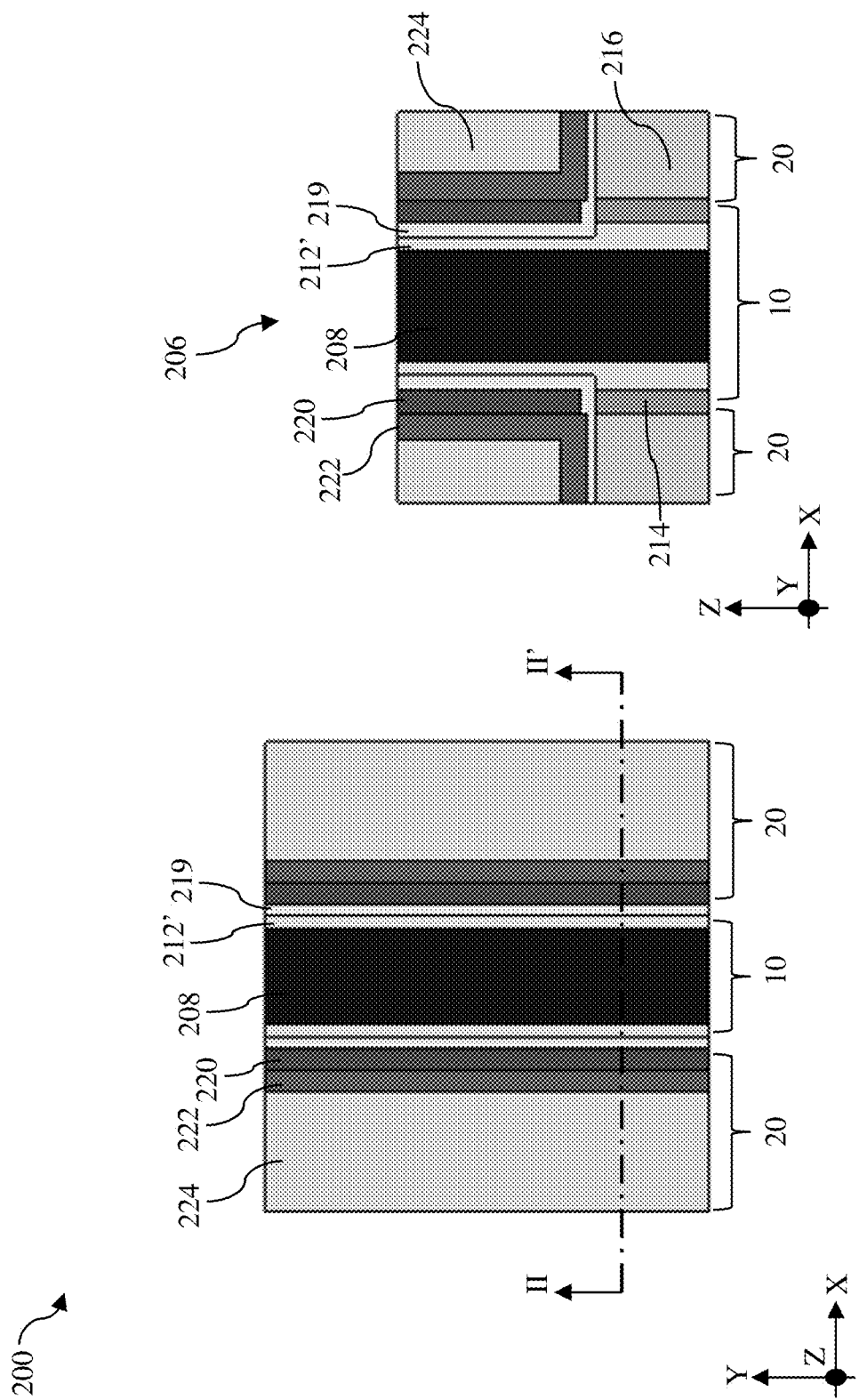

Referring to FIGS. 18, 23A and 23B, method 300 includes a block 310 where a first etch stop layer (ESL) 222 and a first interlayer dielectric (ILD) layer 224 are deposited over the workpiece 200. The first ESL 222 and the first ILD layer 224 are blanketly deposited over the workpiece 200, including over the third dummy spacer layer 219 over the source/drain features 216 and over the sidewalls of the left-over second dummy spacer layer 220. In some embodiments, the first ESL 222 may include semiconductor nitride, such as silicon nitride. In some implementations, the first ILD layer 224 may include a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the first ILD layer 224 includes an oxide-containing dielectric material. The first ILD layer 224 may include a multi-layer structure or a single-layer structure and may be formed by a deposition process such as, for example, CVD, flowable CVD (FCVD), spin-on-glass (SOG), other suitable methods, or combinations thereof.

Referring to FIGS. 18, 23A and 23B, method 300 includes a block 312 where the workpiece 200 is planarized to expose the dummy gate stack 206. At block 312, a planarization process, such as a chemical mechanical polishing (CMP), may be performed to the workpiece 200 to remove excess first ESL 222, excess first ILD layer 224, and the hard mask 210 over the dummy gate electrode 208. As illustrated in FIGS. 23A and 23B, upon conclusion of the operations at block 310, the workpiece 200 includes a planar top surface where top surfaces of the first ILD layer 224, the first ESL 222, the third dummy spacer layer 219, the second dummy spacer layer 220, the thinned first spacer layer 212', and the dummy electrode layer 208 are coplanar.

Figure 24A:
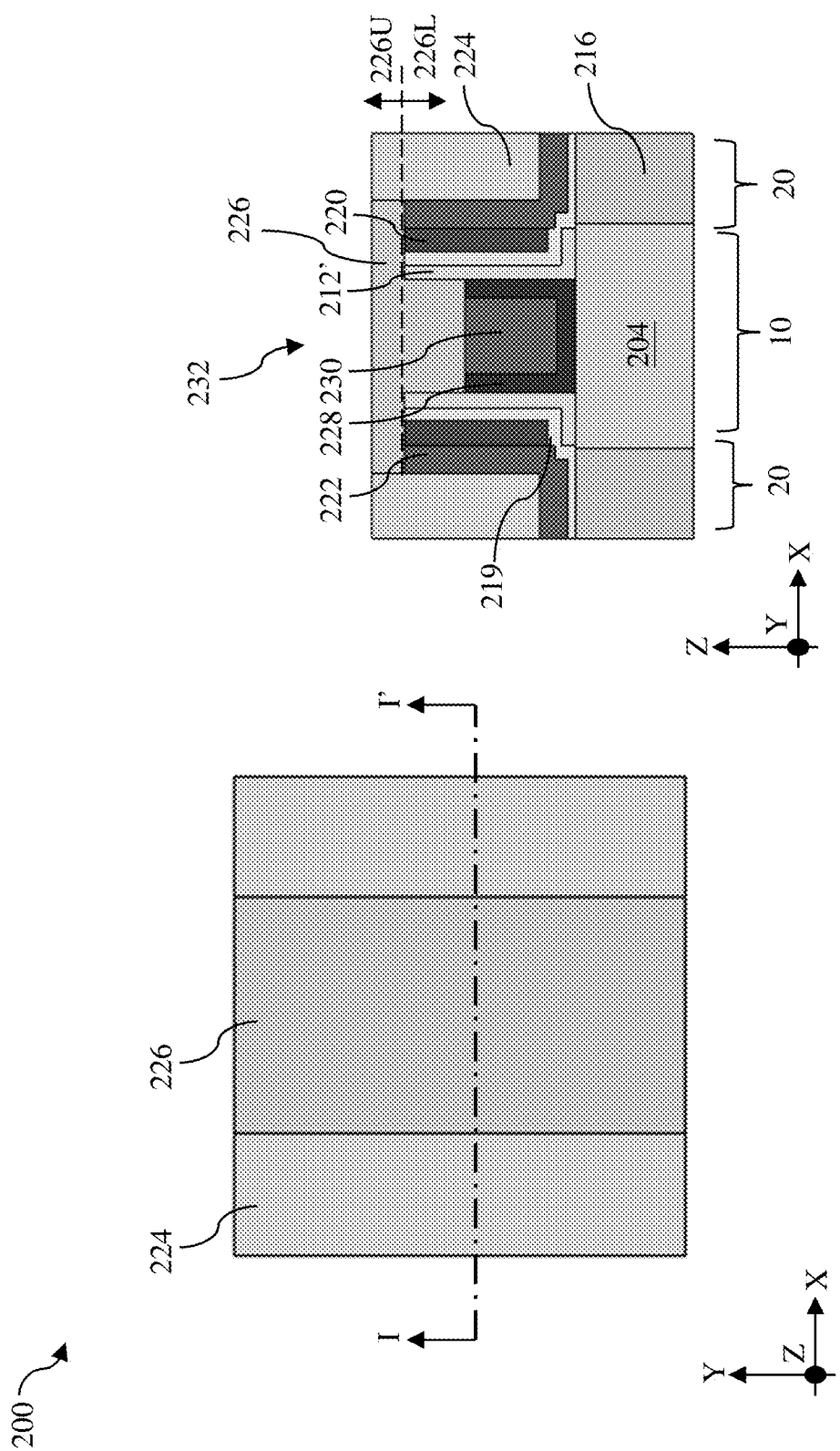
Figure 24B:
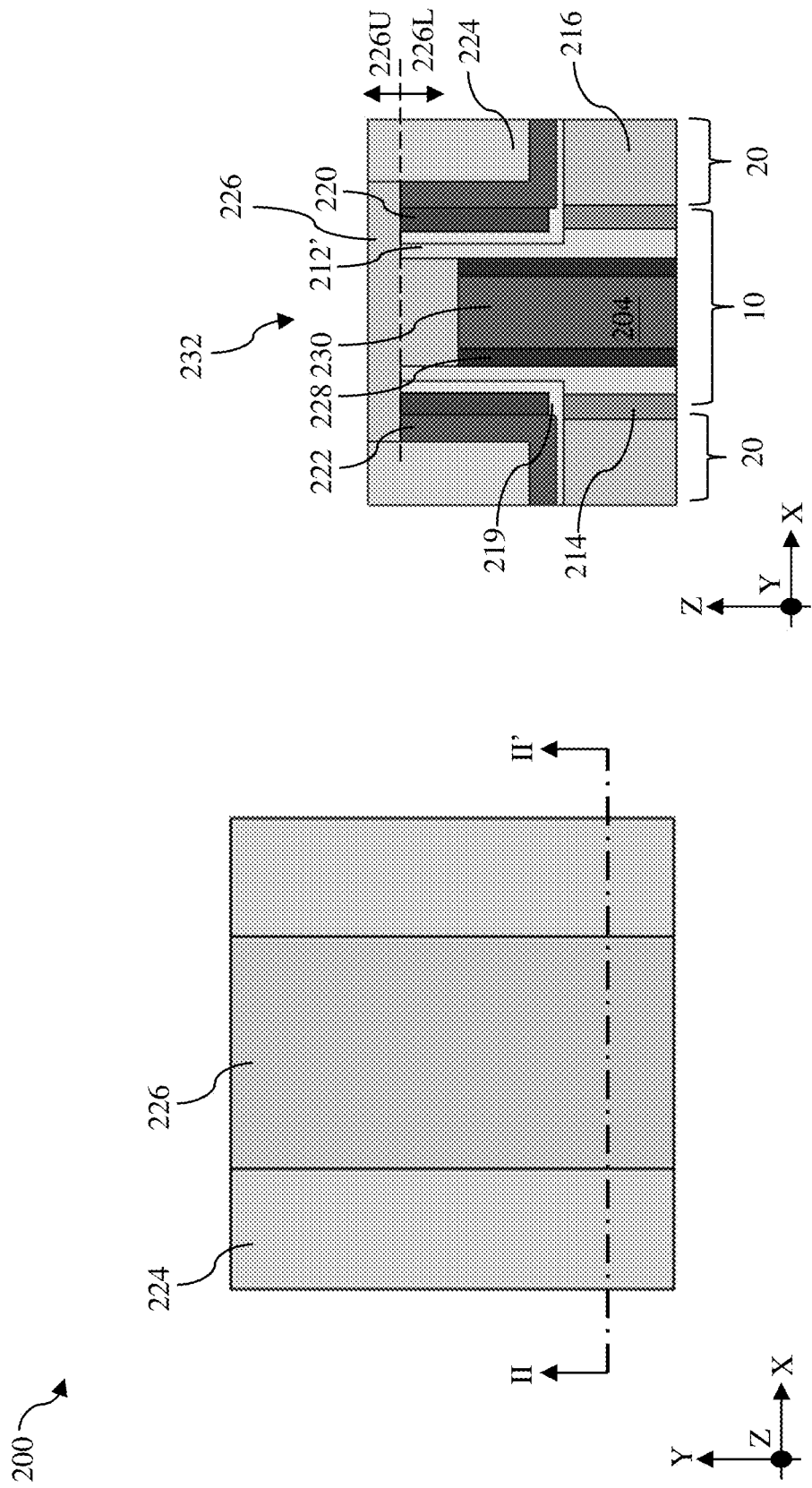

Referring to FIGS. 18, 24A and 24B, method 300 includes a block 314 where the dummy gate stack 206 is replaced with a gate structure 232. In some embodiments, the dummy gate stack 206 serves as a placeholder for the functional gate structure 232 and is selectively etched away at block 314. In instances where the dummy gate electrode 208 is formed of polysilicon, an etch process that is selective to the dummy gate electrode 208 may be used to remove the dummy gate electrode 208 to expose the channel region 10 of the active region 204. In some embodiments, the gate structure 232 includes a gate dielectric layer 228 and a gate electrode 230. The gate dielectric layer 228 may include an interfacial layer on the channel region 10 of the active region 204 and one or more high-k dielectric layers (i.e., having a dielectric constant greater than that of silicon oxide, which is about 3.9) over the interfacial layer. In some implementations, the interfacial layer may include silicon oxide and the high-k dielectric layer may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof. The interfacial layer functions to enhance adhesion of the high-k dielectric layers to the channel region 10 of the active region 204. The gate electrode 230 may include at least one work function metal layer and a metal fill layer disposed thereover. Depending on the conductivity type of the semiconductor device 200, the work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The metal fill layer may include copper (Cu), tungsten (W), aluminum (Al), cobalt (Co), other suitable materials, or combinations thereof and may be deposited using physical vapor deposition (PVD), CVD, ALD, or other suitable processes. In some embodiments, the gate structure 232 may further include liners, barrier layers, other suitable layers, or combinations thereof.

Referring to FIGS. 18, 24A and 24B, method 300 includes a block 316 where a first self-align contact (SAC) feature 226 is formed over the gate structure 232. In some embodiments, the first ESL 222, the second dummy spacer layer 220, the third dummy spacer layer 219, the gate structure 232 are selectively etched to form a SAC contact opening (not explicitly shown in FIGS. 24A and 24B). In some implementations, the selective etching may etch the functional gate structure 232 at a faster rate, resulting in a T-shaped SAC opening when viewed along the Y direction. A dielectric material is then deposited into the T-shaped SAC opening to form the first SAC feature 226, which is also T-shaped when viewed along the Y direction. In some embodiments, the dielectric material may include silicon nitride, hafnium silicide, aluminum oxynitride, hafnium oxide, lanthanum oxide, aluminum oxide, zirconium nitride, silicon carbide, zinc oxide, silicon oxycarbonitride, silicon, yittrium oxide, tantalum carbonitride, zirconium silicide, silicon carbonitride, zirconium aluminum oxide, titanium oxide, tantalum oxide, or zirconium oxide. In some instances, the T-shaped first SAC feature 226 may include a lower portion 226L adjacent the gate structure 232 and an upper portion 226U over the lower portion 226L. In some implementations illustrated in FIGS. 25A and 25B, the upper portion 226U is disposed over the lower portion 226L and top surfaces of the first ESL 222, the second dummy space layer 220, the thinned first spacer layer 212', and the third dummy spacer layer 219. The lower portion 226L of the first SAC feature 226 is disposed between the thinned first spacer layers 212'. In some instances, the upper portion 226U may have a thickness along the Z direction between about 1 nm and about 30 nm and the lower portion 226L may have a thickness along the Z direction between about 1 nm and about 30 nm. The first SAC feature 226 may also be referred to as a capping layer 226.

Figure 25A:
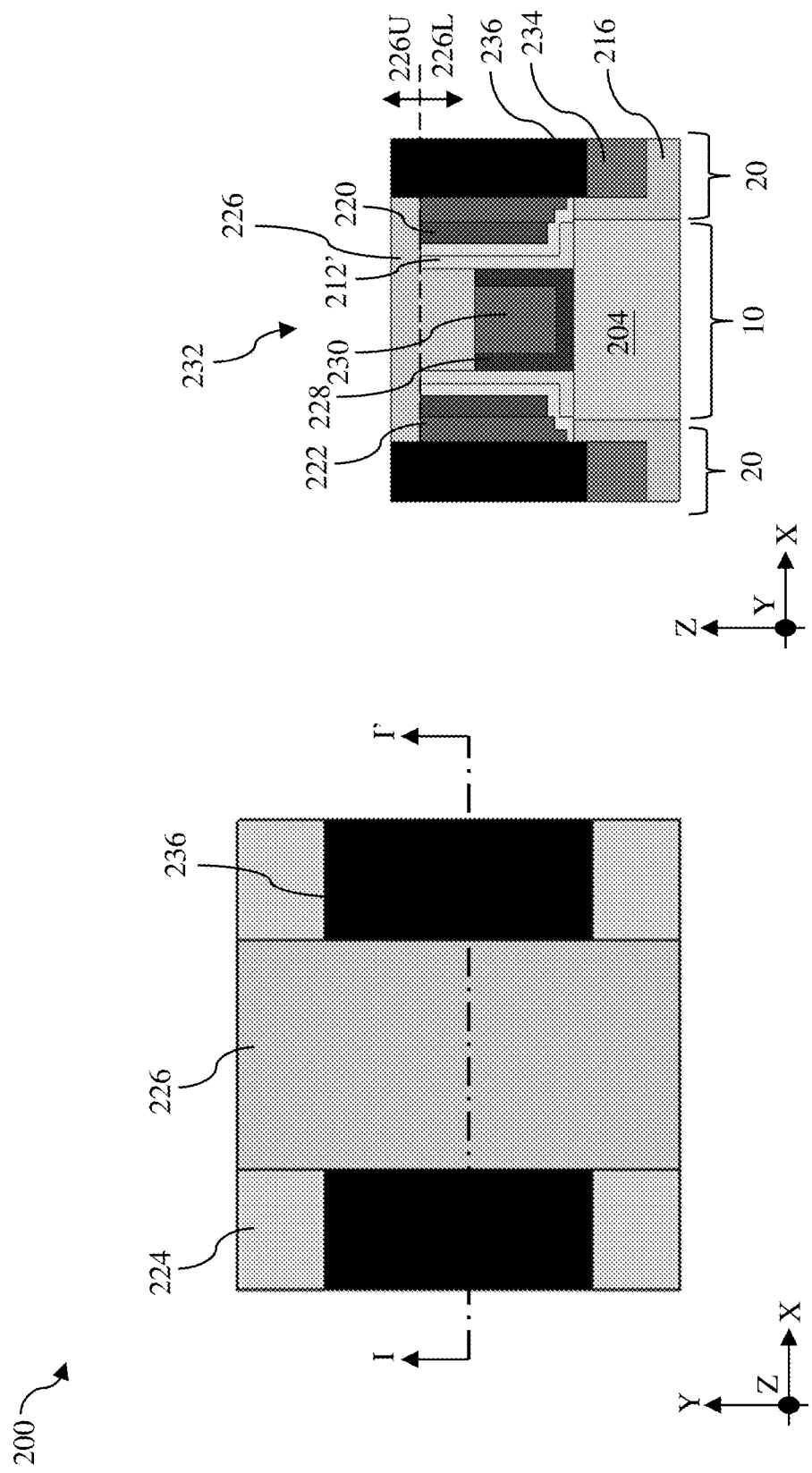
Figure 25B:
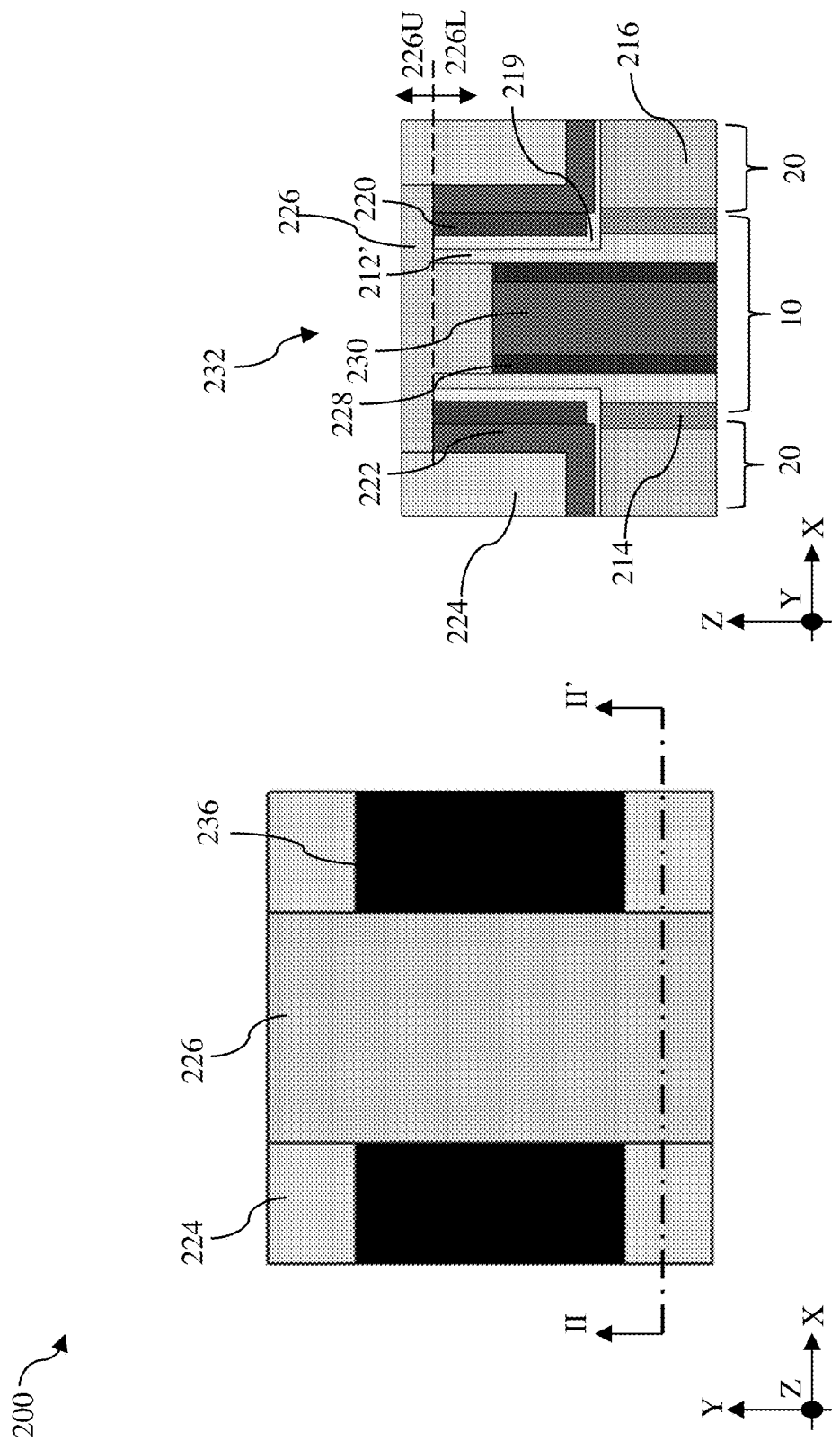

Referring still to FIGS. 1, 25A and 25B, method 300 includes a block 318 where a source/drain contact 236 is formed over the source/drain feature 216. While not explicitly shown, a source/drain contact opening is formed over a portion of the source/drain feature 216 to expose such portion of the source/drain feature 216. A silicide feature 234 is then formed over the exposed portion of the source/drain feature 216 by depositing a metal material over the source/drain feature 216 and annealing the workpiece 200 to bring about a silicidation reaction between the metal material and the source/drain feature 216. In some instances, the metal material may include titanium (Ti), nickel (Ni), cobalt (Co), tantalum (Ta), or tungsten (W) and the silicide feature 234 may include titanium silicide, nickel silicide, cobalt silicide, tantalum silicide, tungsten silicide. The silicide feature 234 functions to reduce contact resistance. After the formation of the source/drain contact openings, source/drain contacts 236 are deposited in the source/drain contact openings. Each of the source/drain contacts 236 may be formed of a metal selected from copper (Cu), tungsten (W), aluminum (Al), cobalt (Co), ruthenium (Ru), nickel (Ni), other suitable materials, or combinations thereof and deposited using PVD, CVD, ALD, or other suitable processes. After deposition of the source/drain contacts 236, the workpiece 200 is planarized to remove excess metal of the source/drain contacts 236 over the first ILD layer 224 such that top surfaces of the source/drain contacts 236 and the first ILD layer 224 are coplanar.

Figure 26A:
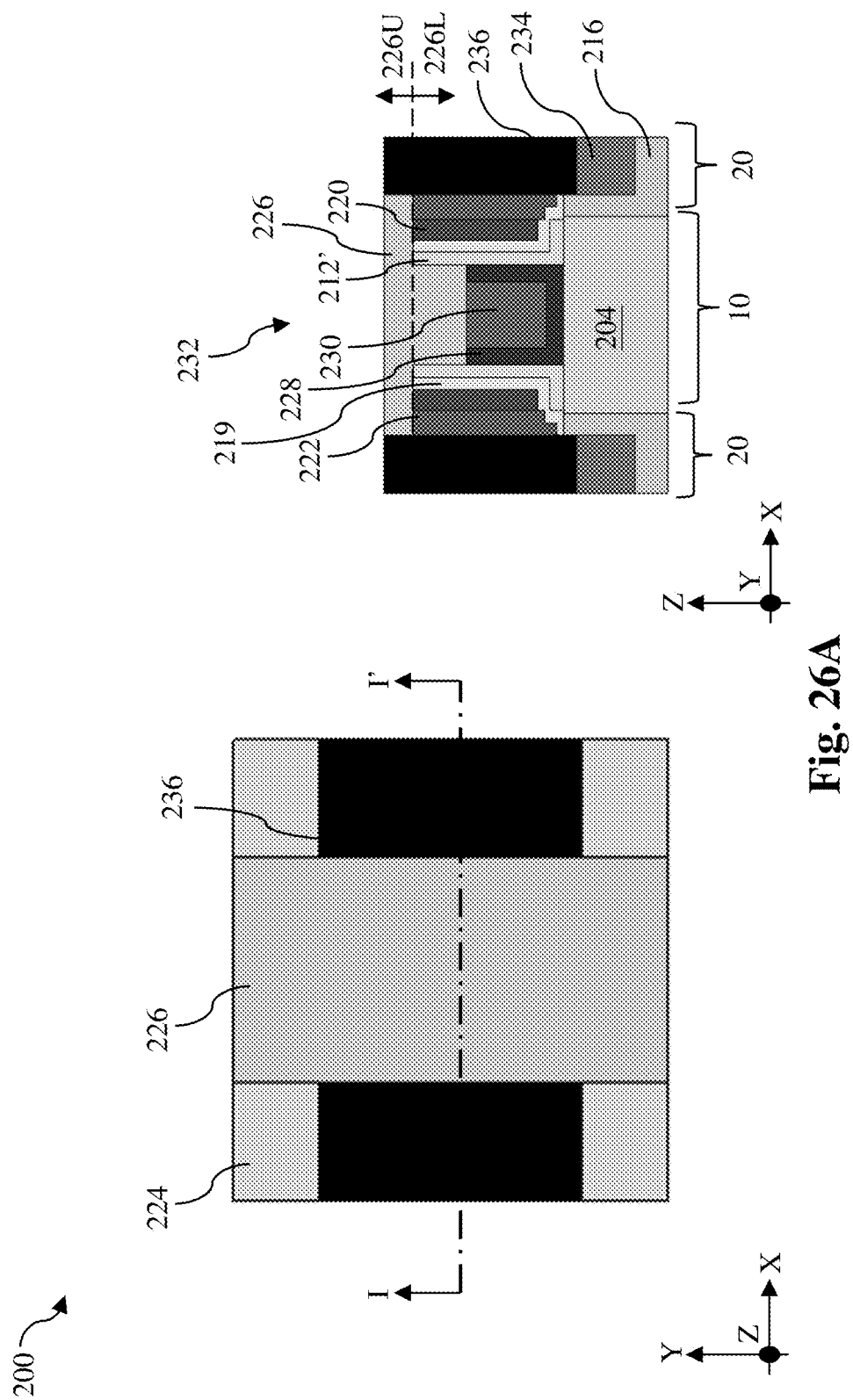
Figure 26B:
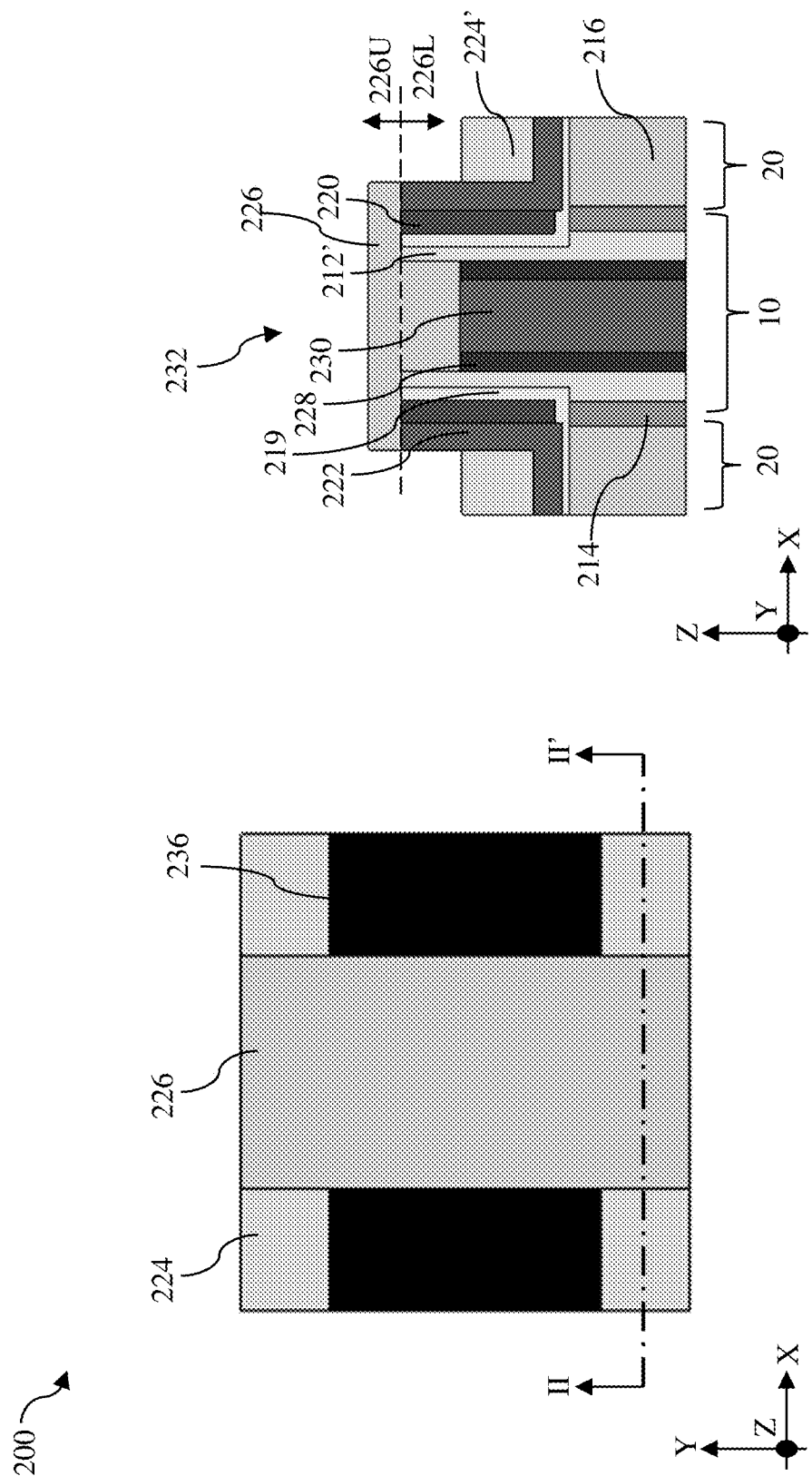

Referring to FIGS. 18, 26A and 26B, method 300 includes a block 320 where the first ILD layer 224 is recessed to expose a portion of the first ESL 222. In some embodiments, a selective etch process is performed at block 320 to partially recess the first ILD layer 224. In these embodiments, the first ILD layer 224 is selectively etched using the first SAC feature 226 and the source/drain contacts 236 as an etch mask to form the recessed first ILD layer 224'. In some implementations illustrated in FIGS. 26A and 26B, the first ILD layer 224 is recessed to expose a portion of the sidewalls of the first ESL 222. In some instances, because the first ESL 222 is formed of a material different from that of the first ILD layer 224, the first ILD layer 224 may be selectively recessed at block 320 without substantially damaging the first ESL 222. In some instances, the first ESL 22 may have a thickness between about 1 nm and about 10 nm.

Figure 27A:
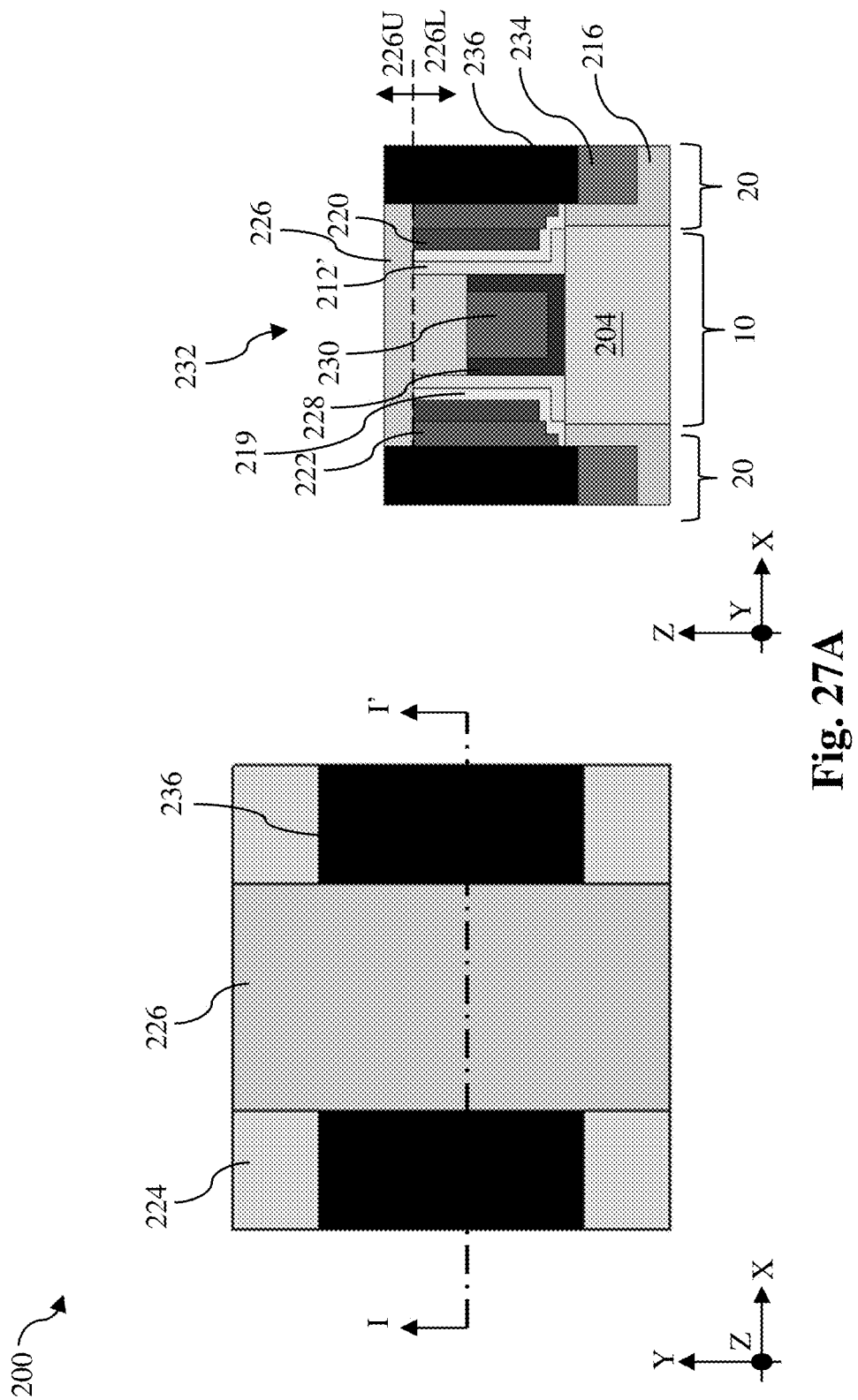
Figure 27B:
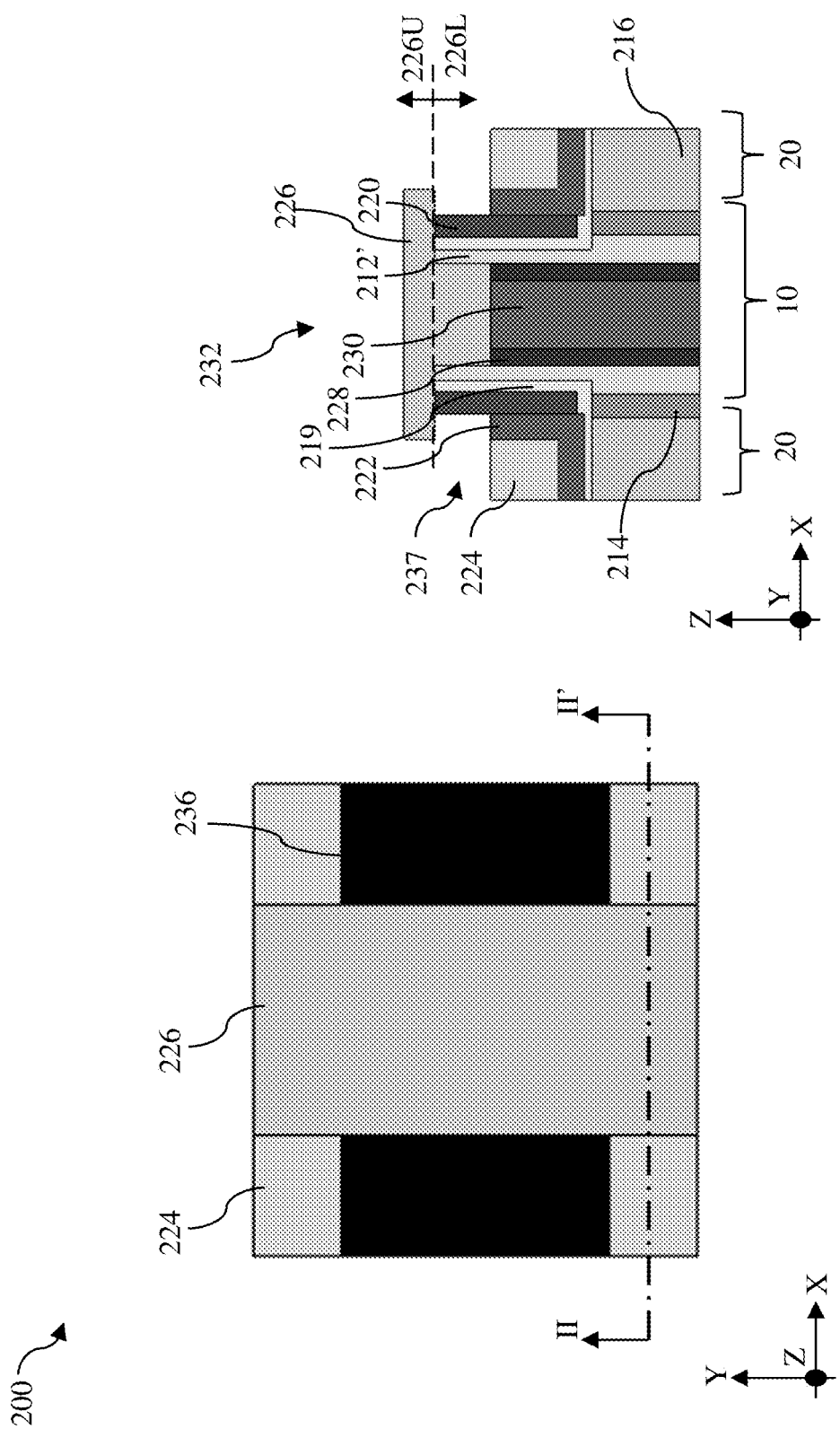

Referring to FIGS. 18, 27A and 27B, method 100 includes a block 322 where the exposed portion of the first ESL 222 is etched to form a lateral opening 237 to expose the second dummy spacer layer 220. In some embodiments, the etching chemistry of the etch process at block 322 is selected such that the exposed sidewalls of the first ESL 222 may be laterally etched without substantially damaging the first SAC feature 226 and the recessed first ILD layer 224. It is noted that the opening 237 does not extend vertically along the Z direction but rather, it extends horizontally along the X direction. As illustrated in FIG. 27B, the opening 237 is disposed under the upper portion 226U of the first SAC feature 226. The lateral opening 237 provides access to the second dummy spacer layer 220, allowing it to be selectively removed at block 324.

Figure 28A:
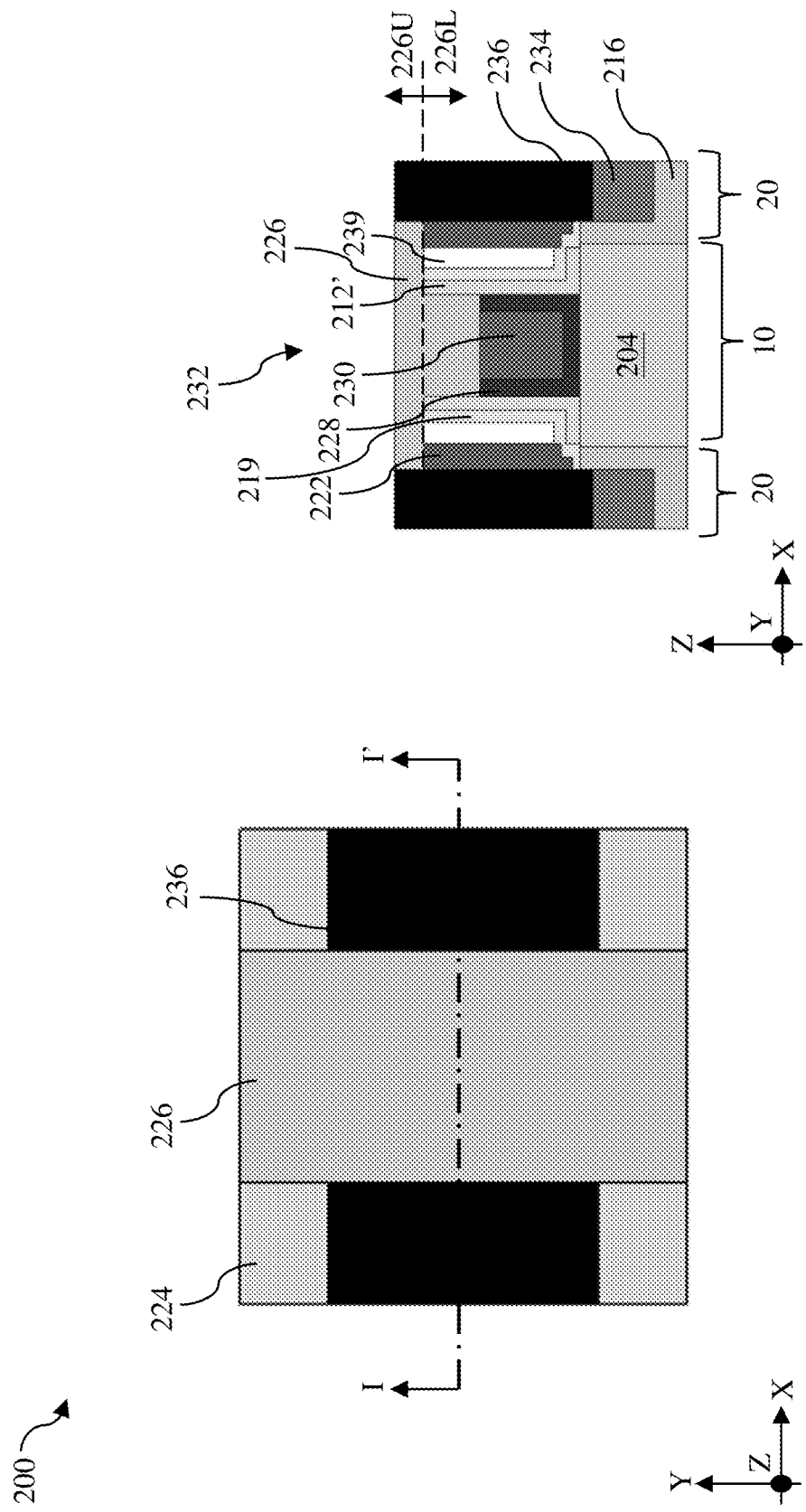
Figure 28B:
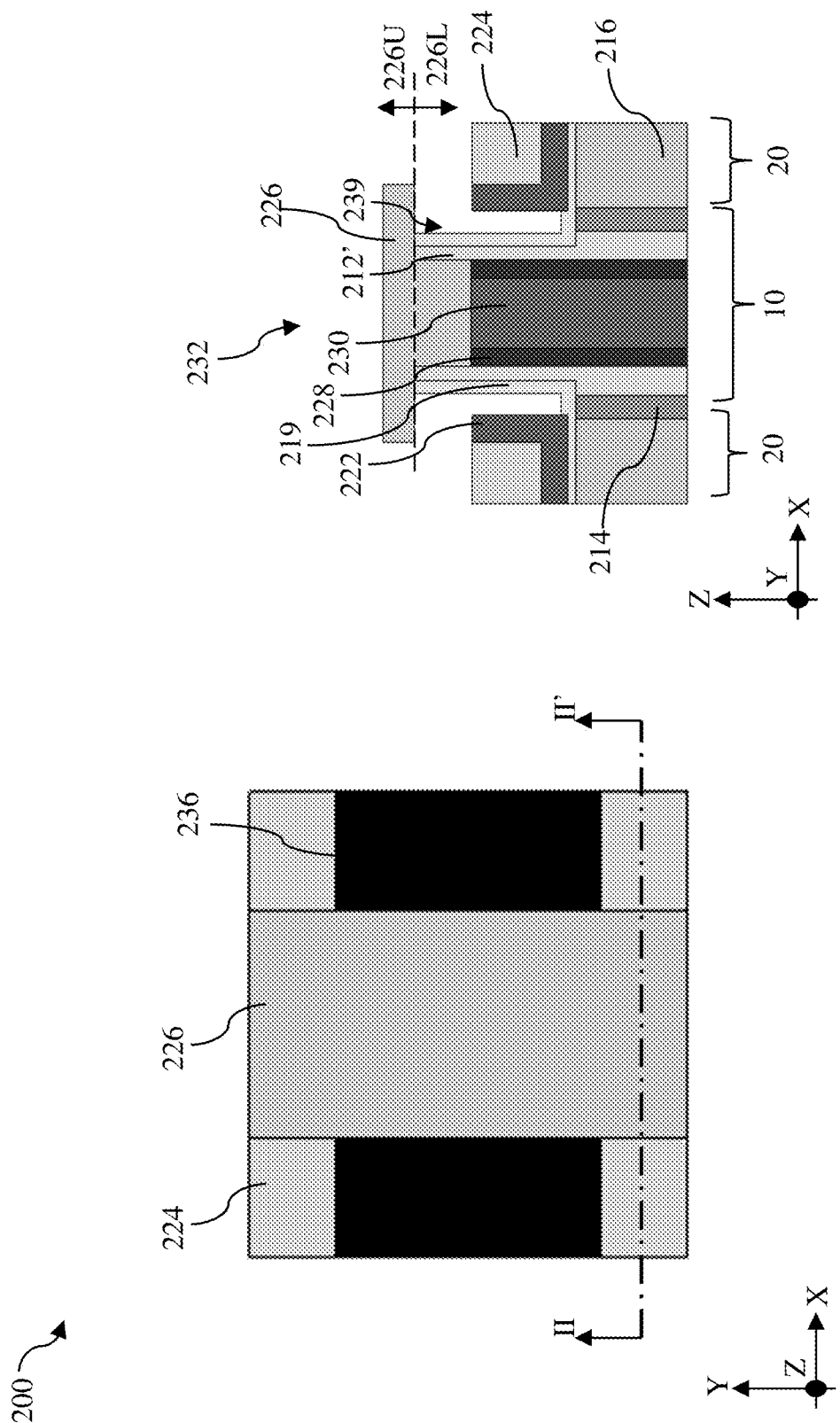

Referring to FIGS. 18, 28A and 28B, method 100 includes a block 324 where the second dummy spacer layer 220 is selectively removed to form an air gap 239. Via the opening 237 formed at block 322, the second dummy spacer layer 220 may be selectively removed to form the air gap 239. As described above, the materials of the third dummy spacer layer 219 and the second dummy spacer layer 220 are selected such that the second dummy spacer layer 220 may be selectively removed without substantially etching the third dummy spacer layer 219. According to the present disclosure, the materials for the first ESL 222 and the first SAC feature 226 are also selected to be different from that of the second dummy spacer layer 220 such that the air gap 239 may be formed by removing of the second dummy spacer layer 220. As shown in FIGS. 28A and 28B, the air gap 239 is defined by the upper portion 226U, the first ESL 222, and the third dummy spacer layer 219 and extends under the upper portion 226U along Y direction. It can be seen that each gate structure 232 is disposed between two air gaps 239 along the X direction and each of the air gap 239 extend along the Y direction between two openings 237. Each of the air gaps 239 is in fluid communication with the two opening 237.

Figure 29A:
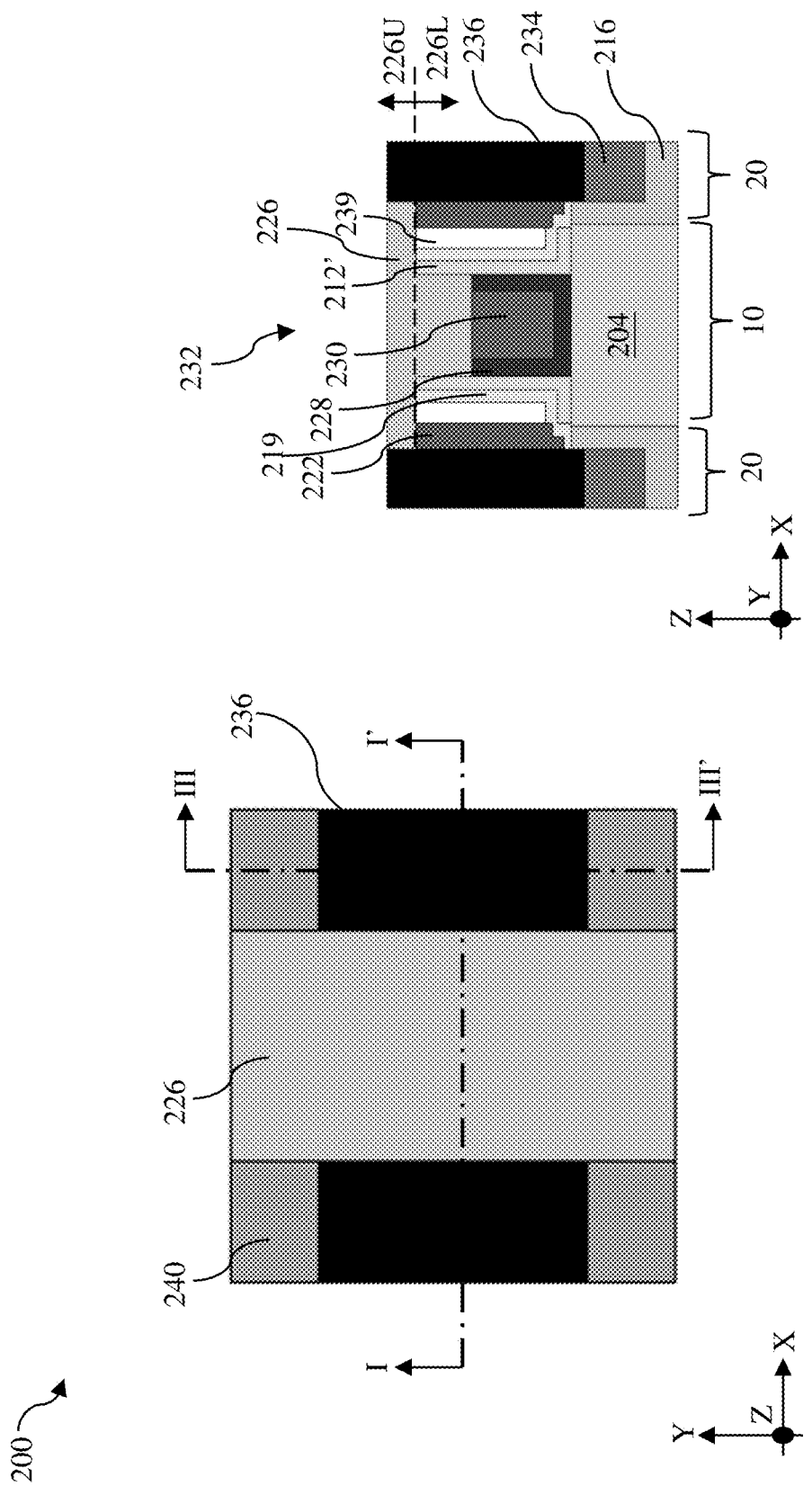
Figure 29B:
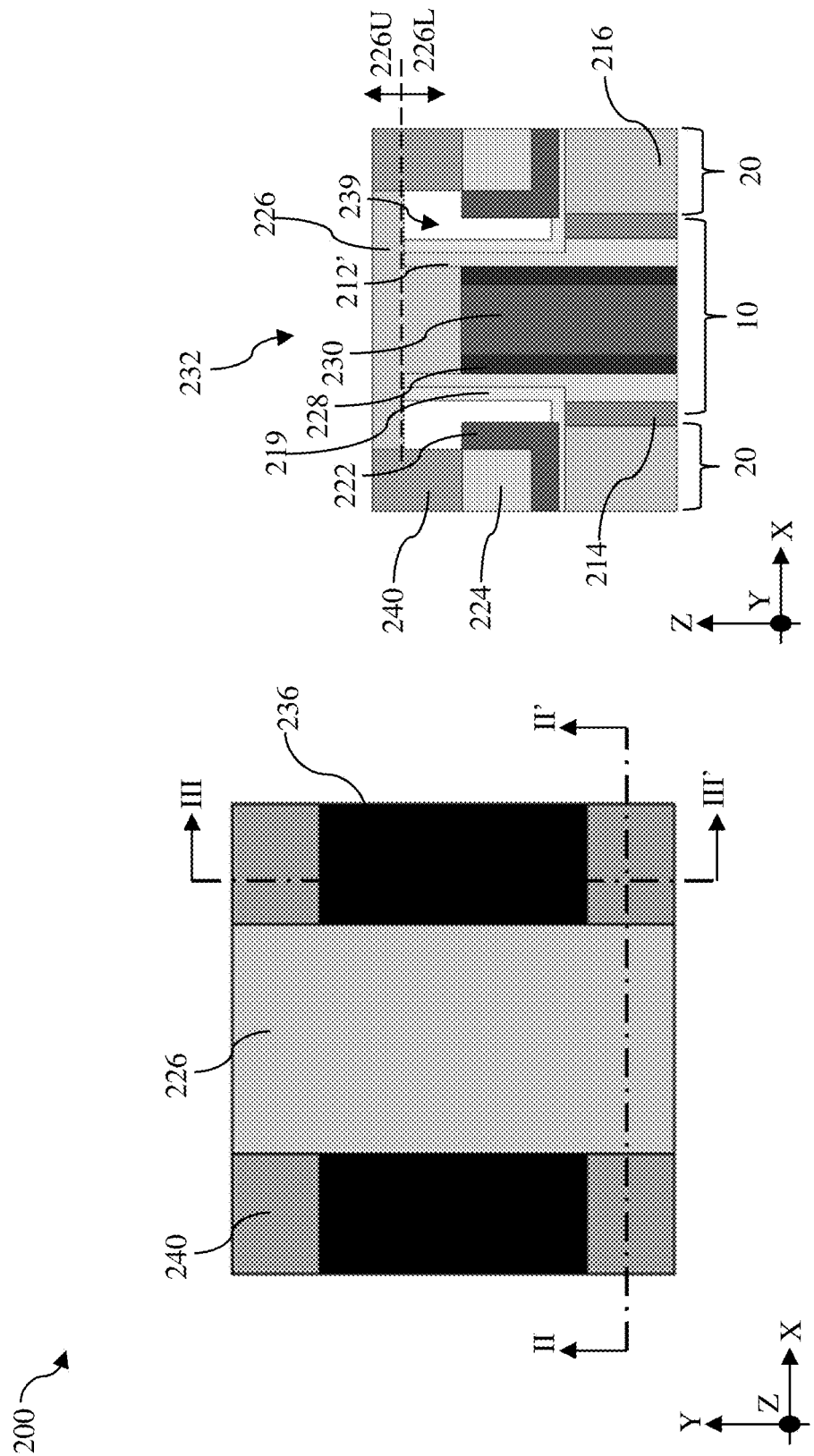

Referring to FIGS. 18, 29A, 29B, 30A, and 30B method 300 includes a block 326 where a seal layer 240 is deposited to seal the air gap 239. In some embodiments, the seal layer 240 may include silicon nitride, hafnium silicide, aluminum oxynitride, hafnium oxide, lanthanum oxide, aluminum oxide, zirconium nitride, silicon carbide, zinc oxide, silicon oxycarbonitride, silicon, yittrium oxide, tantalum carbonitride, zirconium silicide, silicon carbonitride, zirconium aluminum oxide, titanium oxide, tantalum oxide, or zirconium oxide. In some implementations, the seal layer 240 is deposited using CVD or a suitable deposition technique. It is noted that the material for the seal layer 240 is selected such that the first ILD layer 224 and the first SAC feature 226 may be selectively etched without substantially etching the seal layer 240. As will be described below, the seal layer 240 allows formation of slot source/drain contact vias. As illustrated in FIGS. 29A and 29B, the seal layer 240 seals off the air gap 239. Even though some of the seal layer 240 may intrude into the opening 237, at least a portion of the opening 237 may become a part of the air gap 239 after the seal layer 240 is deposited.

Reference is still made to FIG. 29A. The air gap 239 is disposed between the first ESL 222 and a vertical portion of the third dummy spacer layer 219 along the X direction and is disposed between the upper portion 226U of the first SAC feature 226 and a horizontal portion of the third dummy spacer layer 219 along the Z direction. The vertical portion of the third dummy spacer layer 219 extends along sidewalls of the thinned first spacer layer 212'. The horizontal portion of the third dummy spacer layer 219 is disposed on a horizontal portion of the thinned first spacer layer 212' and the source/drain feature 216. The vertical portion of the third dummy spacer layer 219 is disposed between the thinned first spacer layer 212' and the air gap 239 along the X direction. As shown in FIG. 29A, the air gap 239 is also disposed between the source/drain contact 236 and the gate structure 232 as well as between the source/drain contact 236 and the lower portion 226L of the first SAC feature 226. The air gap 239 extends past both ends of the source/drain contact 236 along the Y direction. Referring to FIG. 29B, along section the air gap 239 may include a portion of the opening 237 and may have an inverse L-shape when viewed along the Y direction. In addition, along section the air gap 239 is defined by the third dummy spacer layer 219, the first ESL 222, the seal layer 240, and the upper portion 226U.

Figure 30A:
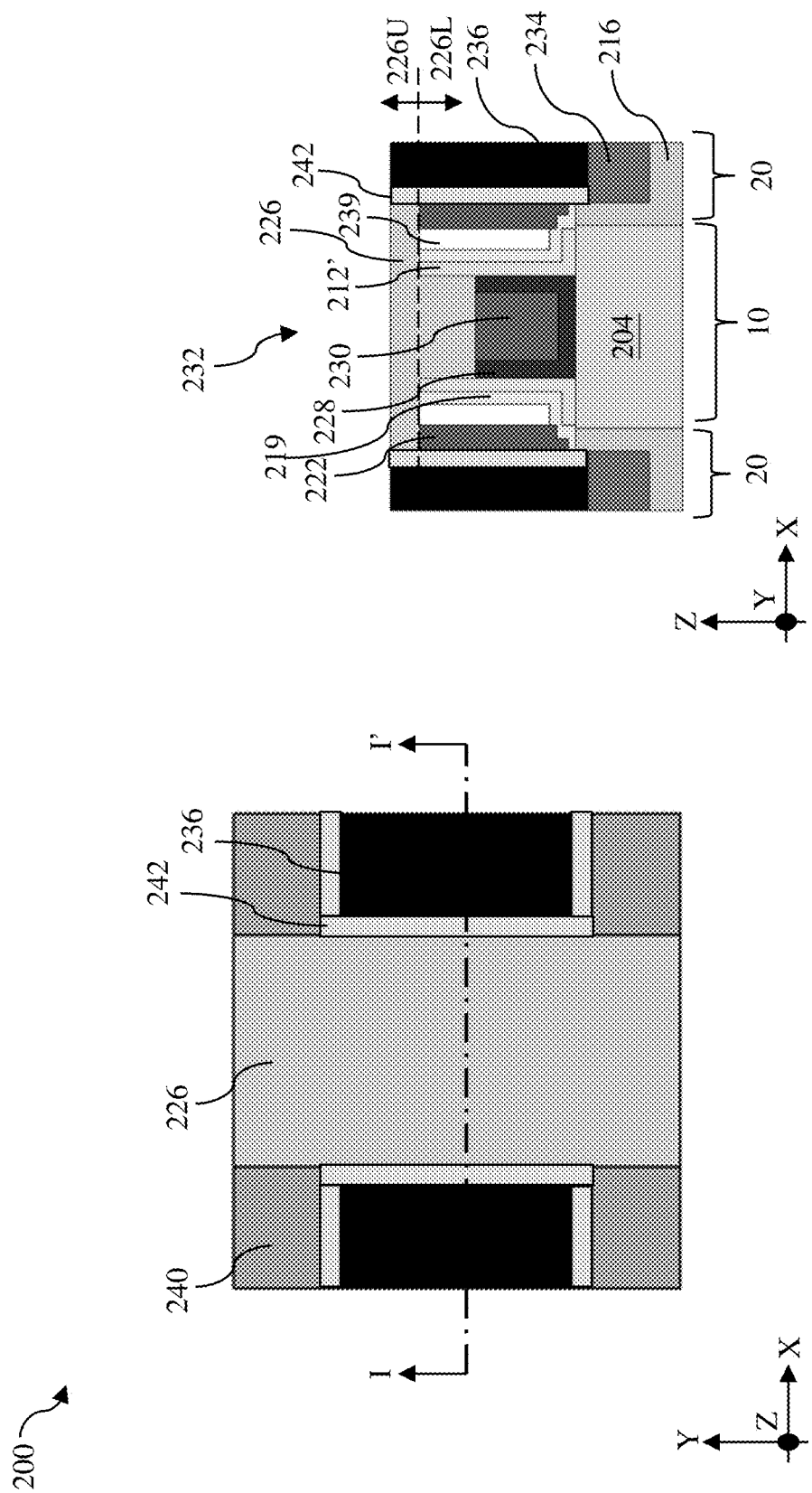
Figure 30B:
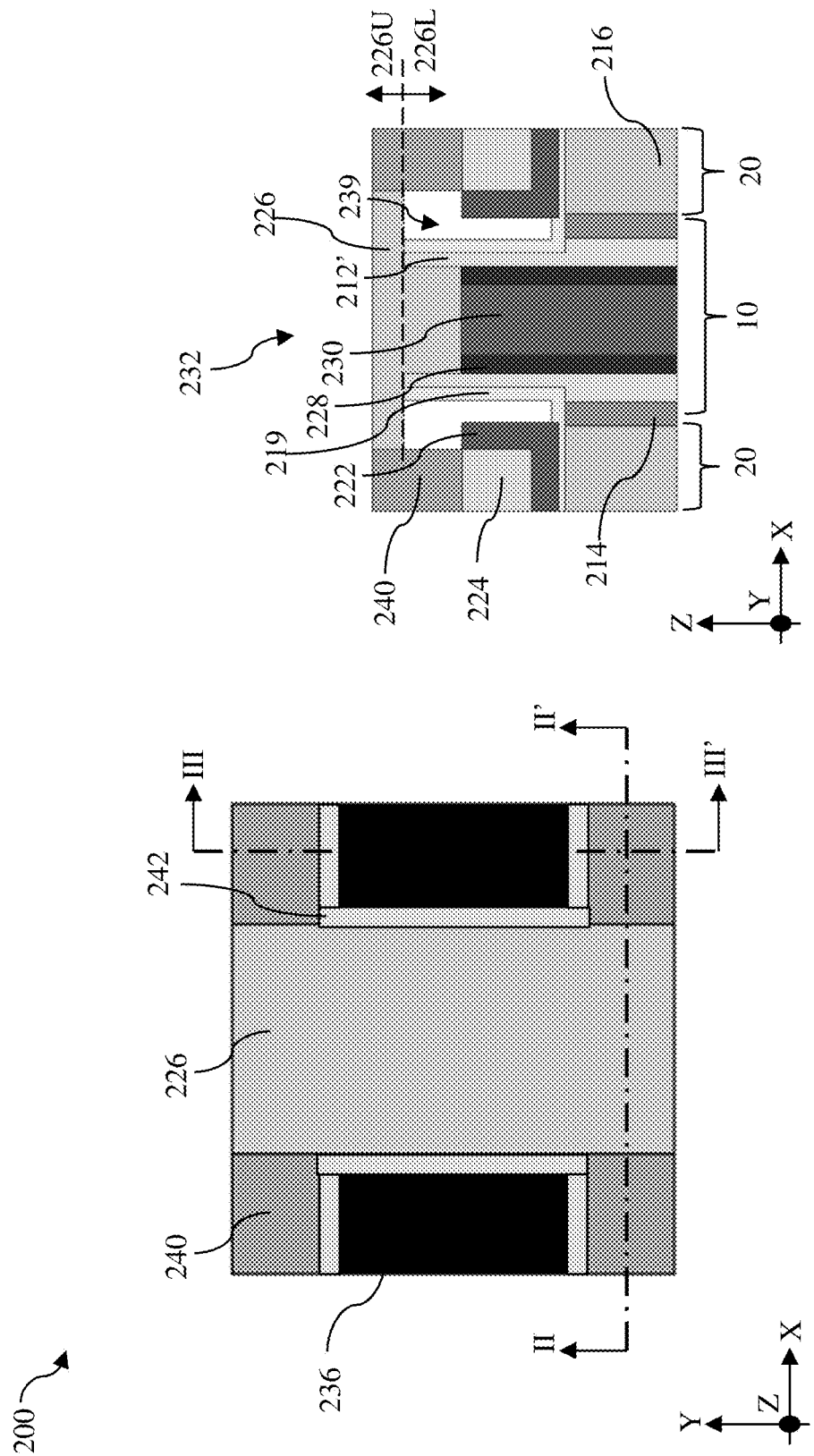

Reference is now made to FIGS. 30A and 30B. In some alternative embodiments, a liner 242 lines the sidewalls of the source/drain contact 236. As illustrated in FIG. 30A, the liner 242 may be disposed between the source/drain contact 236 and the seal layer 240, between the source/drain contact 236 and the upper portion 226U of the first SAC feature 226, between the source/drain contact 236 and the first ESL 222, and between the source/drain contact 236 and the horizontal portion of the third dummy spacer layer 219. Because the liner 242 is not shown along the cross-section liner 242 is not visible when viewed along the Y direction in FIG. 30B. In some implementations, the liner 242 may include silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. In some instances, the liner 242 may have a thickness between about 1 nm and about 10 nm. In some instances, the liner 242 may be omitted entirely. In instances where the liner 242 is present, the liner 242 may be formed to a thickness between about 1 nm and bout 10 nm.

Figure 31:
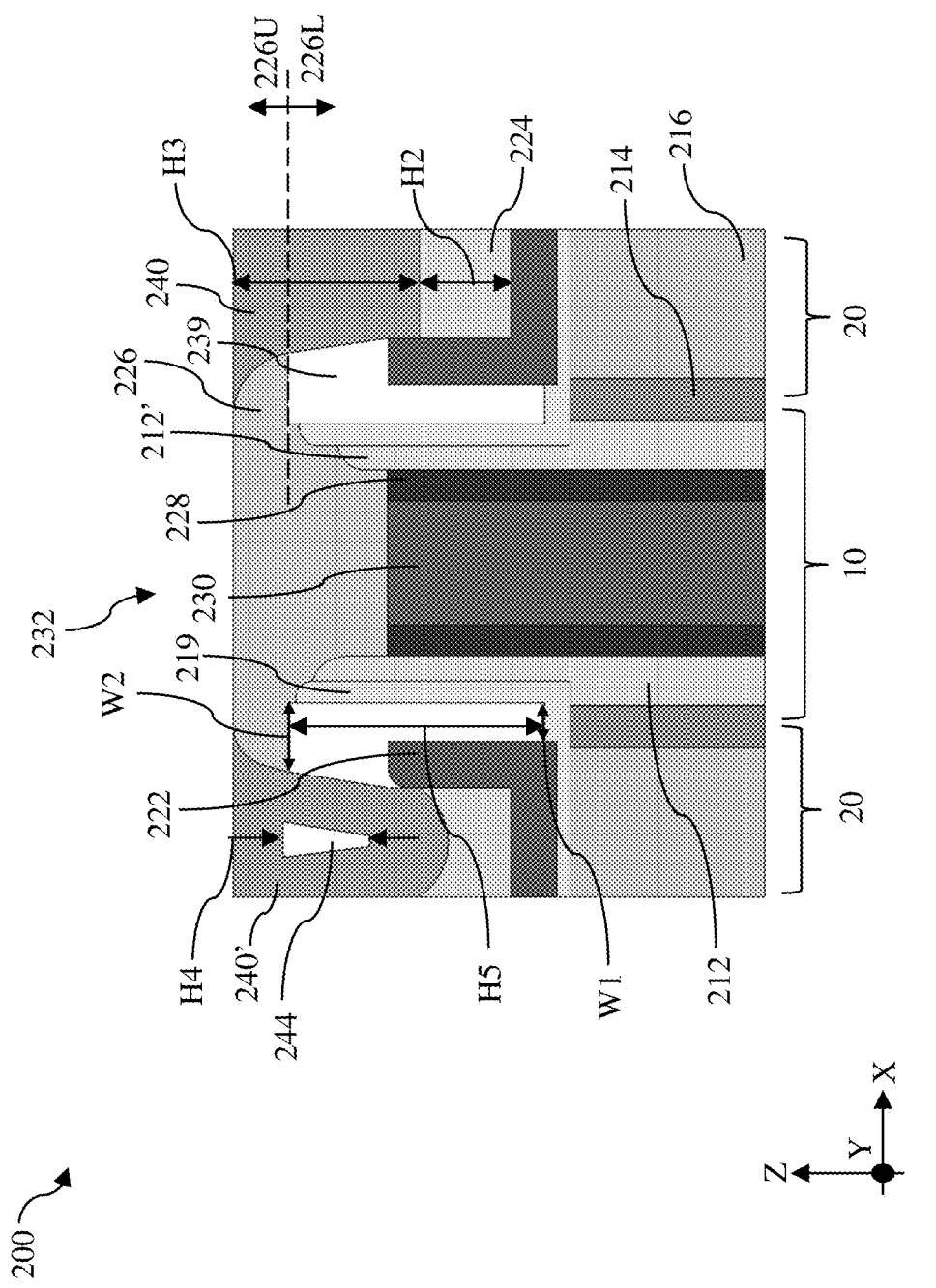

Process variations may bring about various features as a result of the formation of the air gap 239 according to method 300. Some of the examples are shown in FIG. 31. In some implementations, the formation of the SAC contact opening at block 316 may round top edges of the thinned first spacer layer 212' and the third dummy spacer layer 219. Because the etching process to form the SAC contact opening may have different etch rates for the thinned first spacer layer 212' and the third dummy spacer layer 219, the top surfaces of the thinned first spacer layer 212' and the third dummy spacer layer 219 may not be smooth and continuous. The recess of the first ILD layer 224 at block 320 may form rounded edges of the upper portion 226U of the first SAC feature 226. In addition, the recess of the first ILD layer 224 may form a dip 241 in the first ILD layer 224 such that a portion of the seal layer 240 may be disposed in the dip 241 of the first ILD layer 224. The dip 241 may have a depth between about 0.1 nm and about 20 nm. In embodiments where the deposition of the seal layer 240 is carried out using CVD, a void 244 may be formed in the seal layer 240. As illustrated in FIG. 31, the air gap 239 has a first width W1 between the first ESL 222 and the vertical portion of the third dummy spacer layer 219, a second width W2 between the seal layer 240 and the third dummy spacer layer 219, and a fifth height H5 between the upper portion 226U and the horizontal portion of the third dummy spacer layer 219. The portion of the air gap 239 that is disposed between the first ESL 222 and the vertical portion of the third dummy spacer layer 219 may be referred to as a bottom portion. The portion of the air gap 238 that is disposed between the seal layer 240 and the third dummy spacer layer 219 may be referred to as a top portion. In some instances, the first width W1 may be between about 1 nm and about 10 nm, the second width W2 may be between about 2 nm and about 15 nm, and the fifth height H5 may be between about 12 nm and about 60 nm. Because the difference in thicknesses of the first dummy spacer layer 218 and the third dummy spacer layer 219, the fifth height H5 of the air gap 239 may be different from the first height H1 of the air gap 238. In some instances, the fifth height H5 is greater than the first height H1. The first ILD layer 224 over the first ESL 222 has a second height H2. In some implementations, the second height H2 may be such that the first ILD layer 224 may be higher or lower than the adjacent first ESLs 222. In these implementations, the difference between first ILD layer 224 and the first ESL 222 may be about 10 nm. In some instances, the second height H2 may be between about 2 nm and about 40 nm. The seal layer 240 over the first ILD layer 224 has a third height H3. In some instances, the third height H3 may be between about 2 nm and about 30 nm. The void 244 in the seal layer 240 may have a fourth height H4 between about 0.1 nm and about 10 nm.

Figure 32:
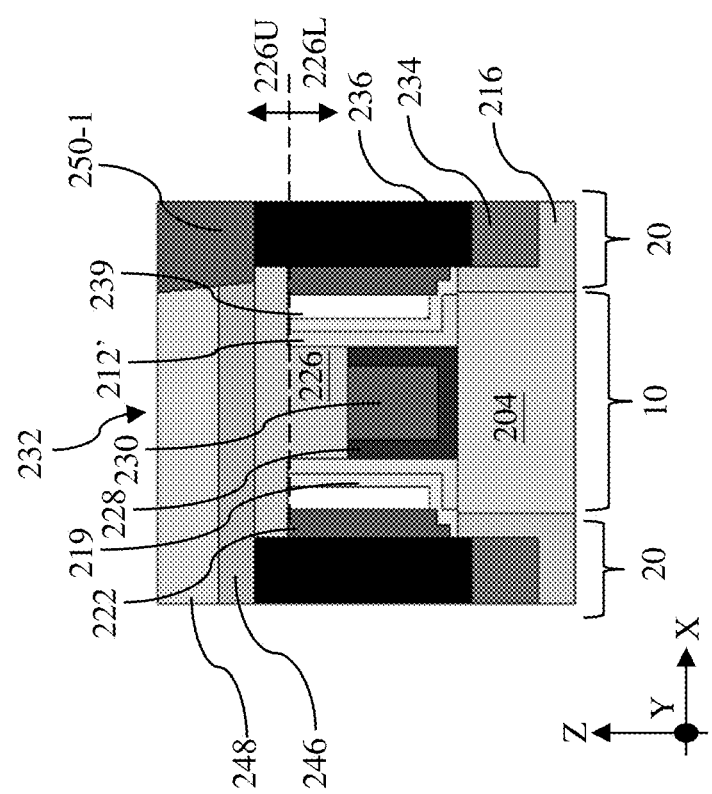

Referring to FIGS. 18, 32, 33, and 34, method 300 includes a block 328 where further processes are performed. Such further processes may include deposition of a second ESL 246, deposition of a second ILD layer 248, and formation of a source/drain contact via 250 (including a first source/drain contact via 250-1 in FIG. 32, a second source/drain contact via 250-2 in FIG. 33, and a third source/drain contact via 250-3 in FIG. 34). Reference is first made to FIG. 32, where the first source/drain contact via 250-1 is formed. In some embodiments, after the seal layer 240 is formed to seal the air gap 239, the second ESL 246 is deposited over the workpiece 200 and the second ILD layer 248 is deposited over the second ESL 246. A source/drain contact via opening is then formed through the second ESL 246 and the second ILD layer 248 to expose the source/drain contact 236. Thereafter, a conductive material, such as copper (Cu), tungsten (W), aluminum (Al), cobalt (Co), ruthenium (Ru), nickel (Ni), is then deposited in the source/drain contact via opening to form the first source/drain contact via 250-1, which is in contact with the source/drain contact 236. The second ESL 246 and the second ILD layer 248 may be substantially similar to the first ESL 222 and the first ILD layer 224, respectively, in terms of compositions and formation processes. FIG. 35A and FIG. 35B illustrate, respectively, a top view and a cross-sectional view of a workpiece 200 where the first source/drain contact vias 250-1 are formed. It can be seen that adjacent source/drain contacts 236 are separated along the Y direction by not only the first ILD layer 224 but also the seal layer 240. A plurality of the first source/drain contact vias 250-1 are then formed through the second ILD layer 248 and the second ESL 246 to be in contact with the source/drain contact. As illustrated in FIG. 35B, in some implementations, no further SAC layer is formed over the source/drain contacts 236.

Figure 33:
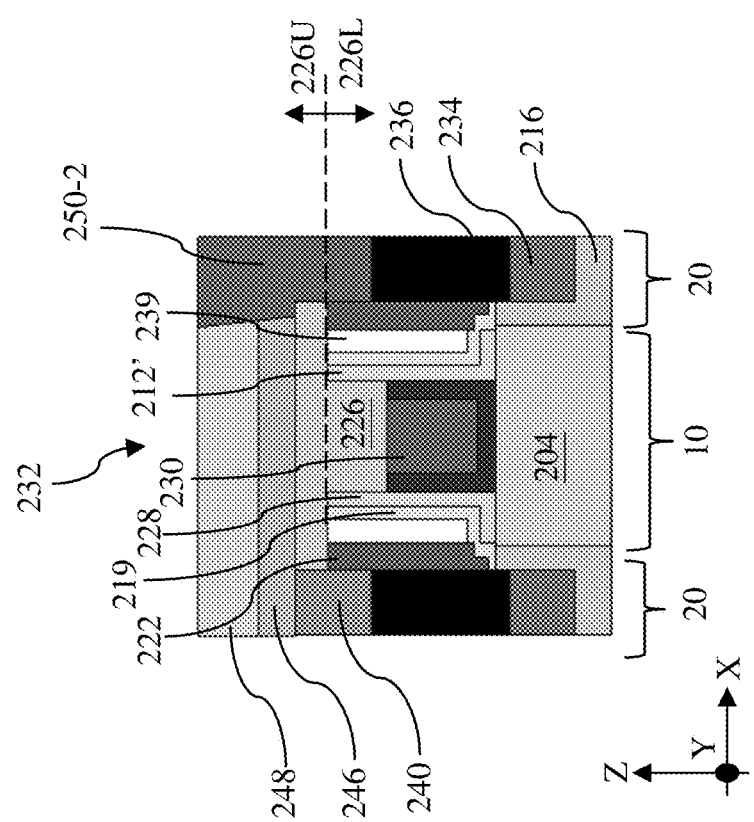

The second source/drain contact via 250-2 is illustrated in FIG. 33. Different from the first source/drain contact via 250-1 shown in FIG. 32, a top portion of the source/drain contact 236 is recessed to form a SAC recess and a second SAC feature (not shown in FIG. 33 but shown in FIG. 36B). FIG. 36A and FIG. 36B illustrate, respectively, a top view and a cross-sectional view of a workpiece 200 where the second source/drain contact vias 250-2 are formed. As shown in FIG. 36B, a second SAC feature 252 is formed in the SAC recess that extends into the source/drain contact 236 such that the second SAC feature 252 is disposed between seal layer 240. The second source/drain contact via 250-2 therefore extends through the second ILD layer 248, the second ESL 246, and the second SAC feature 252 to be in contact with the source/drain contact 236. Adjacent second source/drain contact vias 250-2 are separated by the seal layer 240 and the second SAC feature 252.

Figure 34:
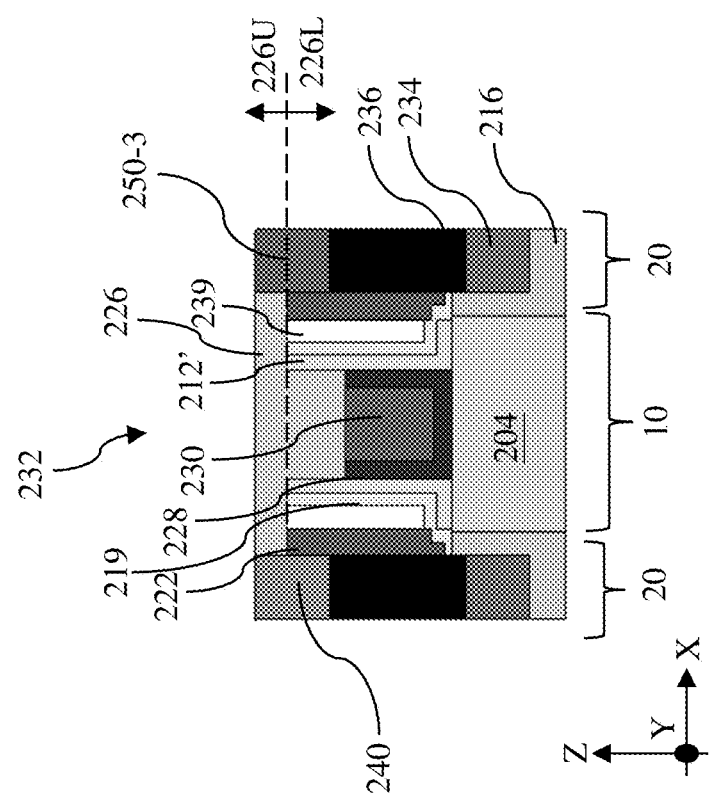

Reference is now made to FIG. 34, wherein the third source/drain contact via 250-3 is formed. In some implementations, the third source/drain contact via 250-3 is a slot via where more than one contact vias to different source/drain contacts 236 are formed simultaneously. Similar to formation of the second source/drain contact via 250-2, the second ESL 246 is deposited over the workpiece 200 and the second ILD layer 248 is deposited over the second ESL 246. A slot opening is then formed by an etch process through the second ESL 246 and the second ILD layer 248 to expose at least two neighboring source/drain contacts 236. A conductive material, such as copper (Cu), tungsten (W), aluminum (Al), cobalt (Co), ruthenium (Ru), nickel (Ni), is then deposited in the slot opening. A planarization process, such as a CMP process, is then used to remove the second ESL 246 and the second ILD layer 248. In some implementations, the material of the seal layer 240 may be selected such that the etch process for forming the slot opening is selective to the second ESL 246 and the second ILD layer 248. Without the seal layer 240, the etch process may indifferently etch the first ILD layer 224 and the second ILD layer 248 and a slot via like the third source/drain contact via 250-3 would not be possible. With the seal layer 240 of the present disclosure, the etch process does not substantially etch the seal layer 240, allowing it to separate adjacent third source/drain contact vias 250-3, as illustrated in FIG. 37B. Due to formation of the slot opening that spans over two adjacent source/drain contacts 236, adjacent third source/drain contact vias 250-3 are only divided by the seal layer 240, as the second SAC feature 252 between adjacent third source/drain contact vias 250-3 is substantially removed during the slot opening formation process. Because the seal layer 240 is denser (less porous) than the first ILD layer 224, the use of the seal layer 240 to separate contact vias may prevent time-dependent dielectric breakdown (TDDB). Formation of slot vias is one of the measures to form device features or openings beyond the lithography resolution limit. The etching selectivity provided by the seal layer 240 of the present disclosure help to align the source/drain contact via openings to respective source/drain contacts 236. In this sense, a process to form slot vias may be regarded as a self-aligned via formation process.

FIGS. 32, 33 and 34 illustrate some benefits of the present disclosure. Formation of the first source/drain contact via 250-1, the second source/drain contact via 250-2, and the third source/drain contact via 250-3 require formation of source/drain contact via openings over the source/drain contact 236. As it is difficult to completely avoid misalignment of masks, the source/drain contact via openings may not always be squarely on the source/drain contact 236. By lateral removal of the second dummy spacer layer 220, the upper portion 226U of the first SAC feature 226 may be preserved to offer etch selectivity needed to prevent the source/drain contact via opening from breaching into the air gap 239 or expanding too far toward the gate structure 230. As a result, methods of the present disclosure may improve process windows, reduce parasitic capacitance, and increase yield.

Although not intended to be limiting, one or more embodiments of the present disclosure provide benefits. For example, the present disclosure provides embodiments of semiconductor devices where air gaps between a gate structure and a source/drain contact may be formed without compromising a capping layer or a SAC feature on the gate structure. When viewed along the lengthwise direction of the gate structure, the SAC feature over the gate structure is substantially T-shaped and the air gaps formed according to the present disclosure are at least partially disposed under a portion of the T-shaped SAC feature. This structure is made possible by formation of lateral openings and lateral removal of a dummy spacer layer. The air gaps are sealed with a seal layer that is different from an adjacent ILD layer in terms of materials and etching selectivity. Such a seal layer allows formation of slot vias. Because the process for forming slot vias has a greater process window than the process for forming individual vias, the use of seal layers in the present disclosure improves the process window.

Thus, in one embodiment, a semiconductor device is provided. The semiconductor device includes an active region including a channel region and a source/drain region adjacent the channel region, a gate structure over the channel region of the active region, a source/drain contact over the source/drain region, a dielectric feature over the gate structure and including a lower portion adjacent the gate structure and an upper portion away from the gate structure, and an air gap disposed between the gate structure and the source/drain contact. A first width of the upper portion of the dielectric feature along a first direction is greater than a second width of the lower portion of the dielectric feature along the first direction. The air gap is disposed below the upper portion of the dielectric feature.

In some embodiments, the semiconductor device may further include a first gate spacer layer and an etch stop layer. The air gap is disposed between the first gate spacer layer and the etch stop layer along the first direction, the first gate spacer layer is disposed between the gate structure and the air gap along the first direction, and the etch stop layer is disposed between the air gap and the source/drain contact along the first direction. In some implementations, the first gate spacer layer includes silicon nitride, hafnium silicide, aluminum oxynitride, hafnium oxide, lanthanum oxide, aluminum oxide, zirconium nitride, silicon carbide, zinc oxide, silicon oxycarbonitride, silicon, yttrium oxide, tantalum carbonitride, zirconium silicide, silicon carbonitride, zirconium aluminum oxide, titanium oxide, tantalum oxide, or zirconium oxide. In some instances, the gate structure extends from the channel region along a second direction perpendicular to the first direction and the air gap is disposed between the upper portion of the dielectric feature and the first gate spacer layer along the second direction. In some implementations, the gate structure extends from the channel region along a second direction perpendicular to the first direction and the etch stop layer is disposed between the upper portion of the dielectric feature and the first gate spacer layer along the second direction. In some embodiments, the semiconductor device may further include a liner layer disposed between the source/drain contact and the etch stop layer along the first direction. In some implementations, the semiconductor device may further include a second gate spacer layer disposed between the first gate spacer layer and the gate structure along the first direction. In some embodiments, a portion of the first gate spacer layer is disposed over the second gate spacer layer.

In another embodiment, a semiconductor device is provided. The semiconductor device includes a gate structure, a first gate spacer layer extending along a sidewall of the gate structure, a source/drain feature adjacent the gate structure, a seal layer over source/drain feature, a dielectric feature over the gate structure and including a lower portion adjacent the gate structure and an upper portion away from the gate structure, and an air gap disposed below the upper portion of the dielectric feature. A first width of the upper portion of the dielectric feature along a first direction is greater than a second width of the lower portion of the dielectric feature along the first direction. The air gap is disposed between the seal layer and the first gate spacer layer along the first direction.

In some embodiments, the seal layer is in contact with the upper portion of the dielectric feature. In some implementations, the semiconductor device may further include an etch stop layer over the source/drain feature and the air gap extends between the etch stop layer and the first gate spacer layer. In some embodiments, a portion of the air gap is directly over a portion of the etch stop layer. In some instances, the first gate spacer layer includes a horizontal portion disposed on the source/drain feature and the etch stop layer is disposed over the horizontal portion of the first gate spacer layer. In some embodiments, the semiconductor device may further include an interlayer dielectric layer disposed over the etch stop layer and the seal layer is disposed over the interlayer dielectric layer.

In yet another embodiment, a method is provided. The method includes receiving a workpiece including active region that includes a channel region and a source/drain feature adjacent the channel region, forming a dummy gate stack over the channel region, forming a first dummy spacer layer over the dummy gate stack and the source/drain feature, forming a second dummy spacer layer over the first dummy spacer layer and the source/drain feature, recessing the second dummy spacer layer to expose top-facing surfaces of the first dummy spacer layer while sidewalls of the first dummy spacer layer remain covered by the second dummy spacer layer, depositing an etch stop layer over the first dummy spacer layer and the second dummy spacer layer, depositing an interlayer dielectric layer over the etch stop layer, replacing the dummy gate stack with a gate structure, recessing the gate structure, the first dummy spacer layer, the second dummy spacer layer, and the etch stop layer to form a self-aligned contact (SAC) opening, forming a dielectric feature in the SAC opening, forming a contact feature extending through the etch stop layer, the interlayer dielectric layer, and the first dummy spacer layer to be in contact with the source/drain feature, selectively recessing the interlayer dielectric layer and the etch stop layer without substantially etching the dielectric feature and the contact feature to form an opening adjacent the contact feature and to expose a portion of the second dummy spacer layer, and selectively removing the second dummy spacer layer to form an air gap.

In some embodiments, the forming of the dielectric feature includes forming a lower portion of the dielectric feature on the gate structure and an upper portion of the dielectric feature over the lower portion, the first dummy spacer layer, the second dummy spacer layer and the air gap is disposed below an upper portion of the dielectric feature. In some embodiments, the method may further include after the selectively removing of the second dummy spacer layer, depositing a seal layer over the interlayer dielectric layer. The seal layer is in contact with the upper portion of the dielectric feature. In some implementations, the active region extends lengthwise along a first direction, a bottom portion of the air gap is disposed between the etch stop layer and the first dummy spacer layer along the first direction, and a top portion of the air gap is disposed between the seal layer and the first dummy spacer layer along the first direction. In some instances, the gate structure extends lengthwise along a second direction perpendicular to the first direction and the air gap extends across an entire length of the contact feature along the second direction. In some embodiments, the gate structure extends from the channel region along a third direction perpendicular to the first direction and the second direction and the air gap is disposed between the upper portion of the dielectric feature and the first dummy spacer layer along the third direction.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a substrate, the substrate comprising an active region including a channel region and a source/drain feature adjacent the channel region;
   forming a dummy gate stack over the active region;
   forming spacers along sidewalls of the dummy gate stack;
   removing portions of the spacers that are directly over the active region;
   forming a first dummy spacer layer over the dummy gate stack and the source/drain feature;
   forming a second dummy spacer layer over the first dummy spacer layer and the source/drain feature;
   recessing the second dummy spacer layer to expose top-facing surfaces of the first dummy spacer layer while sidewalls of the first dummy spacer layer remain covered by the second dummy spacer layer;
   depositing an etch stop layer over the first dummy spacer layer and the second dummy spacer layer;
   depositing an interlayer dielectric layer over the etch stop layer;
   replacing the dummy gate stack with a gate structure;
   recessing the gate structure, the first dummy spacer layer, the second dummy spacer layer, and the etch stop layer to form a self-aligned contact (SAC) opening;
   forming a dielectric feature in the SAC opening;
   forming a contact feature extending through the etch stop layer, the interlayer dielectric layer, and the first dummy spacer layer to be in contact with the source/drain feature;
   selectively recessing the interlayer dielectric layer and the etch stop layer without substantially etching the dielectric feature and the contact feature to form an opening adjacent the contact feature and to expose a portion of the second dummy spacer layer; and
   selectively removing the second dummy spacer layer to form an air gap.

2. The method of claim 1,
   wherein the forming of the dielectric feature comprises forming a lower portion of the dielectric feature on the gate structure and an upper portion of the dielectric feature over the lower portion, the first dummy spacer layer, the second dummy spacer layer,
wherein the air gap is disposed below an upper portion of the dielectric feature.

3. The method of claim 2, further comprising:
after the selectively removing of the second dummy spacer layer, depositing a seal layer over the interlayer dielectric layer,
wherein the seal layer is in contact with the upper portion of the dielectric feature.

4. The method of claim 3,
wherein the active region extends lengthwise along a first direction,
wherein a bottom portion of the air gap is disposed between the etch stop layer and the first dummy spacer layer along the first direction,
wherein a top portion of the air gap is disposed between the seal layer and the first dummy spacer layer along the first direction.

5. The method of claim 4, wherein the top portion of the air gap is wider than the bottom portion of the air gap along the first direction.

6. The method of claim 4,
wherein the gate structure extends lengthwise along a second direction perpendicular to the first direction,
wherein the air gap extends across an entire length of the contact feature along the second direction.

7. The method of claim 1, wherein the recessing of the gate structure, the first dummy spacer layer, the second dummy spacer layer, and the etch stop layer include etching the gate structure at a faster rate than etching the first dummy spacer layer, the second dummy spacer layer, and the etch stop layer.

8. The method of claim 1, wherein the selectively recessing of the interlayer dielectric layer includes recessing the interlayer dielectric layer without substantially recessing the etch stop layer.

9. The method of claim 8, wherein the selectively recessing of the etch stop layer includes laterally recessing the etch stop layer after the selectively recessing of the interlayer dielectric layer.

10. A method, comprising:
receiving a workpiece, the workpiece comprising a channel region and a source/drain feature adjacent the channel region;
forming a dummy gate stack over the channel region;
forming a first spacer layer over the dummy gate stack and the source/drain feature;
forming a second spacer layer over the first spacer layer and the source/drain feature;
recessing the second spacer layer to expose top-facing surfaces of the first spacer layer while sidewalls of the first spacer layer remain covered by the second spacer layer;
depositing an etch stop layer on exposed surfaces of the first and second spacer layers;
depositing an interlayer dielectric layer over the etch stop layer;
planarizing the workpiece to expose the dummy gate stack such that top surfaces of the interlayer dielectric layer, the etch stop layer, the second spacer layer, and the first spacer layer are coplanar;
replacing the dummy gate stack with a gate structure;
recessing the gate structure, the first spacer layer, the second spacer layer, and the etch stop layer to form a contact opening; and
forming a dielectric feature in the contact opening to cover top surfaces of the recessed etch stop layer, second spacer layer, first spacer layer, and gate structure.

11. The method of claim 10, further comprising:
selectively recessing the interlayer dielectric layer to expose a portion of the etch stop layer;
selectively etching the exposed portion of the etch stop layer to expose the second spacer layer; and
selectively removing the second spacer layer to form an air gap.

12. The method of claim 11, wherein the selectively etching of the exposed portion of the etch stop layer laterally etches the etch stop layer in a first direction to form a spacing between the dielectric feature and the etch stop layer along a second direction perpendicular to the first direction.

13. The method of claim 11, wherein the first spacer layer and the second spacer layer include different dielectric materials such that the selectively removing of the second spacer layer includes etching the second spacer layer without substantially etching the first spacer layer.

14. The method of claim 11, wherein the dielectric feature has a thicker portion and a thinner portion, the thicker portion directly contacts the gate structure, and the thinner portion is exposed to the air gap.

15. The method of claim 11, further comprising:
after the selectively removing of the second spacer layer, depositing a seal layer over the interlayer dielectric layer to seal the air gap,
wherein the seal layer is of a different material composition than that of the interlayer dielectric layer.

16. The method of claim 15,
wherein a bottom portion of the air gap is disposed between the etch stop layer and the first spacer layer along a first direction,
wherein a top portion of the air gap is disposed between the seal layer and the first spacer layer along the first direction.

17. The method of claim 16, wherein the top portion of the air gap is wider than the bottom portion of the air gap along the first direction.

18. A method, comprising:
receiving a workpiece, the workpiece comprising a channel region and a source/drain feature adjacent the channel region;
forming a dummy gate stack over the channel region;
forming a first spacer layer over the dummy gate stack and the source/drain feature;
forming a second spacer layer over the first spacer layer and the source/drain feature;
recessing the second spacer layer to expose top-facing surfaces of the first spacer layer while sidewalls of the first spacer layer remain covered by the second spacer layer;
depositing an etch stop layer on exposed surfaces of the first and second spacer layers;
depositing an interlayer dielectric layer over the etch stop layer;
planarizing the workpiece to expose top surfaces of the dummy gate stack, the interlayer dielectric layer, the etch stop layer, the second spacer layer, and the first spacer layer;
replacing the dummy gate stack with a gate structure;
recessing a portion of the workpiece such that the gate structure is recessed at a faster rate than that of the first spacer layer, the second spacer layer, and the etch stop layer;

forming a capping layer over top surfaces of the recessed etch stop layer, second spacer layer, first spacer layer, and gate structure;
etching through a first portion of the interlayer dielectric layer to form a contact opening exposing the source/drain feature;
forming a contact feature in the contact opening;
selectively recessing a second portion of the interlayer dielectric layer adjacent to the contact feature to expose a portion of the etch stop layer;
selectively etching the exposed portion of the etch stop layer to expose the second spacer layer; and
selectively removing the second spacer layer to form an air gap.

19. The method of claim 18, wherein the capping layer includes silicon nitride, hafnium silicide, aluminum oxynitride, hafnium oxide, lanthanum oxide, aluminum oxide, zirconium nitride, silicon carbide, zinc oxide, silicon oxycarbonitride, silicon, yittrium oxide, tantalum carbonitride, zirconium silicide, silicon carbonitride, zirconium aluminum oxide, titanium oxide, tantalum oxide, or zirconium oxide.

20. The method of claim 19, wherein the etch stop layer is of a different material than that of the capping layer such that the selectively etching of the exposed portion of the etch stop layer etches the etch stop layer without substantially etching the capping layer.

\* \* \* \* \*